United States Patent

Katsuma et al.

[11] Patent Number: 5,912,693
[45] Date of Patent: Jun. 15, 1999

[54] METHOD OF DRIVING HEATING ELEMENT TO MATCH ITS RESISTANCE, THERMAL PRINTER, AND RESISTANCE MEASURING DEVICE

[75] Inventors: Nobuo Katsuma; Yoshiki Kawaoka; Junji Hayashi, all of Saitama, Japan

[73] Assignee: Fuji Photo Film Co., Ltd., Kanagawa, Japan

[21] Appl. No.: 08/763,780

[22] Filed: Dec. 11, 1996

Related U.S. Application Data

[62] Division of application No. 08/262,333, Jun. 17, 1994, Pat. No. 5,608,333.

[30] Foreign Application Priority Data

| Jun. 18, 1993 | [JP] | Japan | 5-147591 |
| Jun. 18, 1993 | [JP] | Japan | 5-147592 |
| Jun. 18, 1993 | [JP] | Japan | 5-147593 |
| Jun. 18, 1993 | [JP] | Japan | 5-147594 |
| Jul. 21, 1993 | [JP] | Japan | 5-180161 |
| Jul. 26, 1993 | [JP] | Japan | 5-183956 |
| Sep. 3, 1993 | [JP] | Japan | 5-220299 |

[51] Int. Cl.$^6$ .................................................. G01R 27/02
[52] U.S. Cl. ............................ 347/191; 347/221; 395/115; 395/116
[58] Field of Search .................................... 347/172, 174, 347/175, 183, 184, 191, 194, 188, 221

[56] References Cited

U.S. PATENT DOCUMENTS

| 4,734,704 | 3/1988 | Mizutani et al. | 347/173 |
| 5,164,747 | 11/1992 | Osada et al. | 324/537 |
| 5,469,068 | 11/1995 | Katsuma | 324/711 |

FOREIGN PATENT DOCUMENTS

| 2248262 | 10/1990 | Japan . |
| 2292060 | 12/1990 | Japan . |

*Primary Examiner*—N. Le
*Assistant Examiner*—Anh T. N. Vo

[57] ABSTRACT

A standard resistor having a known resistance value is connected to one transistor in a drive IC. The drive IC has a plurality of transistors each controlling the on/off of a heating element. The saturation voltage of each transistor is generally the same. One of a plurality of transistors is turned on, and a discharge time required for a capacitor to discharge via a standard resistor or via each heating element and lower its voltage to a predetermined voltage is measured. The resistance value of each heating element is determined from a ratio of a discharge time via each heating element to a discharge time via the standard resistor and the resistance value of the standard resistor. A difference between the standard resistance value and a resistance value of each heating element generates a bias heat energy error during bias heating and an image heat energy error during image heating. In accordance with these heat energy errors, bias data for generating a heat energy immediately before coloring is corrected. Each heating element is driven by using the corrected bias data, and the heat energy errors are corrected at the time of bias heading. At the time of image heating, each heating element is driven by using image data without considering the resistance value error.

47 Claims, 32 Drawing Sheets

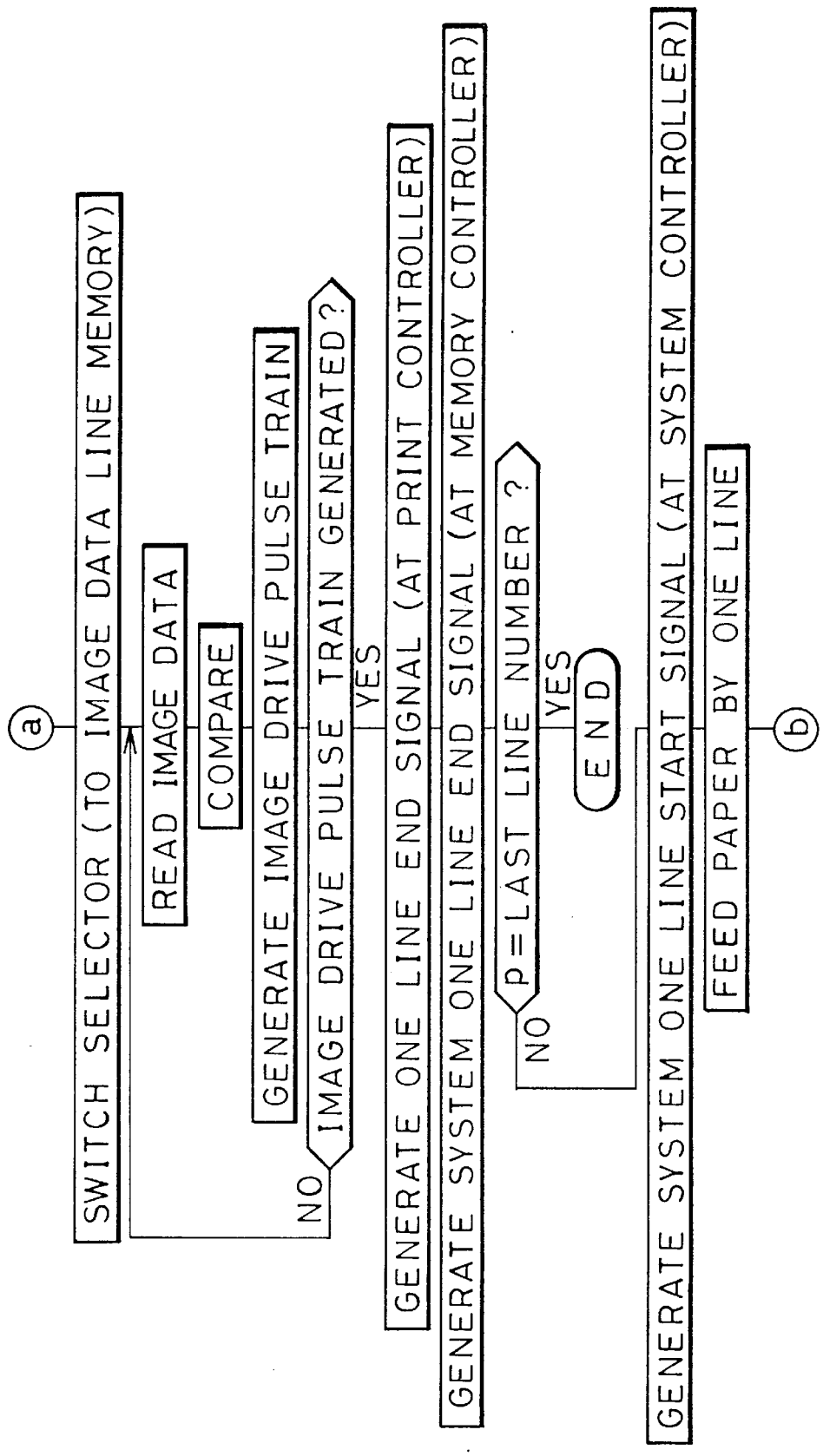

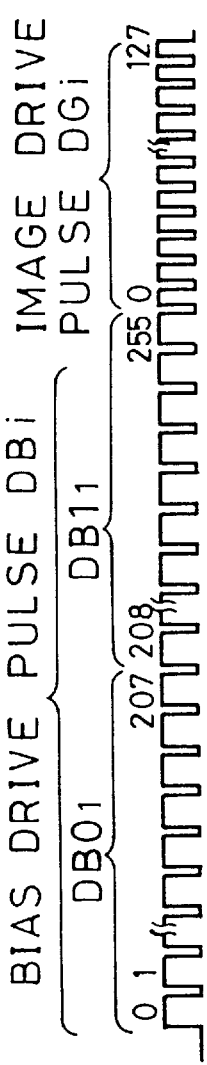
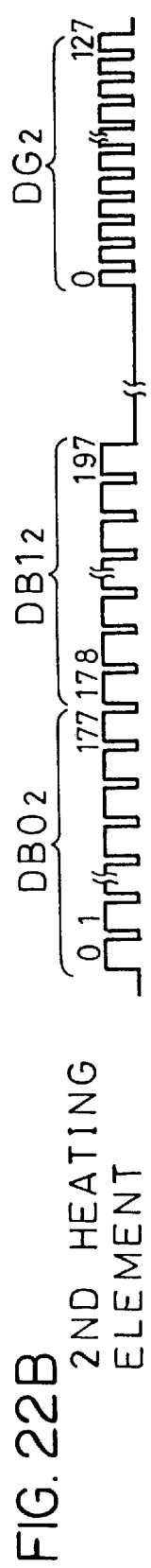
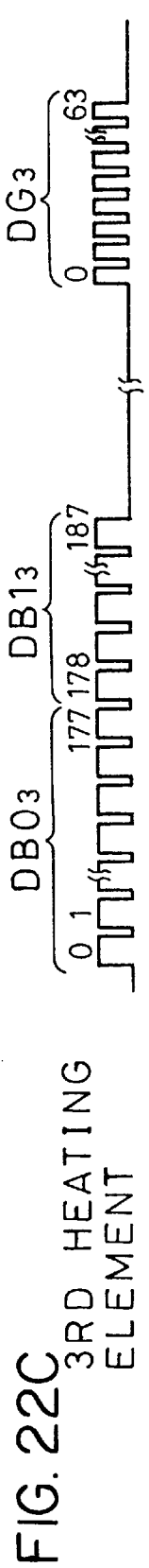
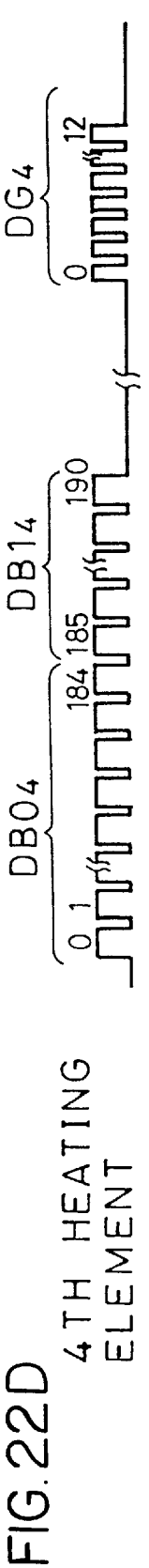
FIG. 22A 1ST HEATING ELEMENT
FIG. 22B 2ND HEATING ELEMENT
FIG. 22C 3RD HEATING ELEMENT
FIG. 22D 4TH HEATING ELEMENT

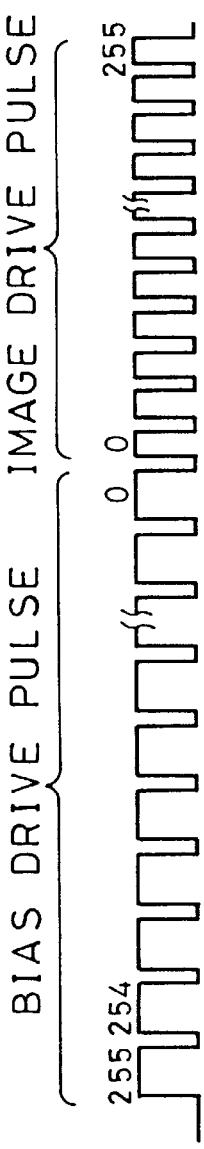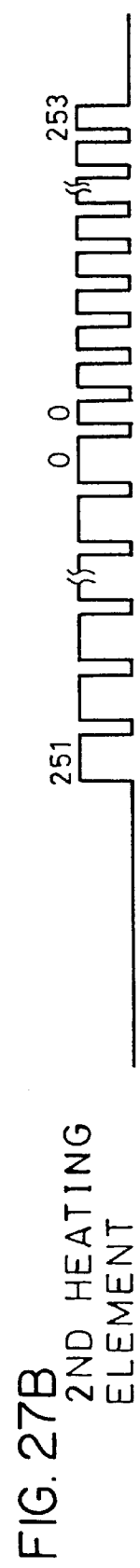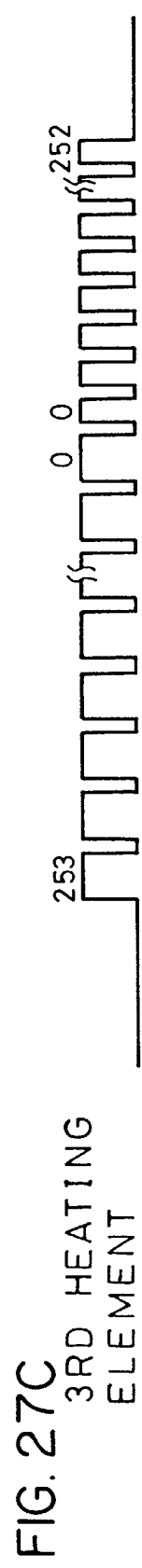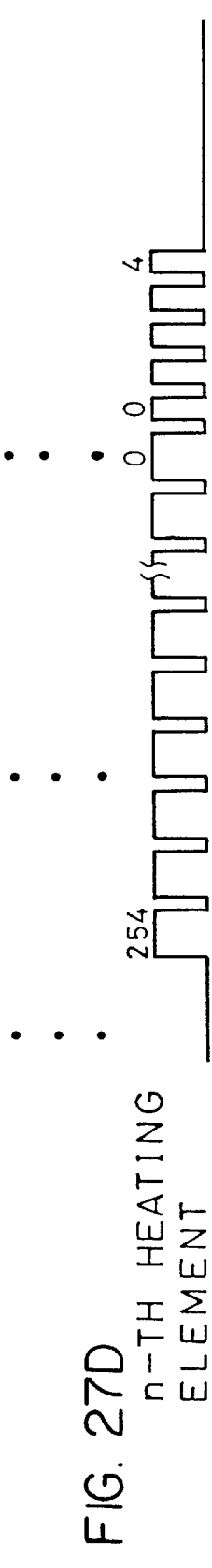
FIG. 27A 1ST HEATING ELEMENT
FIG. 27B 2ND HEATING ELEMENT
FIG. 27C 3RD HEATING ELEMENT
FIG. 27D n-TH HEATING ELEMENT

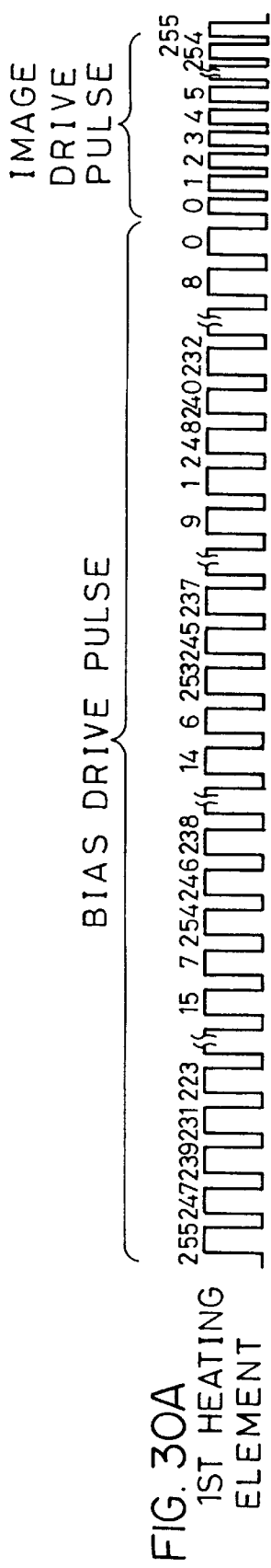
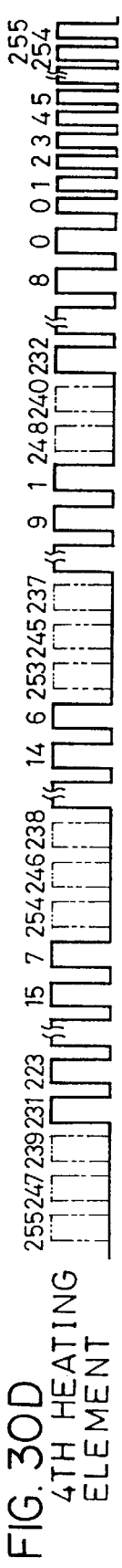
FIG. 30A 1ST HEATING ELEMENT
FIG. 30B 2ND HEATING ELEMENT
FIG. 30C 3RD HEATING ELEMENT
FIG. 30D 4TH HEATING ELEMENT

FIG. 31

|  | COMPARISON DATA | |
|---|---|---|
|  | FOR GENERATION OF BIAS DRIVE DATA | FOR GENERATION OF IMAGE DRIVE DATA |
| 1ST HEATING | 255 | 0 |
| 2ND HEATING | 247 | 1 |
| 3RD HEATING | 239 | 2 |
| 4TH HEATING | 231 | 3 |
| 5TH HEATING | 233 | 4 |
| 6TH HEATING | 215 | 5 |
| 7TH HEATING | 207 | 6 |
| 8TH HEATING | 199 | 7 |
| ⋮ | ⋮ | ⋮ |
| 31ST HEATING | 15 | 31 |
| 32ND HEATING | 7 | 32 |
| 33RD HEATING | 254 | 33 |
| 34TH HEATING | 246 | 34 |
| ⋮ | ⋮ | ⋮ |
| 255TH HEATING | 8 | 254 |
| 256TH HEATING | 0 | 255 |

COLORING DENSITY

COLORING DENSITY (R1 > R2)

METHOD OF DRIVING HEATING ELEMENT TO MATCH ITS RESISTANCE, THERMAL PRINTER, AND RESISTANCE MEASURING DEVICE

This application is a divisional of application Ser. No. 08/262,333, filed on Jun. 17, 1994, now U.S. Pat. No. 5,608,333 issued Mar. 4, 1997 the entire contents of which are hereby incorporated by reference.

BACKGROUND OF THE INVENTION

1. Field of the Invention

The present invention relates to a thermal printer for forming an image by a thermal head having a plurality of heating elements disposed in line, and more particularly to a resistance value measuring device for measuring a resistance value of a heating element, a method of driving a thermal element in accordance with its resistance value, and a thermal printer.

2. Description of the Background Art

As well known, there are thermal transfer printers and direct thermal printers. In the case of a thermal printer, the back of an ink ribbon or ink film is heated by a thermal head to transfer ink from the ink film to an image receiving sheet. Thermal printers are classified into a thermal die transfer type and a thermal wax transfer type. In the case of a direct thermal printer, a thermosensitive recording medium is heated by a thermal head to directly form an image on the thermosensitive recording medium. These thermal heads have a heating element array having a number of heating elements (resistive elements) disposed in line and a driver for driving each heating element.

As described, for example, in U.S. Pat. No. 4,734,704 (corresponding to Japanese Patent Laid-open Publication No.61-213169), a color direct thermal printer uses a color thermosensitive recording medium having a cyan thermosensitive coloring layer, a magenta thermosensitive coloring layer, and a yellow thermosensitive coloring layer, laminated in this order on a base. Each thermosensitive coloring layer has its specific coloring heat energy so as to selectively develop its color. The deeper the thermosensitive coloring layer, the higher coloring heat energy is required. After a thermosensitive coloring layer is thermally recorded, the next underlying thermosensitive coloring layer is thermally recorded. In this case, in order not to thermally record again the already recorded layer, this layer is optically fixed by applying a specific electromagnetic wave.

Each heating element of a thermal head supplies a coloring heat energy to a color thermosensitive recording medium in accordance with a characteristic curve of each thermosensitive coloring layer, and forms an ink dot having a desired density on each virtual square record pixel of the color thermosensitive recording medium. The coloring heat energy includes a heat energy immediately before a thermosensitive coloring layer develops color (this heat energy is hereinafter called a bias heat energy) and another heat energy for developing color at a desired density (this heat energy is hereinafter called an image heat energy). The bias heat energy has a constant value determined by the kind of a thermosensitive coloring layer. The image heat energy changes with image data. Image data represents a tonal level of a pixel. The larger the image heat energy, the higher the coloring density of an ink dot. In order to provide a high gradation, the image heat energy is required to be controlled at a fine step.

The bias heat energy is generated by driving a heating element by one bias drive pulse. The image heat energy is generated by driving a heating element by image drive pulses corresponding in number to image data. Generally, the width of a bias drive pulse is several ms to several tens of ms, and the width of an image drive pulse is several $\mu$s to several tens of $\mu$s. During a bias heating period, a heating element may be continuously driven by one bias drive pulse, or it may be intermittently driven by a plurality of bias drive pulses.

Also in the case of the die transfer type, used for transferring ink at a desired density onto each record pixel of a recording sheet (image receiving sheet), there are at least one bias drive pulse for heating immediately before the start of die transfer and image drive pulses corresponding in number to image data for adjusting a die transfer amount. In the case of a wax transfer type, gradation is represented by changing an area of an ink dot transferred to a record pixel. Used in this case are a bias drive pulse for heating to a temperature at which ink transfer starts and a plurality of image drive pulses each maintaining this temperature. Each time an image receiving sheet is fed by one sub-line, the image drive pulses are supplied to a heating element to transfer ink to each sub-line. A single record pixel is constituted by a predetermined number of sub-lines, and the density of a record pixel corresponds to the number of sub-lines to which ink is transferred.

In order to correctly reflect a fine heating control upon a print result, it is necessary that the resistance values of all heating elements are uniform. However, the resistance values of heating elements have a variation of about 5 to 10%, resulting in undesired phenomena such as a density variation, a color variation, and other variations of record pixels. The resistance value of each heating element is designed to have a value of, for example, 2400 ohms so that a resistance error is 120 to 240 ohms.

In order to eliminate such undesired phenomena, a thermal printer as described, for example, in Japanese Patent Laid-open Publication No.2-248262 has been proposed. With this thermal printer, the resistance values of all of several hundred heating elements are measured and image data is corrected by the measured results. A divider resistor having a known resistance value R is connected between the heating element and a power source. A first switch is connected in parallel with the divider resistor. The first switch is turned on during a print mode and turned off during a resistance value measuring mode. A second switch is connected serially to a noise absorbing capacitor which is connected in parallel with the heating element array. The second switch is turned off during the resistance value measuring mode.

During the resistance value measuring mode, the first and second switches are turned off to enable the divider resistor and disable the noise absorbing capacitor. Under this condition, a transistor serially connected to a heating element is turned on to apply a power source voltage E only to this heating element whose resistance value is to be measured. While the heating element is heated, a voltage V across the heating element array is measured. The resistance value Ra of each heating element is calculated from the following equation.

$$Ra=[V/(E-V)]\cdot R$$

The heating elements are sequentially powered in the above manner to measure the voltages and obtain the resistance values of all the heating elements. In accordance with the obtained resistance values of the heating elements, image data is corrected to compensate for a heat energy error caused by a resistance value error of each heating element, so that an ink dot can be recorded at a density corresponding to the image data.

This thermal printer requires the switch for disabling the noise absorbing capacitor during the resistance value measuring mode, and in addition because of the disabled capacitor and external noises, a correct resistance measurement becomes difficult. Furthermore, measurement of the voltage E requires, for example, an A/D converter, complicating the circuit.

These problems can be solved by a resistance value measuring device described in U.S. Ser. No. 08/113,807 filed on Aug. 31, 1993, now U.S. Pat. No. 5,469,068. This device uses a noise absorbing capacitor even during the resistance measurement. In this application, two embodiments are disclosed. In the first embodiment, the resistance value of a heating element is obtained from a discharge time of a noise absorbing capacitor discharging current through the heating element. In the second embodiment, the resistance value of a heating element is obtained from a discharge time through the heating element and from a discharge time through a standard resistor connected in parallel with the heating element array.

In the first embodiment, the resistance value calculated by a resistance value calculation equation containing a capacitance term of the noise absorbing capacitor has an error to be caused by an error of the capacitance value. In the second embodiment, the resistance value calculation equation contains a resistance term of the standard resistor and does not contain a capacitance term of the noise absorbing capacitor. As a result, although an error of the capacitance value of the noise absorbing capacitor is not present, an error of the resistance value of the standard resistor influences the calculation result. A capacitor having a high capacitance precision is more expensive than a resistor having a high resistance precision. Therefore, the second embodiment is preferable in that the resistance value measuring device becomes cost effective.

The second embodiment using the standard resistor will be described with reference to FIG. 34, which is herein incorporated for reference. A thermal head 2 has a heating element array 3, a drive IC 4, and a noise absorbing capacitor 5. The heating element array 3 has a number of heating elements 3a to 3n disposed in line. The drive IC 4 is an integrated circuit manufactured by semiconductor integration technology, and has a number of transistors 4a to 4n serially connected to the heating elements 3a to 3n. These transistors 4a to 4n control the conduction of the heating elements 3a to 3n.

In this resistance value measuring device, an external serial circuit of a standard resistor 6 and an additional transistor 7 is connected to a commercially available thermal head 2. The resistance value Rs of the standard resistor is known. Reference numeral 8 represents a switch such as a FET switch, and reference numeral 9 represents a comparator. The other circuits will become apparent when reading the preferred embodiments of this invention, and so the description of the other circuits is omitted.

First, the switch 8 is turned on to connect the noise absorbing capacitor 5 to the power source and charge it to the rated voltage E of the power source. Next, the switch 8 is turned off and the additional transistor 7 is turned on. As a result, the noise absorbing capacitor 5 discharges current via the standard resistor 6. During this discharge, a time Ts required for the rated voltage E to lower to a reference voltage Vref is measured (refer to FIG. 35). This time can be known by measuring a lapse time from when the additional transistor 7 was turned on to when a comparison signal from a comparator 9 changes. Similarly, the discharge times of the heating elements are sequentially measured. For example, assuming that the discharge time of the heating element 3a is Ta (refer to FIG. 35), the resistance value Ra of the heating element 3a can be obtained from the following equation (1) by using a discharge time ratio Ta/Ts and the resistance value Rs of the standard resistor 6.

$$Ra = (Ta/Ts) \cdot Rs \qquad (1)$$

If the saturation voltages of the additional transistor 7 and the transistors 4a to 4n of the drive IC 4 are different, a measurement precision of a resistance value becomes poor. It is difficult to have the same saturation voltage because the additional transistor 7 and the transistors 4a to 4n are manufactured at different processes. The influence of the saturation voltage upon the resistance value measurement will be detailed. The transistors 4a to 4n of the drive IC 4 are manufactured by semiconductor integration technology so that the saturation voltages can be presumed generally uniform although they are different in the strict sense. The saturation voltage of the transistors is represented by Vcen. The saturation voltage Vces of the additional transistor 7 is generally different from Vcen. A difference between Vcen and Vces is the cause of a measurement error.

The relationship between Vces and Vref is given by the following equation (2) in which the time Ts is a time required for the voltage of the noise absorbing capacitor 5 to lower to Vref during the discharge via the standard resistor 6.

$$Vref = (E - Vces) \exp(-Ts/CRs) + Vces \qquad (2)$$

Modifying the equation (2), we obtain the equation (3).

$$C = (-Ts/Rs)/\ln\{(Vref - Vces)/(E - Vces)\} \qquad (3)$$

For the discharge via the heating element 3a having an unknown resistance value Ra, the following equation (4) is obtained and the equation (5) is derived from the equation (4).

$$Vref = (E - Vcen) \exp(-Ts/CRa) + Vcen \qquad (4)$$

$$Ra = (-Ta/C)/\ln\{(Vref - Vcen)/(E - Vcen)\} \qquad (5)$$

By substituting the equation (5) into the equation (2), the following equation (6) is obtained.

$$Ra = (Ta/Ts) \cdot Rs \cdot [\ln\{(Vref - Vces)/(E - Vces)\}] / \qquad (6)$$

$$[\ln\{(Vref - Vcen)/(E - Vcen)\}]$$

$$= (Ta/Ts) \cdot Rs \cdot \alpha 1$$

where $$\alpha 1 = [\ln\{(Vref-Vces)/(E-Vces)\}]/[\ln\{(Vref-Vcen)/(E-Vcen)\}]$$

α1 results from a difference of the transistor saturation voltage between Vcen and Vces, and causes a measurement error of the resistance value. The equation (1) of the first embodiment described above assumes α1 is 1, i.e., Vces=Vcen. However, the saturation voltages Vcen and Vces are generally different and a correct resistance value Ra cannot be obtained.

The above-described first embodiment calculates the resistance value Ra from the discharge time Ta via the heating element 3a without using the standard resistor.

$$Vref = E/\exp(-Ta/CRa) \qquad (7)$$

$$R = (-Ta/C) \cdot \ln(Vref/E) \qquad (8)$$

where C is the capacitance of the noise absorbing capacitor. If Vref=E/2, then the resistance value is given by:

$$R = Ta/0.693\,C$$

A measurement error of the second embodiment results from a difference between saturation voltages of the transistors, and a measurement error of the first embodiment results from a saturation voltage of the transistor connected to a heating element to be measured. Representing the saturation voltage of the transistor 4a connected to the heating element 3a by V0, the following equation (9) is obtained.

$$Vref = (E-V0)\exp(-Ta/CRa) + V0 \qquad (9)$$

Modifying the equation (9), we obtain the following equation (10).

$$Ra = (-Ta/C)/\alpha 2 \qquad (10)$$

where α2=ln [(Vref−V0)/(E−V0)].
If Vref=E/2, then α2 is given by:
α2=ln [(Vref−V0)/(2Vref−V0)]

An error α2 is contained in the resistance value of a heating element calculated only from the time Ta required for the noise absorbing capacitor 5 to lower to the voltage Vref. For example, if E=20 V, Vref=15 V, and V0=0.3 V, the calculated resistance value becomes smaller by about 1.77%.

In addition to Japanese Patent Laid-open Publication No.2-248262 in which image data is corrected in accordance with a measured resistance value, another method as disclosed in Japanese Patent Laid-open Publication No. 2-292060 has been proposed in which density correction drive pulses corresponding in number to a resistance value are inserted between image drive pulses.

However, correcting image data in accordance with a resistance value and changing the number of image drive pulses or the pulse width require a great amount of calculations of all pixels of each frame and a high speed calculation circuit, resulting in a high manufacturing cost. If the calculation results are quantized and converted into the number of image drive pulses, a large quantization error is generated and a quasi contour is formed on a print image, lowering a print quality.

The method of inserting density correction drive pulses between image drive pulses requires a new circuit for generating a density correction drive pulse, resulting in a complicated circuit and a high manufacturing cost. Furthermore, a print time is elongated because density correction pulses are inserted between image drive pulses.

SUMMARY OF THE INVENTION

It is a principal object of the present invention to provide a resistance value measuring device and a thermal printer, capable of reducing a measurement error to be caused by a difference between transistor saturation voltages and correctly measuring a resistance value of a heating element.

It is another object of the present invention to provide a thermal head driving method and apparatus capable of suppressing a density variation and a color variation to be caused by a resistance value error, by using a simple circuit and simple data processing.

It is a further object of the present invention to provide a thermal head driving method and apparatus capable of removing a pause period between bias heating and image heating.

It is a still further object of the present invention to provide a thermal head driving method and apparatus capable of correcting a heat energy error to be caused by a resistance value error and correction shading with ease.

In order to achieve the above and other objects of the present invention, a standard resistor is connected to a transistor mounted on a drive IC. With this arrangement using semiconductor integration technology, the characteristics of each transistor of the drive IC, particularly, the transistor saturation voltages, can be made uniform. It is therefore possible to eliminate a calculation error to be caused by a transistor saturation voltage difference and to obtain a correct resistance value. A plurality of drive ICs are used for a line printer having a number of heating elements. In this case, a standard resistor is connected to each drive IC. A standard resistor may be externally connected to the drive IC, or a heating element in the heating element array may be used as the standard resistor, reducing a manufacturing cost. In the latter case, the heating element to be used as the standard resistor is subjected to the trimming process so as to have a desired resistance value. This heating element may be used for printing an image or may be used only for the standard resistor.

According to a preferred embodiment of the present invention, a discharge time required for a noise absorbing capacitor to take a first voltage and another discharge time to take a second voltage lower than the first voltage, are measured. A resistance value of each heating element is calculated by using these discharge times.

If each heating element has a different resistance value, a heat energy generated by the heating element becomes different even if it is driven under the same condition. For example, in the bias heating in which each heating element is driven by a predetermined number of bias drive pulses or a single bias drive pulse having a wide pulse width, although a heating element having a normal resistance value can generate a bias heat energy immediately before coloring, a heating element having a resistance value error generates a heat energy larger than or smaller than the bias heat energy.

In order to correct the bias heat energy error to be caused by a resistance value error, the number of bias drive pulses or the pulse width is changed with the resistance value error. For example, if each heating element is continuously driven by one bias drive pulse, the width of each bias drive pulse is adjusted so that each heating element can generate a predetermined bias heat energy. If each heating element is driven by a plurality of bias drive pulses, the number of bias drive pulses is changed to allow each heating element to generate a predetermined bias heat energy. The resistance value difference is a difference between a rated resistance value and an actual resistance value.

If a rated resistance value is used for the calculation, each thermal printer has a different maximum number of bias drive pulses because of a different resistance value. This results in a change in bias heating software of each thermal printer. In order to prevent this, a predetermined maximum number of bias drive pulses is assigned to a heating element having a highest resistance value and a minimum heat generation amount. A difference between the highest resistance value and a resistance value of each heating element is used as the resistance value error, and a correction value corresponding to the resistance value error is subtracted from the maximum number of bias drive pulses. In this case, a generated heat energy may take a value near at the coloring point depending upon bias data. However, this heat energy differs only slightly from the normal bias heat energy immediately before coloring so that this heat energy can be used as the normal bias heat energy and can eliminate a density variation and a color variation.

If the bias heating is performed by using a plurality of bias drive pulses, one line bias data is used. This bias data indicates the number of bias drive pulses for generating a predetermined bias heat energy by correcting the resistance value error of each heating element. The bias data is written in a bias data line memory. The one line bias data in the bias data line memory is read one data item after another by a print controller and sent to a comparator. The comparator compares the bias data with comparison data and outputs drive data of "H" or "L". The comparison is repeated by changing the comparison data so that the bias data is converted into the bias drive data having pulses corresponding in number to the bias data. One bias drive data item supplies one bias drive pulse to a heating element.

Image data of one frame is written in a frame memory of the thermal printer. Image data in the frame memory is read for the image heating and converted into image drive pulses in the manner similar to the bias data. In order to efficiently perform a read/write of image data or bias data, a plurality of line memories are provided to alternately perform a read operation and a write operation.

In printing one line, the print controller operates as if it prints two lines. First, the print controller read bias data from the bias data line memory. Bias drive pulses corresponding in number to the bias data are supplied to each heating element which generates the bias heat energy. Next, the print controller reads image data from the image data line memory. Image drive pulses corresponding in number to the image data is supplied to each heating element which generates the image heat energy for recording an image at a desired density.

The bias heat energy and image heat energy are generally the same for the case of yellow not having a loud color. However, the bias heat energy for the case of magenta and cyan having a loud color is considerably large. Therefore, the bias heat energy error to be caused by the resistance value error greatly influences not only a density variation and a color variation but also a density of a print image. The print quality can be improved considerably by correcting the bias heat energy error.

Also in the case of the image heating, there is an image heat energy error to be caused by the resistance value error. Although the image heat energy error is small for the case of magenta and cyan having a loud color, if this error is corrected, the print quality can be improved correspondingly. It is therefore preferable to correct both the bias heat energy error and the image heat energy error. The image heat energy error can be obtained from the resistance value error and image data.

Apart from the above, if the image heat energy error is corrected during the image heating, the image heating takes a long time because of the calculation process of image data. More specifically, the calculation process is difficult to be achieved during the time duration of generating image drive pulses having a shorter pulse width, and the resultant pulse period becomes longer. This causes a heat loss and a low print speed. It is therefore preferable to correct the image heat energy during the bias heating. In accordance with the image heat energy error, the number of bias drive pulses and the pulse width determined by taking into consideration the bias heat energy error are again adjusted.

The temperature of each heating element is difficult to rise when first printing a line near the record start area, because the thermal head is cold. The temperature of each heating element is high during printing of a line near the record end area, because the thermal head has accumulated heat. Therefore, a so-called H shading with a density variation on lines in the subsidiary scan direction occurs. In addition, heating elements near at both ends of the thermal head are likely to be cooled so that their temperatures are hard to rise. Therefore, a so-called V shading with a lower density near at both the ends of each line occurs. In order to avoid shading, particularly H shading, bias data is changed with the line position. In this case, bias data of one frame is required similar to image data, and is written in a bias data line memory immediately before recording one line.

If the bias heating is performed by using a plurality of bias drive pulses, the number of bias drive pulses are changed for each heating element and each line position in order to correct the resistance value error and shading. The bias heating period is determined by the maximum number of bias drive pulses. If the number of bias drive pulses is small, the bias heating is completed earlier so that the pause period between the bias heating and image heating becomes long, generating a heat loss caused by heat dissipation. In order to reduce the heat loss during the bias heating, it is preferable to set the bias drive pulse train near at the image drive pulse train. This can be achieved by inverting each bit of comparison data of "0", "1", "2", . . . in hexadecimal notation sequentially supplied to a comparator and to change comparison data to its complement. Alternatively, bias drive pulses may be thinned at a predetermined pitch to shorten the pause period between the bias heating and image heating.

BRIEF DESCRIPTION OF THE DRAWINGS

The above and other objects and advantages of the present invention will become apparent from the detailed description of the preferred embodiments when read in conjunction with the accompanying drawings, in which:

FIGS. 20A and 20B are flow charts explaining a print procedure of the embodiment shown in FIG. 19;

FIGS. 22A–22D show examples of a bias drive pulse train and an image drive pulse train according to an embodiment in which a resistance value error correction and a shading correction are executed;

FIGS. 27A–27D show examples of a bias drive pulse train and an image drive pulse train of the embodiment shown in FIG. 25;

FIGS. 30A–30D show examples of a bias drive pulse train and an image drive pulse train of the embodiment shown in FIG. 28;

FIG. 31 shows a table of comparison data;

DETAILED DESCRIPTION OF THE PREFERRED EMBODIMENTS

Figure 1:
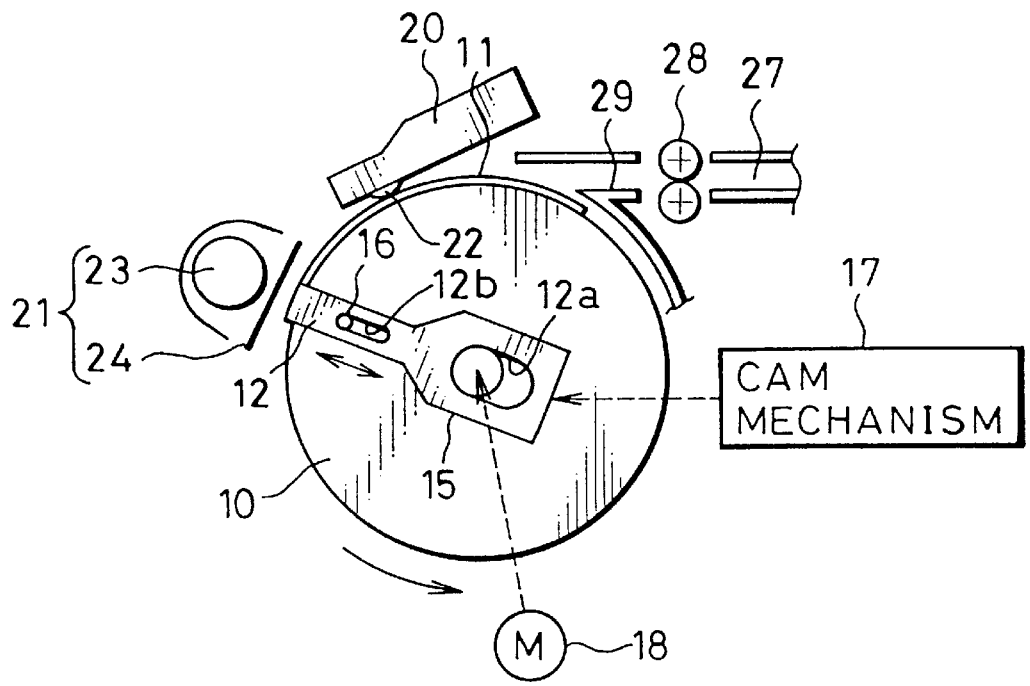
FIG. 1 is a schematic diagram of a color direct thermal printer to which the present invention is applied.

Referring to FIG. 1, a platen drum 10 holding a sheet of color thermosensitive recording medium at the outer periphery thereof is rotated by a pulse motor 18 in a subsidiary scan direction indicated by an arrow. A clamper 12 is mounted on the platen drum 10 and fixes the leading edge of the color thermosensitive recording sheet 11 to the platen drum 10. The clamper 12 is of a channel shape, and elongated holes 12a and 12b formed at opposite end portions of the clamper 12 engage with a platen drum shaft 15 and a guide pin 16. The clamper 12 is driven by a cam mechanism 17 and moves between a clamp position where the clamper 12 is pushed against the platen drum 10 and a clamp release position where the clamper 12 is separated from the platen drum 10.

Figure 2:
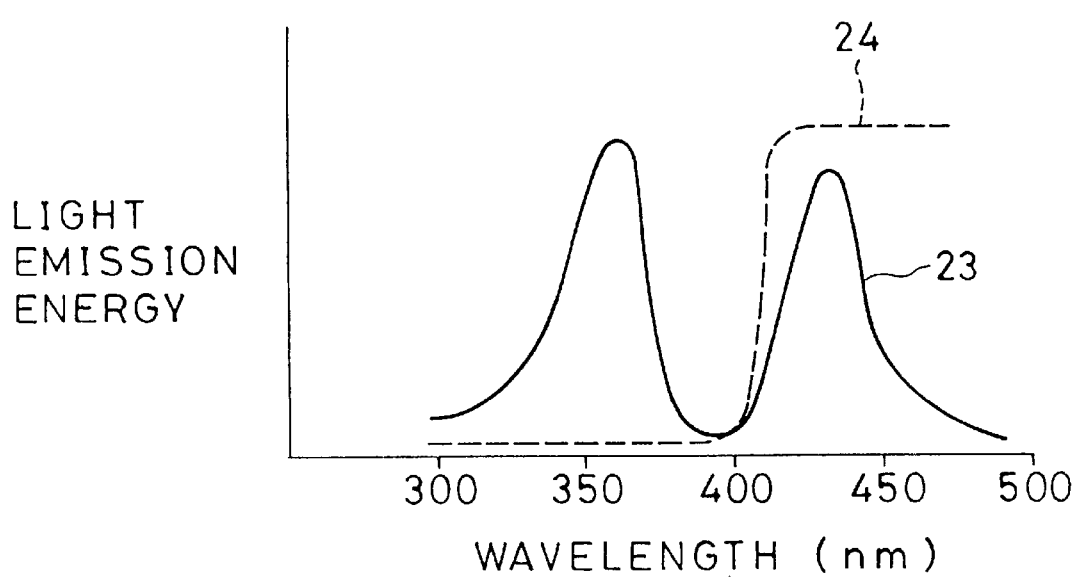
FIG. 2 is a graph showing the characteristics of an ultraviolet lamp of an optical fixing unit and a cut-filter.
Figure 5:
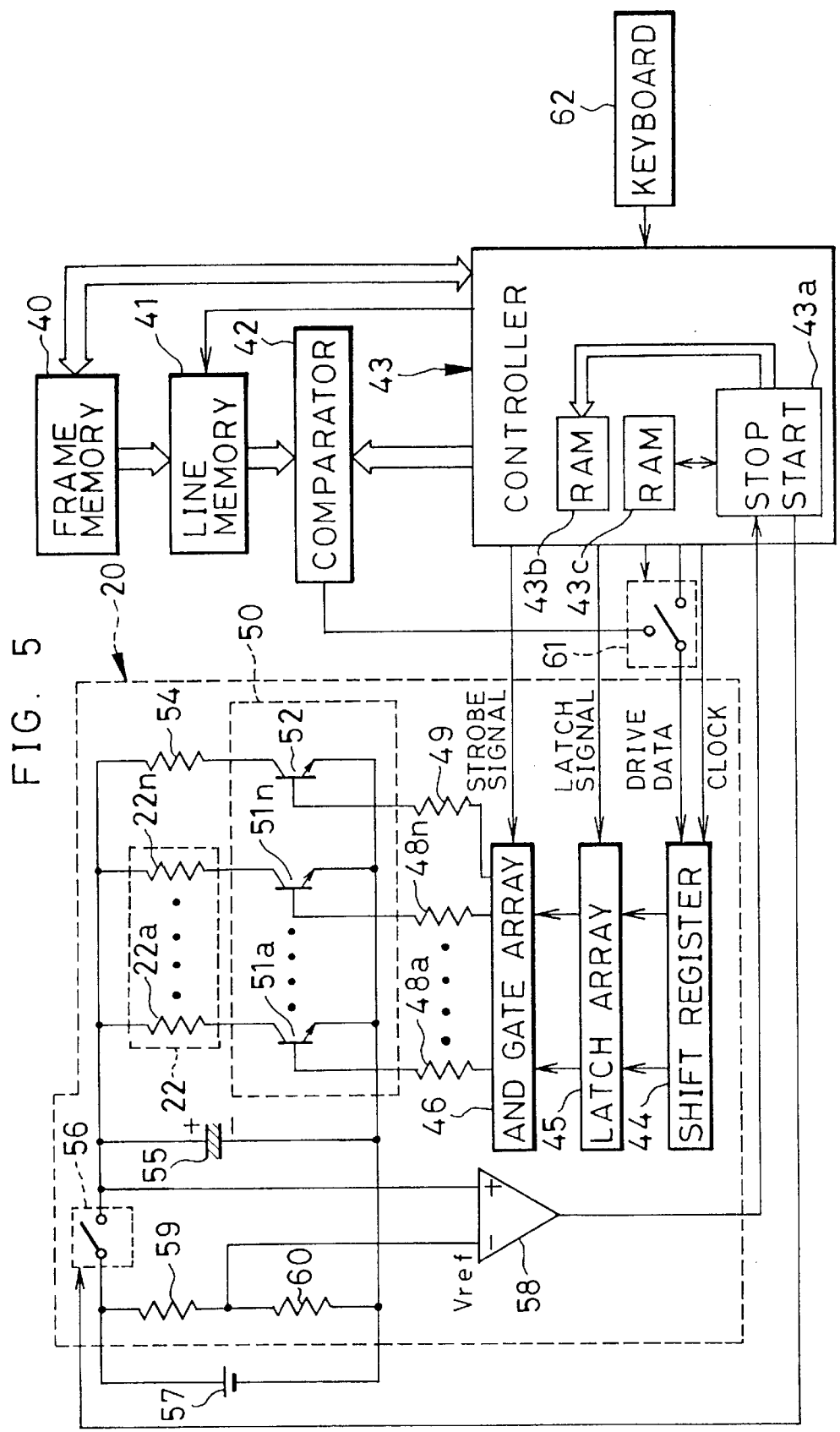
FIG. 5 is a circuit block diagram of a color direct thermal printer.

At the outer peripheral area of the platen drum 10, a thermal head 20 and an optical fixing unit 21 are provided. As shown in FIG. 5, the thermal head 20 has a heating element array 22 having a plurality of heating elements (resistive elements) 22a to 22n disposed in line in the main scan direction. The optical fixing unit 21 is constituted by an ultraviolet lamp 23 of a rod shape having light emission peaks at about 365 nm and 420 nm as indicated by a solid line in FIG. 2, and a cut-filter 24 having the cut-off characteristics indicated by a broken line. When placed in front of the ultraviolet lamp 23 by a solenoid or the like, the cut-filter 24 transmits near ultraviolet rays near at 420 nm. An ultraviolet lamp having a light emission peak of 365 nm and an ultraviolet lamp having a light emission peak of 420 nm may be used.

A feed roller pair 28 is disposed on a paper feed/eject path 27, and transports a color thermosensitive recording sheet 11. On the platen drum side of the paper feed/eject path 27, a separation claw 29 is disposed so as to guide the, trailing edge of the color thermosensitive recording sheet 11 to the paper feed/eject path 27 for ejecting the sheet 11. In this embodiment, although a single path 27 is shared by paper feed and paper eject, two separate paths may be used.

Figure 3:
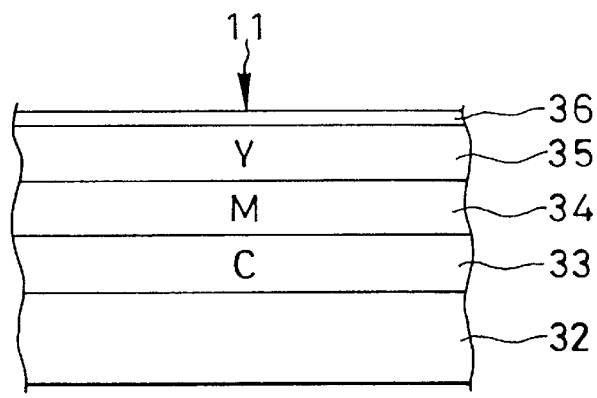
FIG. 3 is a diagram explaining the lamination structure of a color thermosensitive recording medium.

FIG. 3 shows an example of a color thermosensitive recording sheet. On a base 32, a cyan thermosensitive coloring layer 33, a magenta thermosensitive coloring layer 34, a yellow thermosensitive coloring layer 35, and a protective layer 36 are sequentially laminated. Each thermosensitive coloring layer 33 to 35 has a heat sensitivity corresponding to a distance from the surface of the color thermosensitive recording sheet. The thermosensitive coloring layers 33 to 35 are laminated from the surface of the sheet in the order of thermally recording them. For example, if thermal recording is performed in the order of magenta, yellow, and cyan. The yellow thermosensitive coloring layer 35 is exchanged by the magenta thermosensitive coloring layer 34. In FIG. 3, the yellow thermosensitive coloring layer 35 is represented by "Y", the magenta thermosensitive coloring layer 34 is represented by "M", and the cyan thermosensitive coloring layer 33 is represented by "C", for the discrimination convenience.

Although not shown in FIG. 3, intermediate layers are inserted between the thermosensitive coloring layers 33 to 35 so as to adjust the heat sensitivities of the magenta thermosensitive coloring layer 34 and cyan thermosensitive coloring layer 33. As the base 32, opaque coated paper or a plastic film is used. If an OHP sheet is to be formed, a transparent plastic film is used.

The cyan thermosensitive coloring layer 33 contains an electron donating dye precursor and an electron accepting compound as main components, and is colored in cyan when it is heated. The magenta thermosensitive coloring layer 34 contains a diazonium salt compound having a maximum absorption factor at a wavelength of about 365 nm and a coupler which thermally acts upon the diazonium salt compound and is developed in magenta. When applied with an ultraviolet ray of near 365 nm after thermal recording, the diazonium salt compound of the magenta thermosensitive coloring layer 34 is photochemically decomposed and loses its color developability. The yellow thermosensitive coloring layer 35 contains a diazonium salt compound having a maximum absorption factor at a wavelength of about 420 nm and a coupler which thermally acts upon the diazonium salt compound and is developed in yellow. When applied with a near ultraviolet ray of 420 nm after thermal recording, the diazonium salt compound of the yellow magenta thermosensitive coloring layer 35 is photochemically fixed and loses its color developability.

Figure 4:
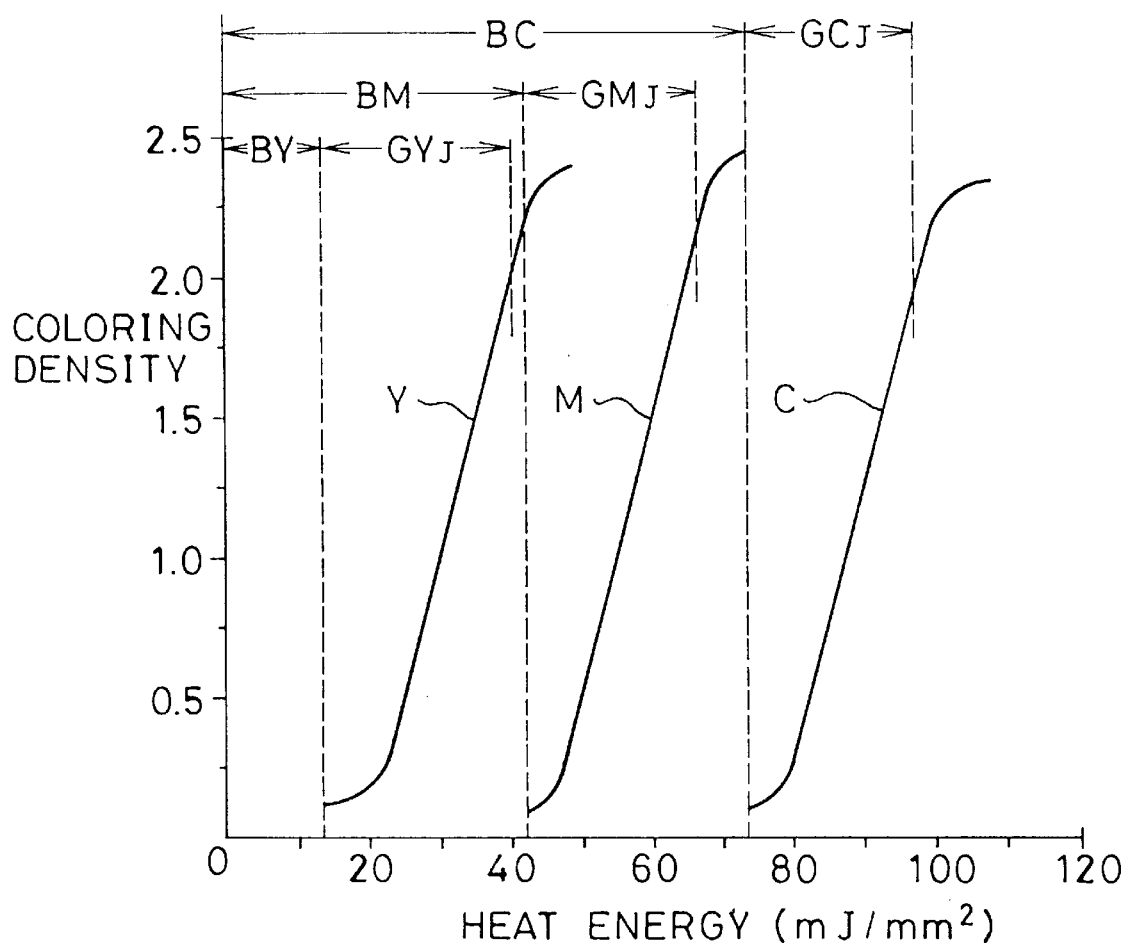
FIG. 4 is a graph showing the coloring characteristics of thermosensitive coloring layers.

Referring to FIG. 4 showing the coloring characteristics of the thermosensitive coloring layers, the yellow thermosensitive coloring layer 35 has a highest heat sensitivity, and the cyan thermosensitive coloring layer 33 has a lowest heat sensitivity. In thermally recording a yellow "Y" ink dot in one record pixel, a coloring heat energy which is a sum of a bias heat energy BY and an image heat energy $GY_J$ is applied to the color thermosensitive sheet 11. The bias heat energy is a heat energy immediately before the yellow thermosensitive coloring layer 35 develops color, and is applied to the color thermosensitive recording sheet 11 during a bias heating period. The image heat energy is determined by image data, and is applied to the color thermosensitive recording sheet 11 during an image heating period following the bias heating period. This description is also applicable to Magenta "M" and cyan "C", with reference characters being given in FIG. 4.

FIG. 5 is a circuit diagram of a color thermal printer. A frame memory 40 is written with three-color image data of one frame separately for each color. The image data indicates a gradation level, and the density of an ink dot formed in a rectangular pixel is determined in accordance with the image data. For the image heating, image data of print color is read from the frame memory 40 one line after another and written in a line memory 41. One line image data in the line memory is read one data item after another and sent to a comparator 42. The comparator 42 compares each image data item with comparison data, and if the image data is equal to or greater than the comparison data, it outputs a drive data "H".

In the case of 64 tonal levels, a controller 43 outputs comparison data of "0" in hexadecimal notation during the bias heating and sequentially outputs comparison data of "0" to "3F" in hexadecimal notation during the image heating. "0" is generated continuously during the bias heating and the initial step of the image heating. Comparison data of "0" to "40" in hexadecimal notation may be sequentially generated by using "0" for the bias heating and "1" to "40" for the image heating.

The comparator 42 sequentially compares each image data item of one line with the first comparison data "0" from the controller 43. Therefore, a serial signal representing the comparison results of one line is outputted from the comparator 42 and sent via a mode switch 61 for switching between a print mode and a resistance value measuring mode, to a shift register 44. After one line image data has been compared, comparison for the image heating is performed. In this case, the controller 43 sequentially generates comparison data of "0" to "3F" and sends it to the comparator 42. Each image data item of one line is compared with the comparison data 65 times, and converted into 65-bit drive data which is composed of one bit bias drive data and 64-bit image drive data and is sent to the shift register 44 one bit after another.

The serial drive data is shifted in the shift register 44 synchronously with a clock, and converted into a parallel signal. The drive data converted into the parallel signal by the shift register 44 is latched by a latch array 45 synchronously with a latch signal. An AND gate array 46 outputs a signal "H" while a strobe signal is inputted, if the drive data is "H". This strobe signal has a wide pulse width during the bias heating and a narrow pulse width during the image heating. The pulse width is narrowest during the yellow heating, and widest during the cyan heating. The pulse width is equal between the three colors, but may be changed between the three colors.

Each output terminal of the AND gate array 46 is connected to a corresponding one of transistors 51a to 51n and 52 constituting a drive IC 50 via a corresponding one of resistors 48a to 48n and 49. These transistors 51a to 51n and 52 turn on when a signal "H" is outputted from the AND gate array 46. The transistors 51a to 51n and 52 each are connected to a corresponding one of heating elements 22a to 22n and a standard resistor 54. The standard resistor 54 is used for measuring the resistance values Ra to Rn of the heating elements 22a to 22n. The standard resistor 54 has a known resistance value Rs, and is a high quality resistor having a resistance value error of about 1% or less. The standard resistor 54 is soldered to a circuit board of the thermal head 20.

A noise absorbing capacitor 55 is connected in parallel with a circuit of the heating element array 22 and drive IC 50. The noise absorbing capacitor 55 absorbs noises on a power line connecting a power source mounted on the main frame of the color thermal printer to the thermal head 20, and operates to suppress a change in a voltage applied to the heating element array 22. If a voltage applied to the heating element array 22 changes, a heat energy applied to each heating element 22a to 22n changes, being unable to record a color dot at a desired density. A charge switch 56 is of a normally-on type, and its on-off is controlled by the controller 43 each time the resistance value Ra to Rn of the heating element 22a to 22n is measured.

One terminal of the noise absorbing capacitor 55 is connected to the non-inverting input terminal of a comparator 58 whose reference voltage Vref is obtained as a voltage divided by resistors 59 and 60. During the resistance value measuring mode, after the noise absorbing capacitor 55 is charged, the charge switch 56 is turned off and, for example, only the transistor 51a of the heating element 22a to be measured is turned on. After the noise absorbing capacitor 55 has been completely charged, a voltage at the non-inverting input terminal of the comparator 58 is "E". As electric charges accumulated in the noise absorbing capacitor 55 are discharged via the heating element 51a, the voltage at the non-inverting terminal of the comparator 58 lowers and finally becomes equal to the reference voltage Vref. Immediately thereafter, a voltage at the output terminal of the comparator 58 changes from "H" to "L". A resistance value measuring unit 43a of the controller 43 measures a time Ta required for an output voltage of the comparator 58 to change to "L" immediately after the charge switch 58 was turned off. Thereafter, the resistance value measuring unit 43a calculates the resistance value Ra of the heating element 22a by using the discharge time Ts via the standard resistor 54 read from a RAM 43c, and writes the calculated resistance value Ra into RAM 43b.

For this calculation, the equation (6) is used. In order to correctly calculate the resistance value Ra of the heating element 51a, it is necessary to calculate α1 as described earlier. The transistors 51a to 51n and 52 of the drive IC 50 have been manufactured by using semiconductor integration technology. Therefore, it can be assumed that the transistors 51a to 51n and 52 have the same saturation voltage. As a result, α1 is "1" and the resistance value Ra can be correctly calculated from the following equation.

$$Ra = (Ta/Ts) \cdot Rs$$

As described earlier, Ts is a discharge time via the standard resistor and is being stored in RAM 43c like other discharge times of the heating elements. A calculation precision of the resistance value Rs is dependent not upon a capacitance C of the noise absorbing capacitor 55, but upon a precision of the resistance value Rs of the standard resistor 54. As the standard resistor 54, a resistor having an error as small as about 1% is available at a low price as described earlier. By measuring the discharge times Tb to Tn by using the above equation, the resistance values Rb to Rn of the heating elements 22b to 22n can be calculated.

The operation of the embodiment will be described with reference to FIGS. 6 to 8. The resistance values of the heating elements of the heating element array 22 are measured at the delivery time or installation time of the thermal printer, or at the replacement time of the thermal head. For the resistance measurement, a command is entered from a keyboard 62 to set the resistance value measuring mode. At the resistance value measuring mode, the switch 61 is activated to connect the shift register 44 to the controller 43. The controller 43 outputs serial data of one line which makes the transistor 52 turn on and the transistors 51a to 51n turn off. This one line serial data is converted into parallel data by the shift register 44 and latched by the latch array 45.

Figure 6:
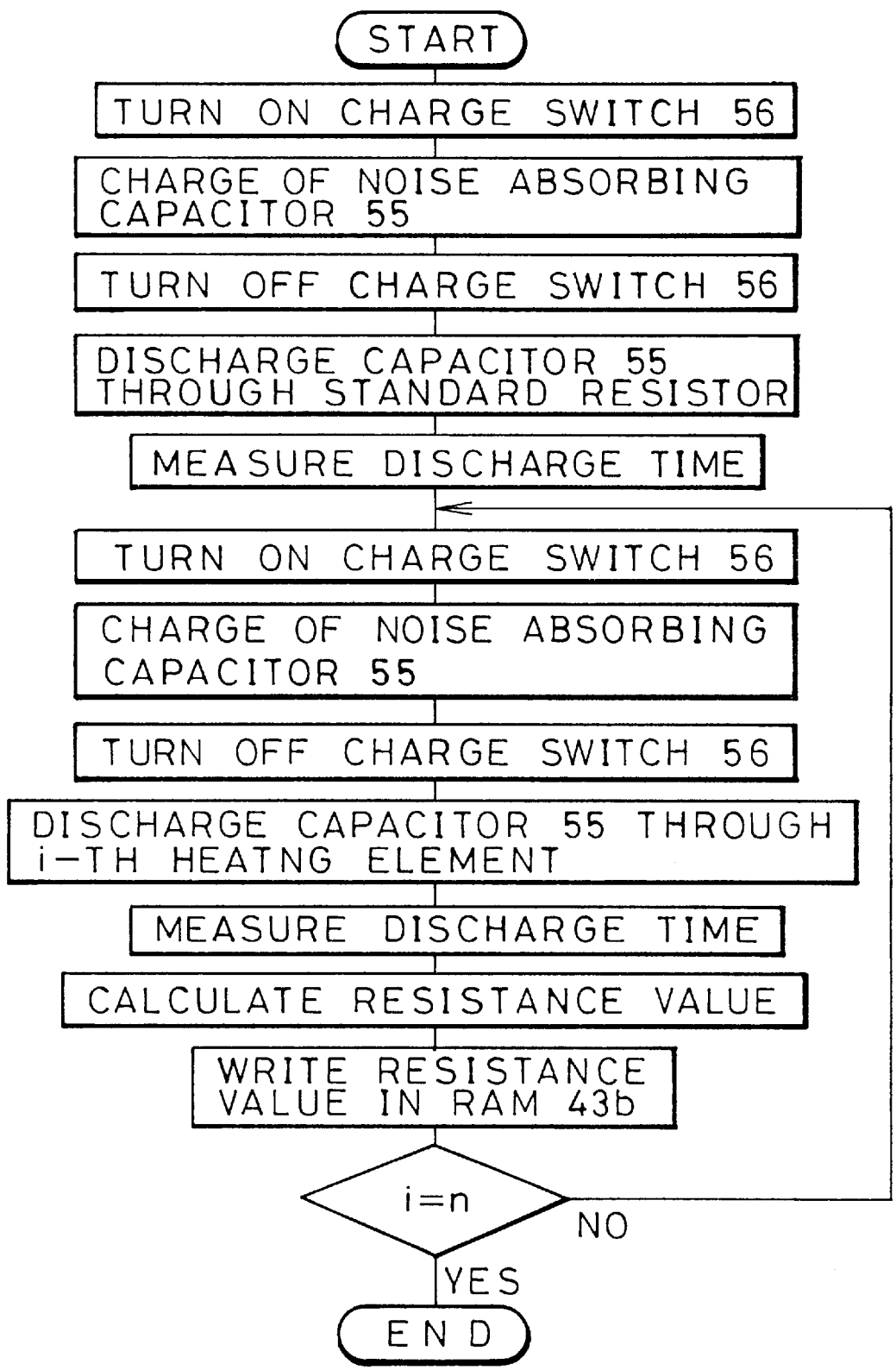
FIG. 6 is a flow chart explaining the operation of a resistance value measuring mode.

As shown in FIG. 6, the resistance value measuring unit 43a turns on the charge switch 56 to start charging the noise absorbing capacitor 55. When the voltage across the noise absorbing capacitor 55 reaches the voltage E of the power source 57, the switch 56 is turned off. It is to be noted that the charge switch 56 may be maintained turned on for a predetermined time sufficient for charging the capacitor 55 to the voltage E.

Figure 7:
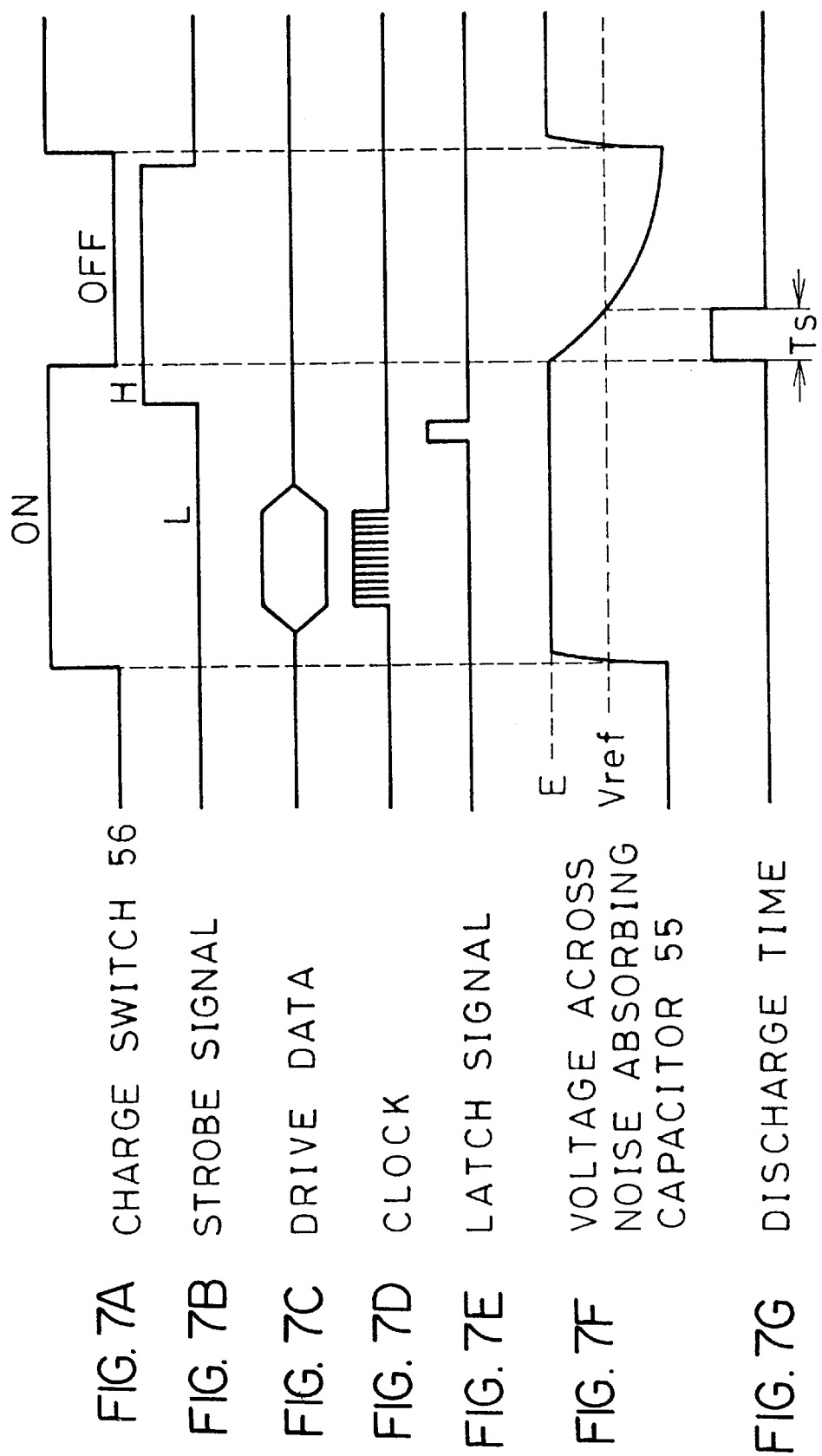
FIGS. 7A–7G show signal waveforms at various points of the circuit shown in FIG. 5.

As shown in FIG. 7, after the noise absorbing capacitor 55 has been charged, the controller 43 sends the strobe signal to the AND gate array 46 so that only the transistor 52 of the drive IC 50 is turned on. When the charge switch 56 is turned off, the noise absorbing capacitor 55 is discharged via the standard resistor 54 to gradually lower the voltage at the non-inverting terminal of the comparator 58. When the voltage at the non-inverting terminal of the comparator 58 lowers to the reference voltage Vref, an output signal of the comparator 58 changes from "H" to "L". The time required for the output signal of the comparator 58 to invert, i.e., the discharge time Ts, is measured by the resistance value measuring unit 43a and written in RAM 43c. This discharge time Ts is measured by a counter which starts counting synchronously with the turning-off of the charge switch 56 and stops counting when the output signal of the comparator 58 inverts.

The controller 43 turns on the charge switch 56 at a lapse of a predetermined period, and terminates the measuring cycle of the discharge time Ts. It is to be noted that the charge switch 56 may be turned off for a predetermined time period which is sufficient for the noise absorbing capacitor 55 to discharge to the reference voltage Vref and is experimentally obtained. The strobe signal may be generated during the turning-off of the charge switch 56, so that the capacitor may begin discharging.

After the measurement of the discharge time Ts, the measurement of the discharge times of the heating element array 22 starts. First, the resistance value of the heating element 22a is measured. The controller 43 sends one line data to the shift register 44, the one line data turning on only the transistor 51a and turning off the other transistors 51b to 51n and 52. The charge switch 56 is turned on for a predetermined time to charge the noise absorbing capacitor 55. After this charge, the strobe signal is sent to the AND gate array 46 to turn on only the transistor 51a. When the charge switch 56 is turned off, the noise absorbing capacitor 55 is therefore discharged via the heating element 22a. During this discharge, the resistance measuring unit 43a measures the discharge time Ta for the noise absorbing capacitor 55 to lower its voltage from the voltage E to the reference voltage Vref. Using this measured discharge time Ta, and the discharge time Ts and standard resistor value Rs read from RAM 43c, the resistance value measuring unit 43a calculates the resistance value Ra of the heating element from the above-described equation, and writes it in RAM 43b. Similarly, the resistance values Rb to Rn of the heating elements 22b to 22n are calculated and written in RAM 43b.

After the resistance values of the heating element array 22 at the set-up time have been measured, the controller 43 calculates correction data of the heating elements from differences between the rated resistance values of the heating elements 22a to 22n determined at the time of designing the circuit and the calculated resistance values thereof stored in RAM 43b. The correction data is written in RAM 43b.

When a command is entered from the keyboard 62 to fetch image data, three-color image data including red, blue, and green of one frame from a video camera or a scanner is written in the frame memory 40. This command entered from the keyboard 62 maintains the charge switch 56 to be turned on and the noise absorbing capacitor 55 is connected to the power source 57. The noise absorbing capacitor 55 absorbs noises on a line between the power source 57 and thermal head 20 to stabilize the drive pulses for the heating elements. Also, the switch 61 is activated to connect the shift register 44 to the comparator 42.

Figure 8:
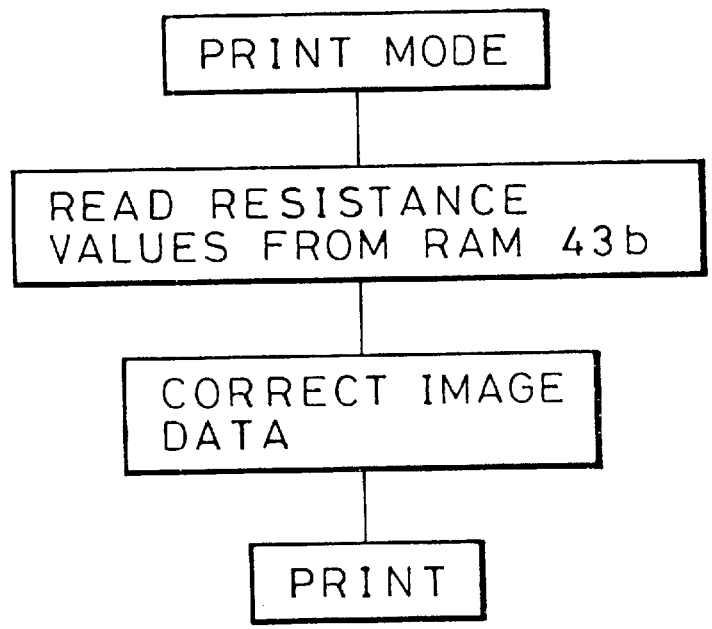
FIG. 8 is a flow chart explaining the operation of a print mode.

Next, a command is entered form the keyboard 62 to designate a print mode as in the flow chart of FIG. 8. At this print mode, three-color image data is first written in the frame memory 40. The three-color image data in the frame memory 40 is read by a calculation unit of the controller 43 and corrected by using correction data. The corrected three-color image data is again written in the frame memory 40.

When the cam mechanism 17 is activated for paper feed, the clamper 12 is shifted to the clamp release position because the platen drum 10 stops with the clamper 12 set vertically in FIG. 1. A color thermosensitive recording sheet 11 supplied from a cassette (not shown) is nipped by the transport roller pair 28 and transported toward the platen drum 10. The transport roller pair 28 stops temporarily when the leading edge of the color thermosensitive recording sheet 11 enters between the platen drum 10 and the clamper 12. Thereafter, the cam mechanism 17 is activated to shift the clamper 12 to the clamp position at which the tip of the color thermosensitive recording sheet 11 is clamped. After this clamping, the platen drum 10 and the transport roller pair 20 rotate so that the color thermosensitive recording sheet 11 is wound about the outer periphery of the platen drum 10.

As the platen drum 10 is intermittently rotated by a constant pitch by the pulse motor 10 and when the top of the record area of the color thermosensitive recording sheet 11 reaches the thermal head 20, a thermal record starts. During this thermal record, one line image data of yellow is read from the frame memory 40 and temporarily written in the line memory 41.

Next, the controller 43 generates comparison data of "0" in hexadecimal notation and sends it to the comparator 42. The corrected image data is sequentially read from the line memory 41 and sent to the comparator 42 to compare the image data with the comparison data. If the comparison data is larger than the image data, an output of the comparator 42 is "L", and in the other cases, it is "H". Each comparison result is sent as serial drive data to the shift register 44, shifted therein in response to the clock, and converted into parallel drive data. This parallel drive data is latched by the latch array 45 and sent to the AND gate array 46.

The controller 43 generates a bias heating strobe signal having a wide pulse width and sends it to the AND gate array 46. The AND gate array 46 outputs a logical product of the strobe signal and the output signal of the latch array 45. Therefore, a signal "H" is outputted from an output terminal of the AND gate array 46 if the latch array 45 outputs a signal "H". For example, if the first output terminal of the AND gate array 46 outputs a signal "H", the transistor 51a is turned on so that the heating element 22a is driven by a bias drive pulse. The width of the bias drive pulse is the same as the pulse width of the bias heating strobe signal. All the heating elements 22a to 22n supply a bias heat energy to the color thermosensitive recording sheet 11 to perform the bias heating.

Immediately before the completion of the bias heating, the comparator 42 uses again comparison data of "0" to compare it with image data for the preparation of the image heating. With this comparison, serial drive data is formed which is written in the shift register 44. After the completion of the bias heating, the controller 43 sends an image heating strobe signal having a narrow pulse width to the AND gate array 46. Each transistor is turned on in accordance with the logical product of the image heating strobe signal and the drive data latched by the latch array 46. As a result, the heating element is powered for a short time by the image drive pulse having the same pulse width as that of the image heating strobe signal, to thereby develop color in the yellow thermosensitive coloring layer 35 at a density having a tonal level of "1" in decimal notation.

In the case of 64 tonal levels of "1" to "64" in decimal notation, the controller 43 sequentially sends comparison data of "0" to "3F" in hexadecimal notation during image heating to the comparator 42. As a result, each heating element 22a to 22n is driven by image drive pulses corresponding in number to the corrected image data, and the color thermosensitive recording sheet 11 is applied with an image heat energy. In this manner, a variation of the resistance value of the heating element is corrected, and a heat energy corresponding to the image data is supplied to the color thermosensitive recording sheet 11 to develop color at a desired density.

In the case of a full-color image such as a color photograph, image data of "0" does not exist so that the bias data may be omitted and instead comparison data of "0" to "3E" in hexadecimal notation may be used for performing comparison 63 times. The image drive data at the time when comparison data is "0" generates a heat energy of a sum of a bias heat energy BY and an image heat energy GY1 for the tonal level of "1".

In recording a pixel of a tonal level of "64", 64 image drive pulses are supplied to the heating element having a reference resistance value. In the case of a heating element having a resistance value smaller than the reference resistance value, an amount of generated heat is large so that for example 62 image drive pulses corrected by the correction data are supplied. In the case of a heating element having a resistance value larger than the reference resistance value, an amount of generated heat is small so that 65 image drive pulses or more are required. Also in this case, the maximum number of image drive pulses is limited to 64. The reason for this is that although a heat energy smaller than a desired value is supplied in the case of the heating element having a resistance value larger than the reference resistance value, the reduction of the heat energy at a high density can be neglected. Obviously, comparison by the comparator 42 may be performed 65 times or more during the image heating period and the maximum number of image drive pulses may be set to 65 or larger, to thereby supply a desired heat energy relative to a pixel having a higher tonal level than the tonal level of "64".

A density variation becomes conspicuous at a middle density or lower. At the middle density, the number of image drive pulses increases or decreases in accordance with the correction data. Therefore, each heating element generates a desired heat energy by correcting its resistance value error, enabling to develop color of each pixel at a desired density.

Instead of limiting the high density side, the low density side may be limited. In this case, the highest resistance value of the heating elements 22a to 22n is used as a reference resistance value, and differences from this reference resistance value are classified into a plurality of steps. A one-step difference is set to one image drive pulse, i.e., correction data of "1". A two-step difference is set to correction data of "2". Each corrected image data is obtained from image data subtracted by the correction data. Although the bias heat energy generated by each heating element is slightly different from an ideal value, the density variation and color variation to be caused by a resistance value error can be avoided practically.

When the first line of the yellow image has been recorded, the platen drum 10 is rotated by one line step, and the second line yellow image data is read from the frame memory 40. The second line yellow image data is corrected by the correction data, and the second line is thermally recorded on the color thermosensitive recording sheet 11 in the similar manner described above. As the area with the thermally recorded yellow image reaches the optical fixing unit 21, the yellow thermosensitive coloring layer 35 is optically fixed. Because the cut-filter 24 is set in front of the ultraviolet lamp 23, the optical fixing unit 21 applies a near ultraviolet ray near at 420 nm to the color thermosensitive recording sheet 11. The diazonium salt compound contained in the yellow thermosensitive coloring layer 35 is decomposed and its coloring developability is lost.

When the platen drum 10 rotates once and the record area again reaches the thermal head 20, a magenta image is recorded one line after another on the magenta thermosensitive coloring layer 34. The coloring heat energy for the magenta image is larger than that for the yellow image. However, the yellow thermosensitive coloring layer 35 has already been optically fixed so that the yellow thermosensitive coloring layer 35 will not develop color again. The color thermosensitive recording sheet 11 with the recorded magenta image is optically fixed by the optical fixing unit 21 in the manner described above. In this case, because the cut-filter 24 has been retracted from the ultraviolet lamp 23, all electromagnetic waves radiated from the ultraviolet lamp 23 are applied to the color thermosensitive recording sheet 11. Of these electromagnetic waves, an ultraviolet ray near at 365 nm optically fixes the magenta thermosensitive coloring layer 34.

As the platen drum 10 rotates again once and the record area reaches again the thermal head 20, a cyan image is recorded one line after another on the cyan thermosensitive coloring layer 33. The cyan thermosensitive coloring layer 33 has a coloring heat energy not developing color under an ordinary maintenance state, so that this layer is not optically fixed. To this end, during the thermal recording of the cyan thermosensitive coloring layer 33, the optical fixing unit 21 is maintained turned off.

After the completion of the thermal recording of the yellow, magenta, and cyan images, the platen drum 10 and transport roller pair 28 are rotated in the reverse direction. As the platen drum 10 rotates in the reverse direction, the trailing edge of the color thermosensitive recording sheet 11 is guided by the separation claw 29 onto the paper feed/eject path 27, and nipped by the transport roller pair 28. When the platen drum 10 reaches the paper feed position, it is stopped. The cam mechanism 17 moves the damper 12 to the clamp release position so that the leading edge of the color thermosensitive recording sheet 11 is released from the damper 12. In this manner, the thermally recorded color thermosensitive recording sheet 11 is ejected via the paper feed/eject path 27 onto a tray.

The resistance values Ra to Rn of the heating elements 22a to 22n written in RAM 43b and the charge time Ts and the resistance value Rs of the standard resistor 54 written in RAM 43c are maintained to be stored by using a back-up battery or by supplying a back-up power from the power source 51. If such a power from the power source 51 is used, data in RAMs 43b and 43c is lost when the power of the thermal printer is turned off. In this case, the resistance values are measured at each set-up of the thermal printer. RAMs 43b and 43c may be replaced by a ROM which requires no back-up power source. In this case, the resistance values of the heating elements 22a to 22n are measured when the thermal printer is assembled, and the correction data is written in ROM which is thereafter assembled with the controller 43.

Figure 9:
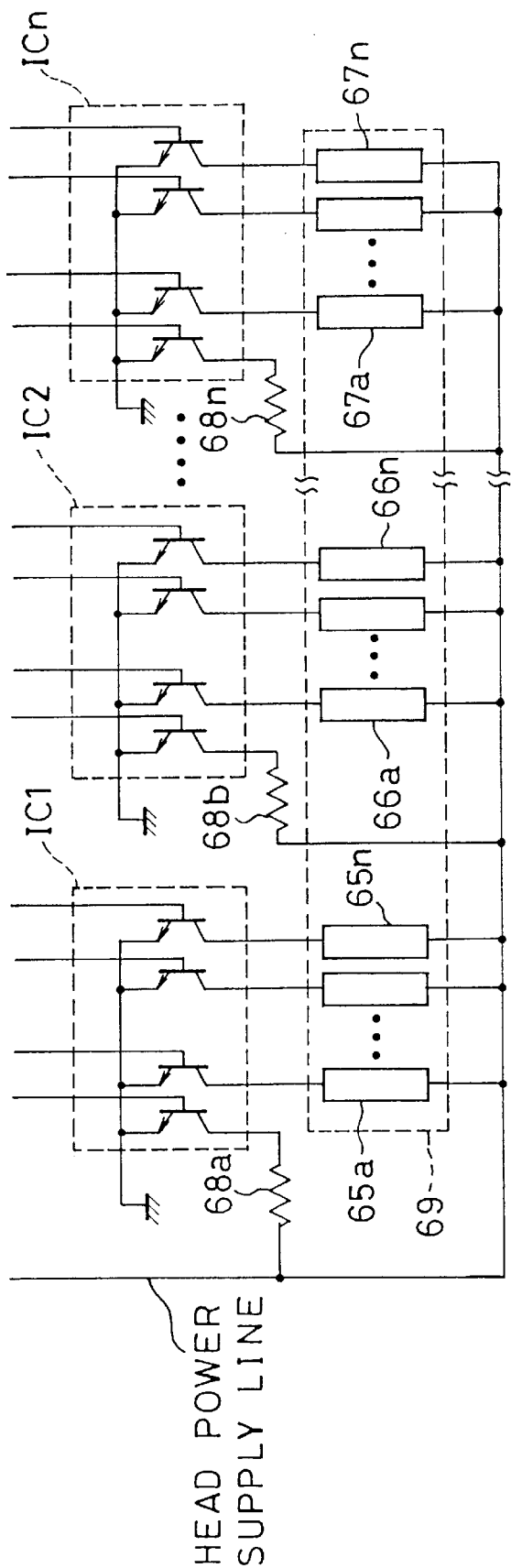
FIG. 9 is a circuit diagram of the main part of a thermal head having a plurality of drive ICs.

As shown in FIG. 9, if the number of heating elements is large, the heating elements are divided into a plurality of heating element groups each being driven by a corresponding one of a plurality of drive ICs IC1 to ICn. The drive ICs IC1 to ICn control the conduction of the heating element groups 65a to 65n, 66a to 66n, . . . , 67a to 67n. Each drive IC IC1 to ICn is provided with one standard resistor 68a to 68n. By using each standard resistor, the resistance values of the heating elements of each heating element group are calculated. The characteristics of transistors in the same drive IC have generally a small variation. The transistor characteristics of different ICs differ from each other. In this embodiment, since a standard resistor is provided for each drive IC, the resistance values can be calculated at a high precision. Reference numeral 69 represents a heating element array.

Figure 10:
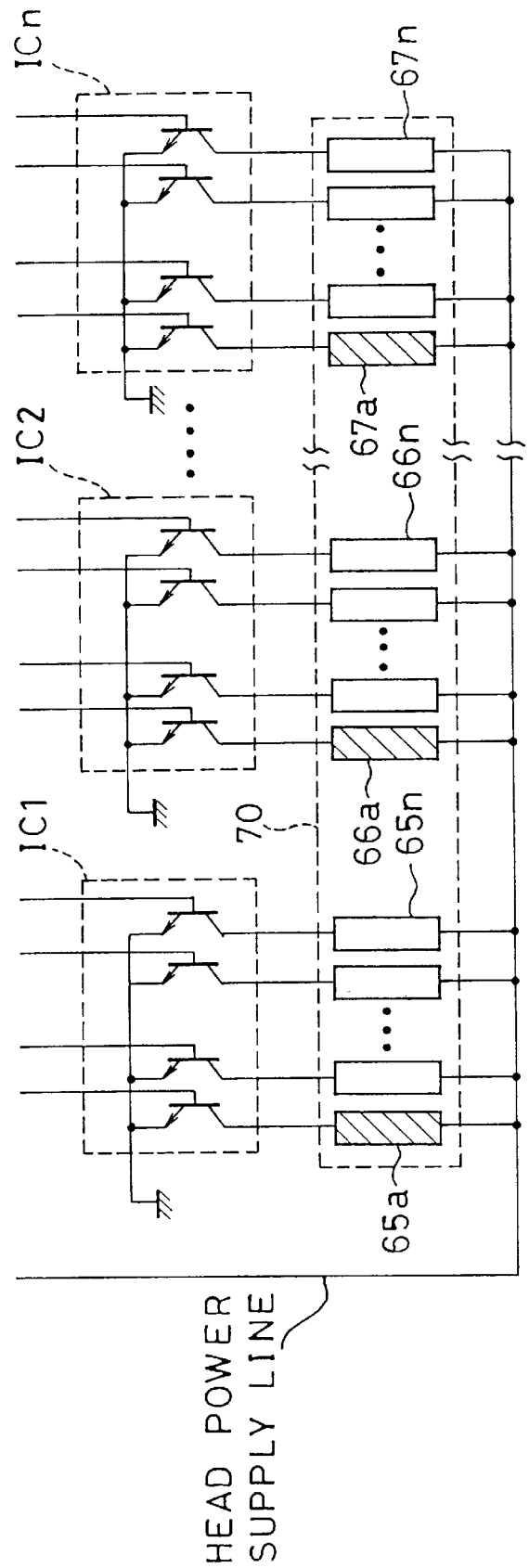
FIG. 10 is a circuit diagram of the main part of a thermal head using a spare heating element as a standard resistor.

In the embodiment shown in FIG. 10, one heating element of each heating element group is used as a standard resistor. Specifically, the heating elements 65a, 66a, . . . , 67a are used for printing and for the standard resistors 68a, 68b, . . . , 68n shown in FIG. 9. It is necessary to adjust the resistance values of these heating elements 65a, 66a, . . . , 67a so as to have the standard resistance value. This adjustment can be achieved by a trimming process which passes an over-current through the heating elements. As an over-current flows through a heating element, the resistance value thereof lowers slightly. By flowing an over-current a plurality of times, the resistance value falls into a predetermined range.

If such a trimming process is performed for all heating elements, the resistance value of each heating element can fall in the predetermined range. However, this labor is enormous and raises the cost. From this reason, one heating element is selected from each drive IC IC1 to ICn and the trimming process is performed only for the selected heating elements which are then used as the standard resistors. A standard resistor is not necessary to be mounted at the outside of each drive IC. A transistor not directly contributing to printing is not necessary to be provided at each drive IC IC1 to ICn, reducing further the cost of the circuit. If there are spare heating elements not used for printing, these spare heating elements are used as the standard resistors. The trimming process is detailed in U.S. Ser. No. 08/214,755 filed on Mar. 18, 1994 and assigned to the present assignee of this application.

Figure 12:
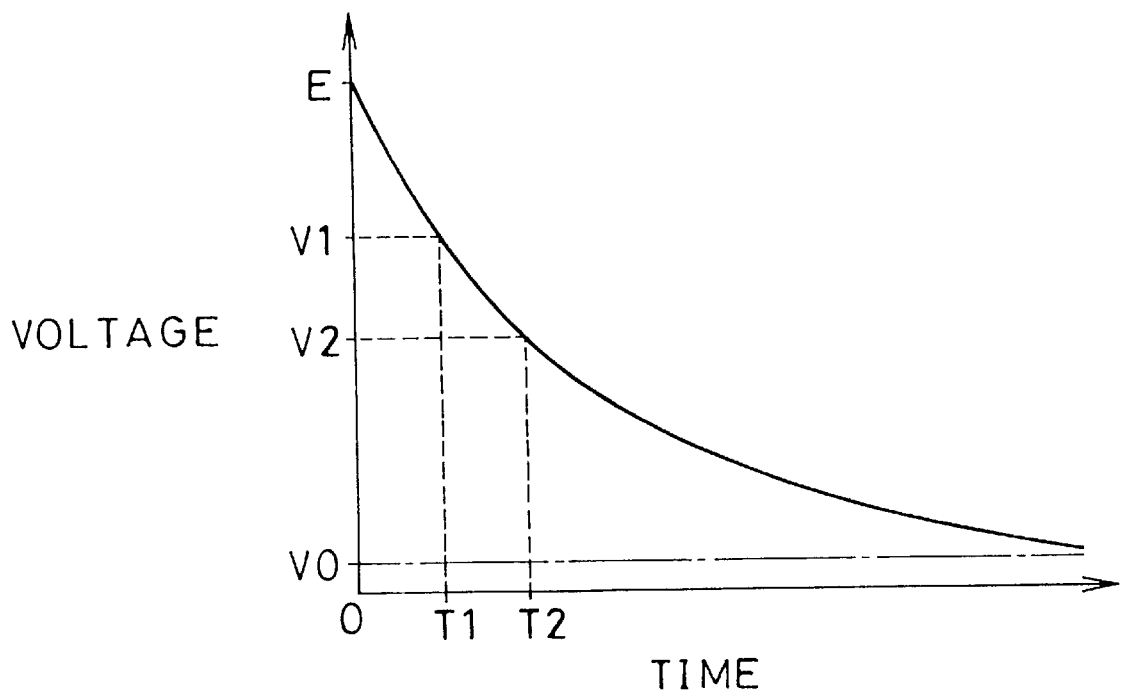
FIG. 12 is a graph showing the discharge of the noise absorbing capacitor.
Figure 11:
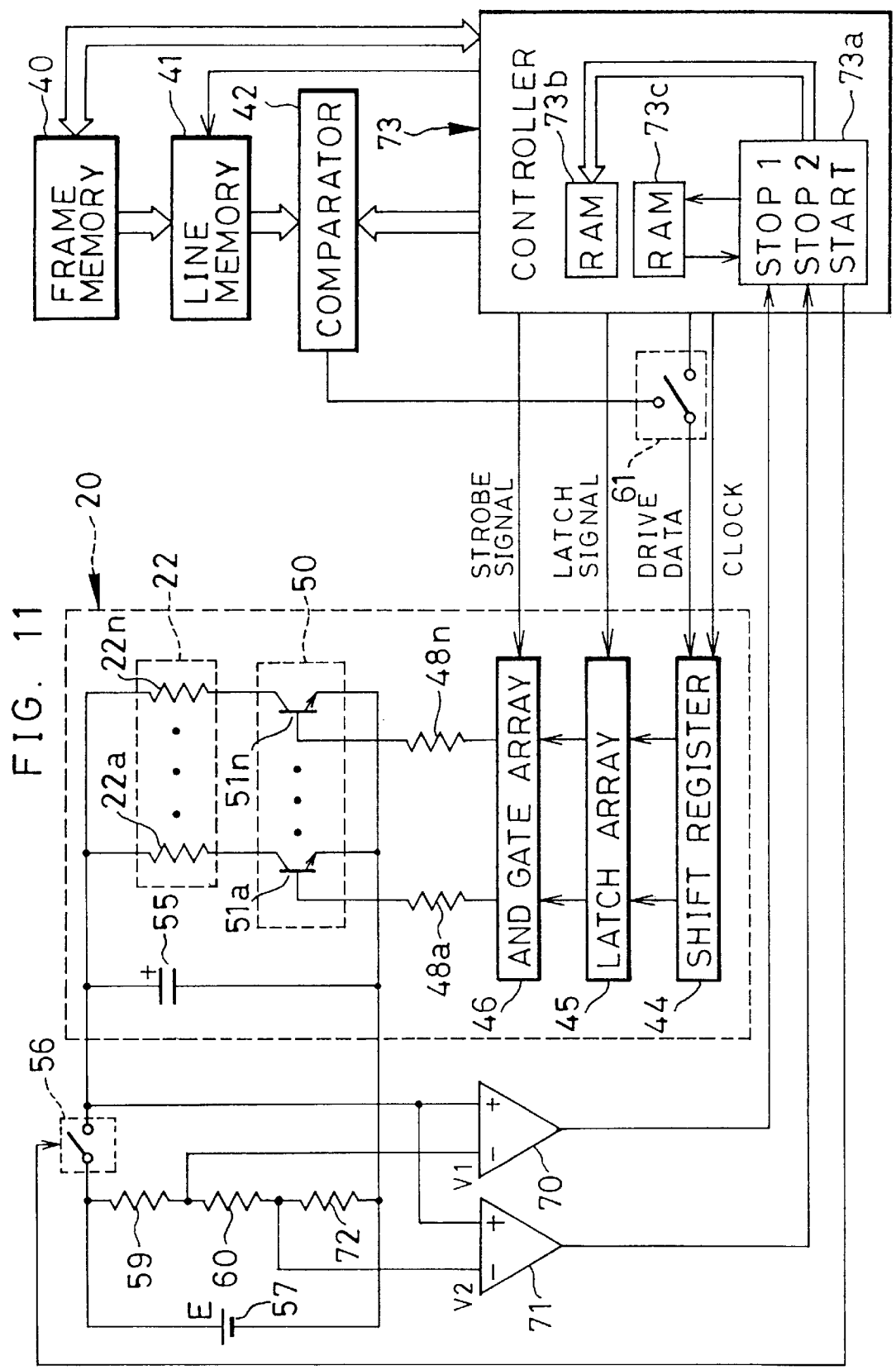
FIG. 11 is a block diagram of an embodiment wherein a resistance value of a heating element is measured from two-step voltage drops across a noise absorbing capacitor.

FIG. 11 shows an embodiment wherein the resistance of each heating element can be correctly calculated by measuring the discharge of the noise absorbing capacitor at two steps without using a standard resistor. Like elements to those of the embodiment shown in FIG. 5 are represented by using identical reference numerals. A reference voltage at the interconnection point between resistors 59 and 60 is inputted to a comparator 70. A reference voltage at the interconnection point between resistors 60 and 72 is inputted to a comparator 71. Output signals of the comparators 70 and 71 are sent to the resistance value measuring unit 73a of the controller 73. As shown in FIG. 12, the resistance value measuring unit 73a measures a discharge time T1 required for the charged voltage to lower to the reference voltage V1 after the discharge start of the noise absorbing capacitor 55 and a discharge time T2 required for the charged voltage to lower to the reference voltage V2. Reference numerals 73b and 73c represent a RAM. The voltage V0 shown in FIG. 12 is a transistor saturation voltage described earlier.

In this embodiment, a correct resistance value of a heating element can be obtained by measuring the two discharge times T1 and T2 because the influence of the saturation voltage of the transistor connected to the heating element can be removed. For example, in order to calculate the resistance value Ra of the heating element 22a, the following equation (11) is used.

$$[V1 - E\exp(-T1/CRa)]/[V2 - E\exp(-T1/CRa)] = \qquad (11)$$

$$[1 - \exp(-T2/CRa)]/[1 - \exp(-T2/CRa)]$$

In the equation (11), the values of V1, V2, E, and the capacitance C of the capacitor 55 are known.

The equation (11) can be derived in the following manner. The voltage V across the capacitor is given by the following equation (12) wherein the power source voltage is E, a discharge time is t, the capacitance of the capacitor is C, the resistance value of the heating element 22a is Ra, and the saturation voltage of the transistor 51a is V0.

$$V-V0=(E-V0)\exp(-t/CRa) \quad (12)$$

Substituting t=T1 and V=V1, we obtain:

$$V1-V0=(E-V0)\exp(-T1/CRa) \quad (13)$$

The equation (13) can be modified to the following equation (14).

$$V1-E\exp(-T1/CRa)=V0\{1-\exp(-T1/CRa)\} \quad (14)$$

Substituting t=T2 and V=V2 into the equation (12), we obtain the following equation (15) corresponding to the equation (14).

$$V2-E\exp(-T2/CRa)=V0\{1-\exp(-T2/CRa)\} \quad (15)$$

From the equations (14) and (15), the saturation voltage V0 term is erased to obtain the equation (11). By using the resistance value Rb, ..., Rn in place of the resistance value Ra, the resistance values Rb to Rn of the heating elements 22b to 22n can be obtained.

Figure 13:
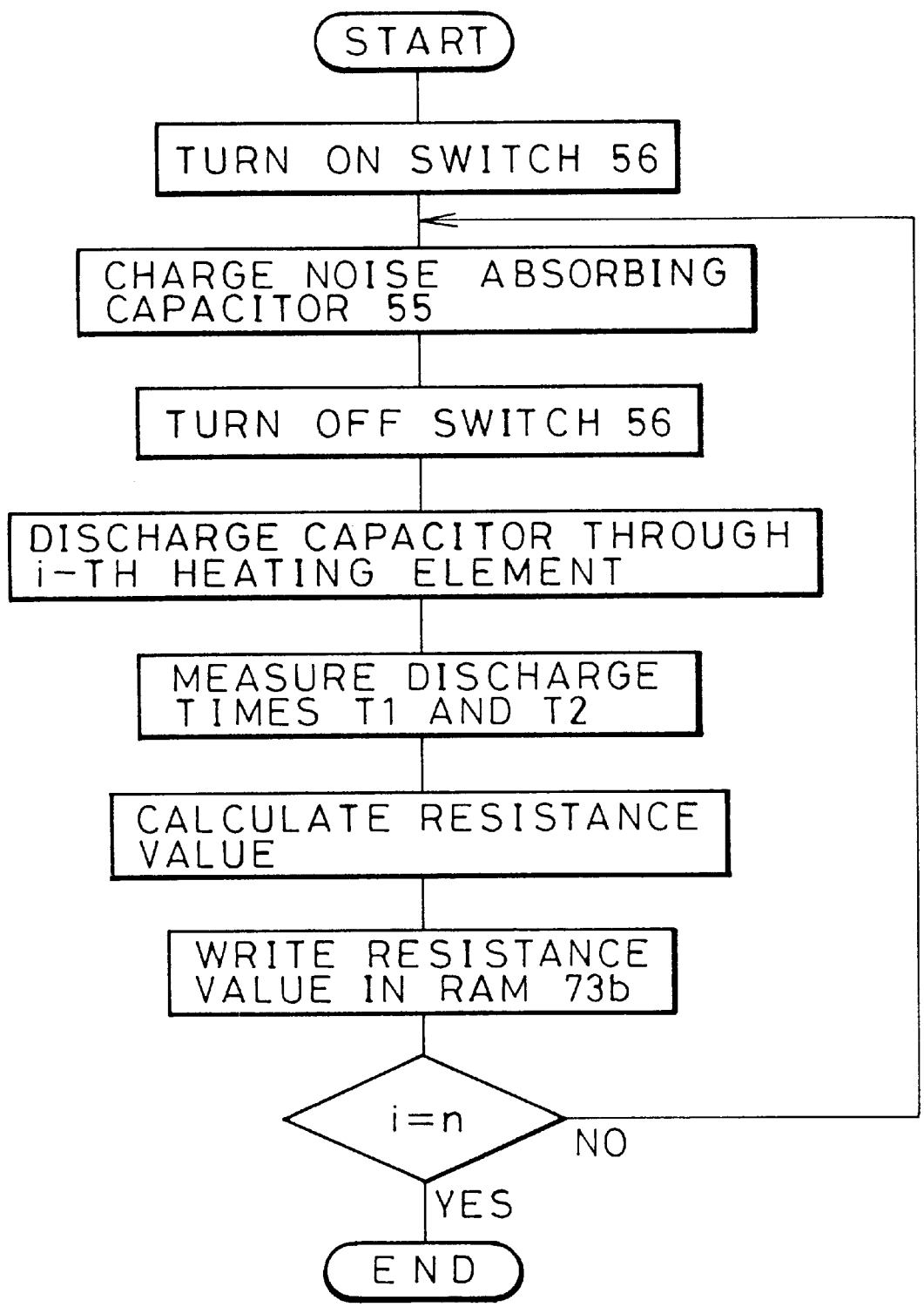
FIG. 13 is a flow chart explaining the operation of the resistance value measuring mode of the embodiment shown in FIG. 11.
Figure 14:
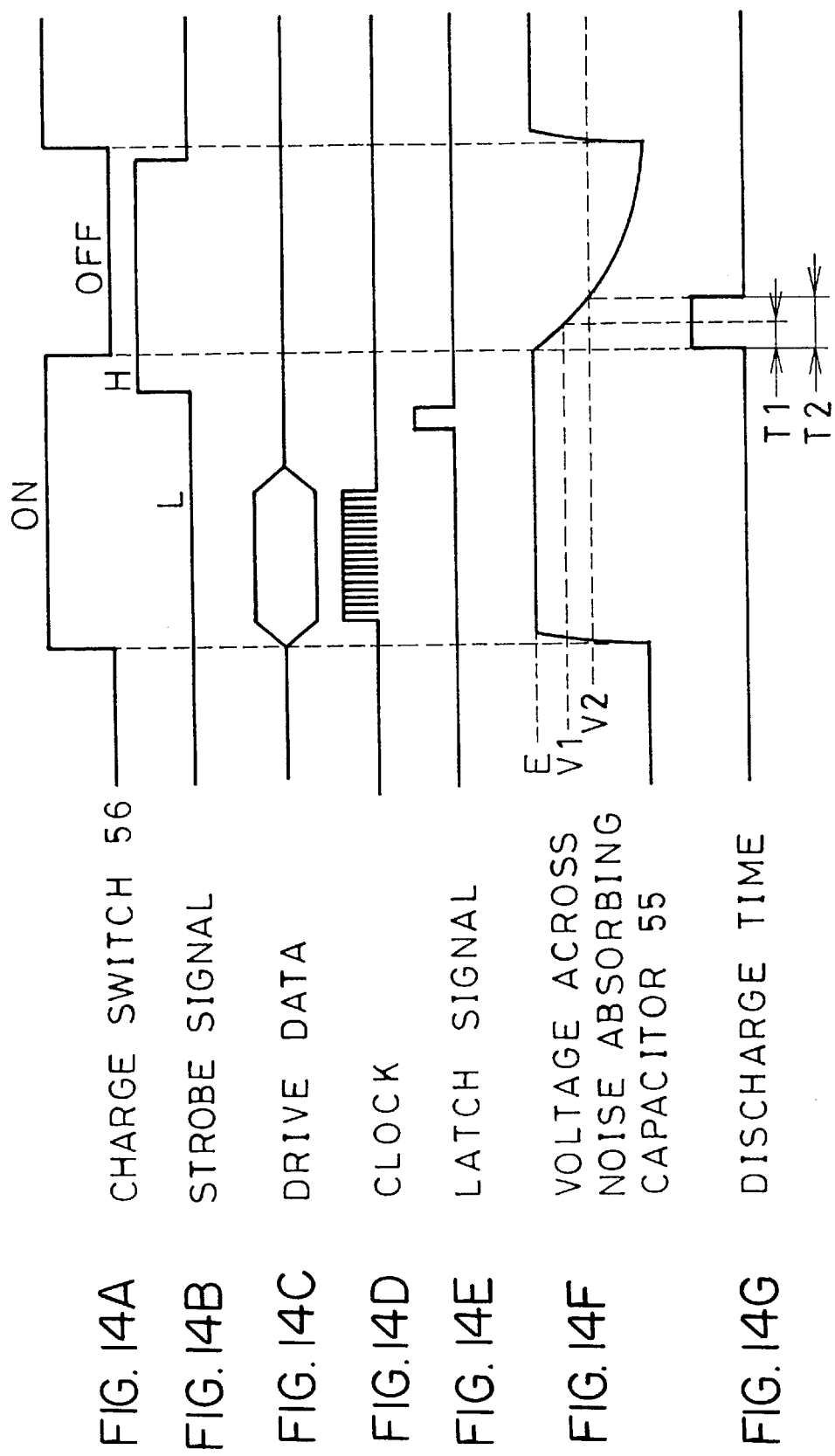
FIGS. 14A–14G show signal waveforms at various points of each circuit shown in FIG. 11 at the resistance value measuring mode.

Next, referring to FIGS. 13 and 14, the operation of the resistance value measuring device shown in FIG. 11 will be described. Similar to the embodiment described previously, the noise absorbing capacitor 55 is charged to the voltage E, and thereafter the transistor 51a is turned on to make the noise absorbing capacitor 55 discharge via the heating element 22a. During this discharge, when the voltage across the noise absorbing capacitor 55 lowers to the reference voltage V1, an output of the comparator 70 inverts to "L". The resistance value measuring unit 73a measures the discharge time T1 required for the comparator 70 to perform an inversion operation after the start of discharging the noise absorbing capacitor 55. As the discharge progresses further and when the voltage across the noise absorbing capacitor 55 lowers to the reference voltage V2, an output of the comparator 71 inverts to "L". The resistance value measuring unit 73a measures the discharge time T2 at this inversion. The obtained two discharge times T1 and T2 are written in RAM 73c.

Next, the resistance value measuring unit 73a reads the discharge times T1 and T2 from RAM 73b, calculates the resistance value Ra of the heating element 22a by using the equation (11), and writes it in RAM 73c. Similarly, the resistance values Rb to Rn of the heating elements 22a to 22n are calculated and written in RAM 73b. Correction data is obtained from the resistance values Ra to Rn in the manner described previously. Each image data is corrected by the correction data of each heating element. In this manner, a density variation to be caused by a resistance value error of each heating element 22a to 22n is eliminated.

In each embodiment described above, one or two discharge times are measured and a resistance value is calculated by using each equation. A relationship between discharge times and resistance values may be stored in a table in advance to directly read a resistance value from this table. Furthermore, an approximation of the equation (11) may be used to simplify the calculations.

Figure 15:
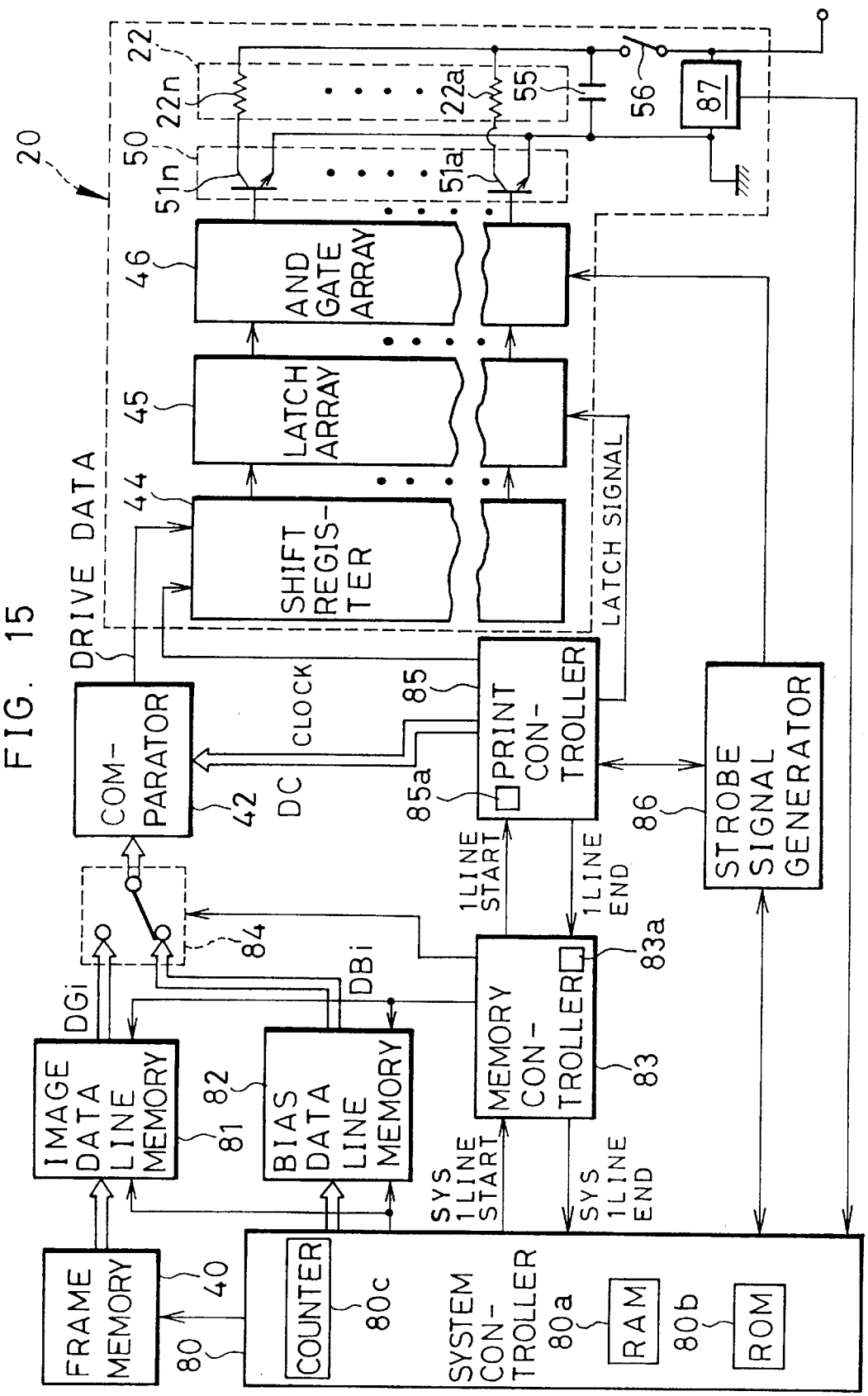
FIG. 15 is a block diagram of a color direct thermal printer according to an embodiment of the present invention, wherein the number of bias drive pulses is changed in accordance with a resistance value error.

Another embodiment will be described with reference to FIG. 15 in which driving each heating element is controlled in accordance with a calculated resistance value of the heating element. In this embodiment, the bias heating is performed by using a plurality of bias drive pulses like the image heating. By adjusting the number of bias drive pulses, the same heat energy is generated irrespective of a different resistance value. In FIG. 15, like elements to those shown in FIG. 5 are represented by using identical reference numerals.

In printing an image, a system controller 80 reads one line bias data from a RAM 80a and writes it in a bias line memory 82. The system controller 80 reads image data from a frame memory one line after another, and writes it in an image data line memory 81. In recording one line image of one color, the bias heating is performed by using bias data from the bias line memory 82, and the image heating is performed by using image data from the image data line memory 81. The bias data and image data are converted into the numbers of drive pulses for driving a heating element. In this embodiment, the maximum number of bias drive pulses is "256", and the maximum number of image drive pulses is "64" representing 64 tonal levels.

In this embodiment, a highest resistance value of a heating element is used as a reference value which corresponds to bias data of "256". A correction value is determined from a difference between the highest resistance value and a resistance value of each heating element. Bias data is "256" subtracted by the correction value. The value of the bias data becomes large and the number of bias drive pulses becomes large as the resistance value of a heating element becomes high, whereas the value of the bias data becomes small as the resistance value of a heating element becomes low. The relationship between resistance values and bias data is obtained from experiments. Since bias data is unanimously determined by the resistance value, this relationship is written in a ROM 80b as a conversion table.

If bias data of "256" is assigned to the highest resistance value, a constant heat energy can be generated for the bias heating by correcting the bias data by a resistance value error. However, in many cases, this constant heat energy is slightly different from a heat energy immediately before coloring. Because this difference is small, the heat energy for the bias data of "256" may be assumed to be the bias heat energy. In order to generate a correct bias heat energy, it is preferable to finely change the width of a bias drive pulse in accordance with the highest resistance value. Obviously, a resistance value allowing a heating element to have a correct bias heat energy may be used as a reference resistance value to obtain a correction value in accordance with a difference between the reference resistance value and a resistance value of each heating element.

As described previously, at the resistance value measuring mode, a voltage measuring circuit 87 and system controller 80 measure the resistance value of each heating element 22a to 22n, the obtained resistance value being written in RAM 80a. The voltage measuring circuit 87 has the comparator 58, and resistors 59 and 60 shown in FIG. 5. For the resistance value measurement, one of the above-described method using a standard resistor having a known resistance value and the above-described method without using a standard resistor may be used. After the resistance value measurement, a correction value is read from the conversion table in ROM 80b by using the resistance value as an address, and thereafter, bias data is obtained by subtracting the reference value by the correction value. The bias data is written in RAM 80a.

Alternatively, instead of assembling the resistance value measuring device with the thermal printer, a resistance value may be measured at the time of thermal printer assembly/adjustment by using a dedicated resistance value measuring device made of a voltage measuring circuit and a microcomputer. The measured resistance values are written in RAM 80a or ROM 80b which is thereafter assembled with the system controller 80. Furthermore, the resistance values measured by the dedicated resistance value measuring device may be converted into correction values by using a conversion table, and bias data calculated from the correction values and reference value is written in the system controller 80.

In response to a print start signal, the system controller 80 generates a system one line start signal and supplies it to a memory controller 83. Receiving the system one line start signal, the memory controller 83 connects a selector 84 to the bias data line memory 82 side to execute the bias heating. During the bias heating, the memory controller 83 reads bias data one item after another from the bias data line memory 82, and sends one line bias data to a comparator 42. Reading one line bias data is repeated 256 times. The comparator 42 compares one line bias data 256 times with bias comparison data of "0" to "FF" from the print controller 85.

After the completion of 256 comparisons of one line bias data, the print controller 85 sends a one line end signal to the memory controller 83. Receiving the one line end signal, the memory controller 83 connects the selector 84 to the image data line memory 81 side to execute the image heating. During the image heating, the memory controller 83 reads one line image data 64 times from the image data line memory 81 and sends them to the comparator 42. The comparator 42 compares one line image data 64 times with image comparison data of "0" to "3F" from the print controller 85.

The print controller 85 sends the one line end signal to the memory controller 83 at the completion of comparison with image comparison data, like at the completion of comparison with bias comparison data. The memory controller 83 has a one-bit counter (flip-flop) 83a for counting the number of one line end signals from the print controller 85. Each time two one line end signals have been inputted, i.e., each time bias heating and image heating are completed, a system one line end signal is sent to the system controller 80.

The print controller 85 has a one-bit counter 85a, and changes the kind of comparison data each time the one-bit counter receives the one line print start signal from the memory controller 42. Specifically, upon reception of the first one line print start signal, the print controller 85 sequentially outputs bias comparison data of 8 bits representing "0" to "FF". Upon reception of the second one line print start signal, the print controller 85 sequentially outputs image comparison data of 8 bits representing "0" to "3F". Upon reception of the third one line print start signal, bias comparison data is outputted. Similar operations continue in the above manner.

In this embodiment, a gradation of 64 tonal levels is provided by using image comparison data of "0" to "3F" in hexadecimal notation. The number of tonal levels may be changed as desired by changing the number of image comparison data in accordance with the characteristics of each thermosensitive coloring layer. If the number of image drive pulses is set to "256", the comparison data can be shared by the bias heating and image heating, resulting in the same operation sequence. In this case, the counter 85a is not necessary and the print controller 85 performs a one line operation for a one line print.

As described earlier, the comparator 42 compares bias data with bias comparison data, and image data with image comparison data. If the comparison data is smaller, the comparator outputs drive data of "H", and in the other cases, it outputs drive data of "L". By using these drive data, bias drive pulses and image drive pulses are generated in the manner described previously, and the heating elements are driven by these drive pulses.

Figure 17:
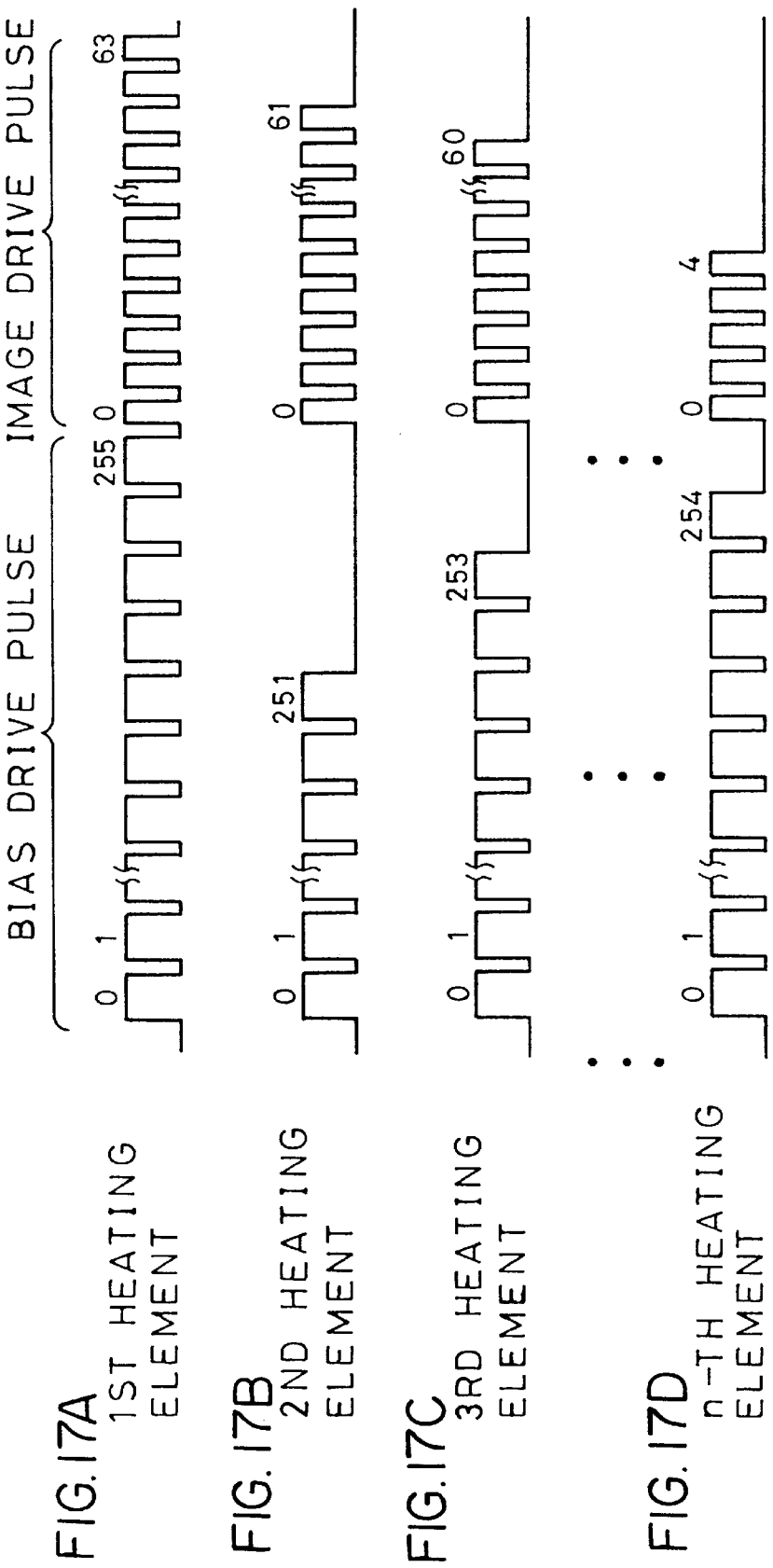
FIGS. 17A–17D show examples of a bias drive pulse train and an image drive pulse train.

FIG. 17 shows examples of drive pulse trains for heating elements. In these examples, a first heating element has a highest resistance value. The value of bias data and hence the number of bias drive pulses is reduced in accordance with a difference between the highest resistance value and a resistance value of each heating element. For example, the heating element having the highest resistance value is driven by 256 bias drive pulses. A second heating element having a resistance value lower than the first heating element is driven by, for example, 252 bias drive pulses. A third heating element having a resistance value slightly lower than the first heating element is driven by, for example, 254 bias drive pulses. In this manner, bias drive pulses corresponding in number to the resistance value of each heating element are applied. Therefore, even if resistance values of heating elements differ, each heating element can supply a bias heat energy BY immediately before the yellow thermosensitive coloring layer 35 develops color, and can perform a desired bias heating.

During the image heating, each heating element is driven by image drive pulses corresponding in number to image data. For example, if image data for the first heating element has a tonal level of "64" in decimal notation, 64 ("0"–"63") image drive pulses drive the first heating element. If image data for the second heating element has a tonal level of "62", 62 image drive pulses drive the second heating element.

Figure 16:
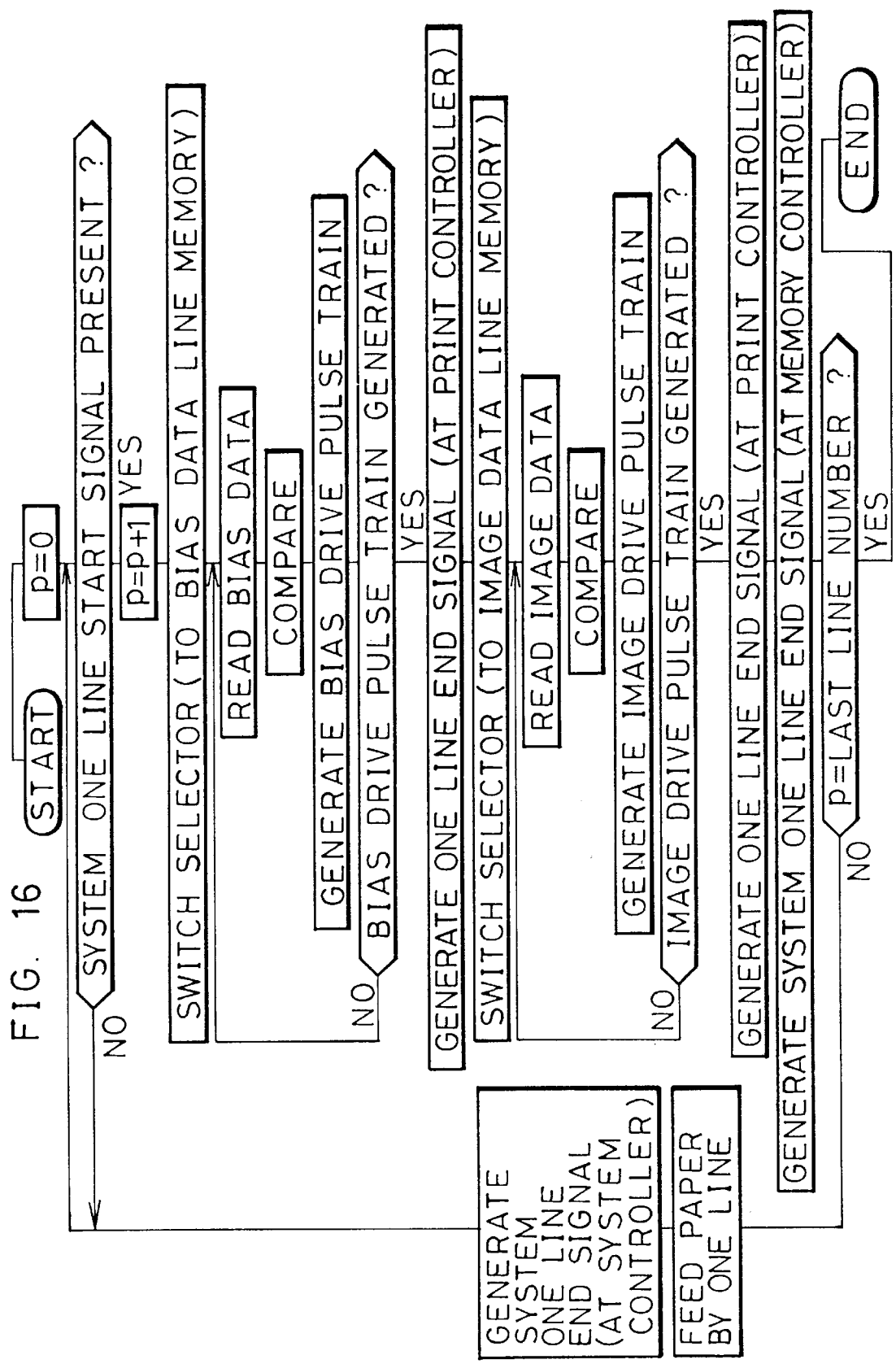
FIG. 16 is a flow chart explaining a print procedure of the embodiment shown in FIG. 15.

Next, the operation of the embodiment shown in FIG. 15 will be described with reference to FIG. 16. When a print start switch (not shown) is activated, the system controller 80 feeds a color thermosensitive recording sheet, reads yellow image data of the first line one pixel after another from the frame memory 40, and writes the image data in the image data line memory 81. In order to suppress a change in the amount of heat generation to be caused by a resistance value error of each heating element, bias data is read from RAM 80a and written in the bias data line memory 82. The system controller 80 resets the counter 80c to "0" (p=0).

As the platen drum 10 intermittently rotates at a constant step, the top of the record area of a color thermosensitive recording sheet 11 reaches the heating element array 22. At this time, the first line of the yellow image can be thermally recorded. The system controller 80 generates the system one line start signal and sends it to the memory controller 83. At this time, the counter 80c is incremented by 1 (p=p+1). Receiving the system one line start signal, the memory controller 83 connects the selector 42 to the bias data line memory 82 side to send bias data of each heating element to the comparator 42.

The memory controller 83 generates the one line start signal and sends it to the print controller 85. Receiving the one line start signal, the print controller 85 sends bias comparison data of "0" to the comparator 42. The one-bit counter 85a counts the number of generations of the one line start signals. If the count is "1", the print controller 85 sends bias comparison data, and if the count is "0", it sends image comparison data.

In this case, the count of the one-bit counter 85a is "1" because only a single one line start signal has been received. Therefore, the print controller 83 sends bias comparison data to the comparator 42. The comparator 42 compares bias data (DBi) of each heating element with bias comparison data outputted from the print controller 85. If the former is smaller than the latter, the comparator 42 outputs bias drive data of "1". One line serial bias drive data outputted from the comparator 42 is shifted in the shift register 44 and converted into parallel bias drive data. The system controller 80 confirms whether the first line can be thermally recorded, and thereafter makes the latch array 45 latch the parallel bias drive data. The latched bias drive data is sent to the AND gate array 46.

In response to a bias heating strobe request signal from the print controller 85, the strobe signal generator 86 sends a bias heating strobe signal to the AND gate array 46. If the bias drive data is "H", the AND gate array 46 outputs a signal "H" while the strobe signal is inputted thereto. This signal "H" turns on, for example, the transistor 22a. The bias drive pulse having the pulse width corresponding to the strobe signal is supplied to the heating element 22a to heat it.

Thereafter, the bias data is compared with bias comparison data of "1" to "FF" one line after another to drive the heating elements 22a to 22n in accordance with the comparison results. In this manner, drive pulses corresponding in number to the resistance value of each heating element ate supplied to each heating element. Each heating element supplies the bias heat energy BY immediately before the yellow thermosensitive coloring layer 35 develops color, to the color thermosensitive recording sheet 11.

After the completion of one line bias data comparison with bias comparison data of "FF", the print controller 85 sends a one line end signal to the memory controller 83. Receiving the one line end signal, the memory controller 83 activates the selector 84 to connect the image data line memory 81 to the comparator 42, and sends a one line start signal to the print controller 43. After the selector 84 has been activated, the memory controller 83 reads one line yellow image data one data item after another from the image data line memory 81, and sends it to the comparator 42.

When the second one line start signal is inputted to the counter 85a of the print controller 85, the count changes from "1" to "0". Therefore, the print controller 85 sequentially sends image comparison data of "0" to "3F" to the comparator 42. The comparator 42 compares first image comparison data "0" with one line yellow image data sent from the image data line memory 81. If the former is smaller than the latter, the comparator 42 outputs image drive data of "H".

One line image drive data outputted from the comparator 42 is sent via the shift register 44 and latch array 45 to the AND gate array 46. An output of the AND gate array 46 for which image drive data of "H" has been supplied, becomes "H" while a short strobe signal is inputted thereto. A transistor supplied with this "H" signal turns on, and the heating element connected thereto is driven and heated by the image drive pulses having a short pulse width. Similarly, one line image drive data is compared with image comparison data of "1" to "3F", and each heating element is driven by image drive pulses corresponding in number to the yellow image data.

After the first line gradation pulse train has been generated, the print controller sends a one line end signal to the memory controller 83. Receiving the second one line end signal, the memory controller 83 outputs a system one line end signal to the system controller 80. From this system one line end signal, the system controller 80 confirms the completion of printing the first line so that the platen drum 10 is rotated by one line to feed the color thermosensitive recording sheet. During this sheet feeding, the system controller 80 sends a system one line start signal to the memory controller 83. The memory controller 83 activates the selector 84 to send bias data from the bias data line memory 82 to the comparator 42. In response to the system one line start signal, the system controller 80 reads the second line yellow image data from the frame memory 40 and writes it in the image data line memory 81.

Thereafter, the bias heating is performed by using a plurality of bias drive pulses in the manner described previously, and then the image heating is performed by using image drive pulses corresponding in number to the second line yellow image data read from the image data line memory 81. Each heating element is supplied with K (maximum 256) bias drive pulses and J (maximum 64) image drive pulses to thermally record the second line. Similarly, the third and following lines are sequentially thermally recorded. When the count p of the counter 80c indicates the last line number, recording the lines of the yellow image of one frame is completed.

As described earlier, the area recorded with the yellow image is fixed by an ultraviolet ray. Thereafter, a magenta image is thermally recorded one line after another. Also in the bias heating for recording the magenta image, bias drive pulses same in number to those of thermal recording of the yellow image are used. However, since the bias heat energy BM of the magenta thermosensitive coloring layer is larger than the yellow thermosensitive coloring layer, a strobe signal having a wider pulse width is used so that bias drive pulses having a wider pulse width are generated. By adjusting the number of bias drive pulses, all heating elements can generate a constant bias heat energy BM. Image drive pulses used for recording the magenta image have also a wider pulse width than the case of the yellow image. After the magenta image has been recorded, the magenta thermosensitive coloring layer is fixed and the cyan image is recorded one line after another.

In the above embodiment, in determining bias data for each heating element in accordance with the resistance value, a difference between a detected highest reference resistance value and the resistance value is obtained. In accordance with the resistance value difference, the number of bias drive pulses is reduced. Alternatively, the bias data may be determined by calculating an average resistance value of all heating elements and increasing or decreasing the number of bias drive pulses. Furthermore, bias data for each heating element may be determined by using a lowest resistance value as a reference resistance value. An image cannot be recorded while data is written in the image data line memory. In order to avoid this, a plurality of image data line memories may be used. If four to six image data line memories are used, the system controller 80 can collectively write image data into some image data line memories during the idle time of the system controller 80. The system controller 80 can therefore suspend image data write for a relatively long period and other processing can be performed efficiently during this period.

Figure 18:
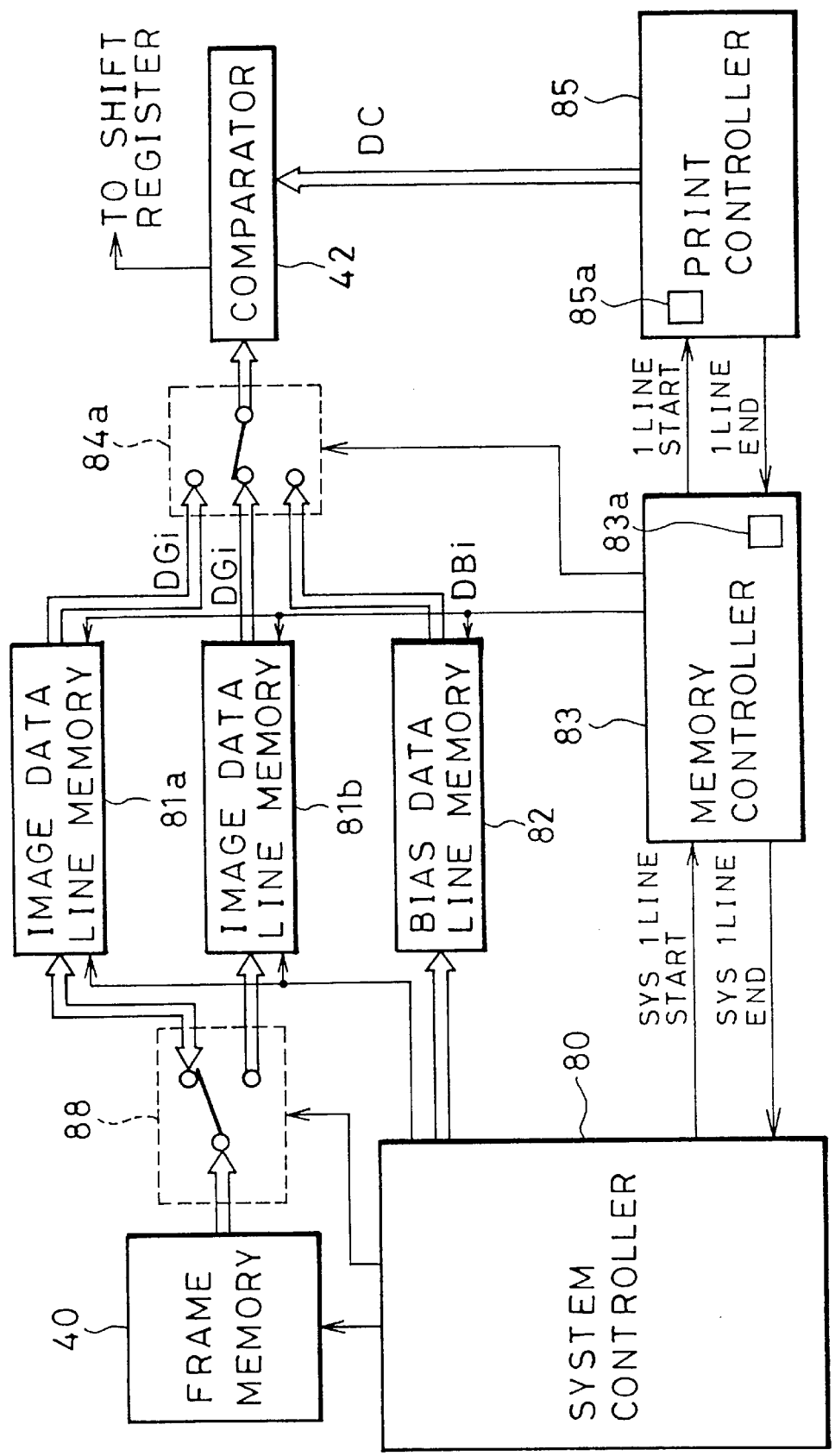
FIG. 18 is a block diagram showing the main part of a thermal head drive unit according to an embodiment of the present invention, in which two image data line memories are used.

FIG. 18 shows an embodiment wherein two image data line memories 81a and 81b are provided. The system controller 80 alternately switches a selector 88 to write one line image data into one of the two image data line memories 81a and 81b. For example, during the image heating, if the selector 84a selects the image data line memory 81a and reads image data in this memory 81a, the selector 88 connects the image data line memory 81b to the frame memory 40 and writes one line image data read from the frame memory 40 into the image data line memory 81b.

The bias heat energy for magenta and cyan of loud color is considerably larger than the image heat energy so that the bias heat energy has a large error. As a result, a density variation and a color variation can be effectively suppressed only by correcting the bias heat energy error. If the bias heat energy error to be caused by a resistance value error is corrected, the bias heat energy error can be more precisely corrected. If the image heat energy error is corrected during the image heating, the image heating takes a longer time because of the calculation process of image data. More specifically, the calculation process is difficult to be achieved during the time duration of generating image drive pulses having a shorter pulse width, and the resultant pulse period becomes longer. This causes a heat loss and a low print speed.

In order to prevent this, the bias data is modified immediately before the bias heating, in accordance with the image heat energy error. The obtained bias data is not for generating a bias heat energy immediately before coloring, but for generating a heat energy allowing the coloring to be effective. This bias data is therefore called hereinafter a modified bias data.

Figure 19:
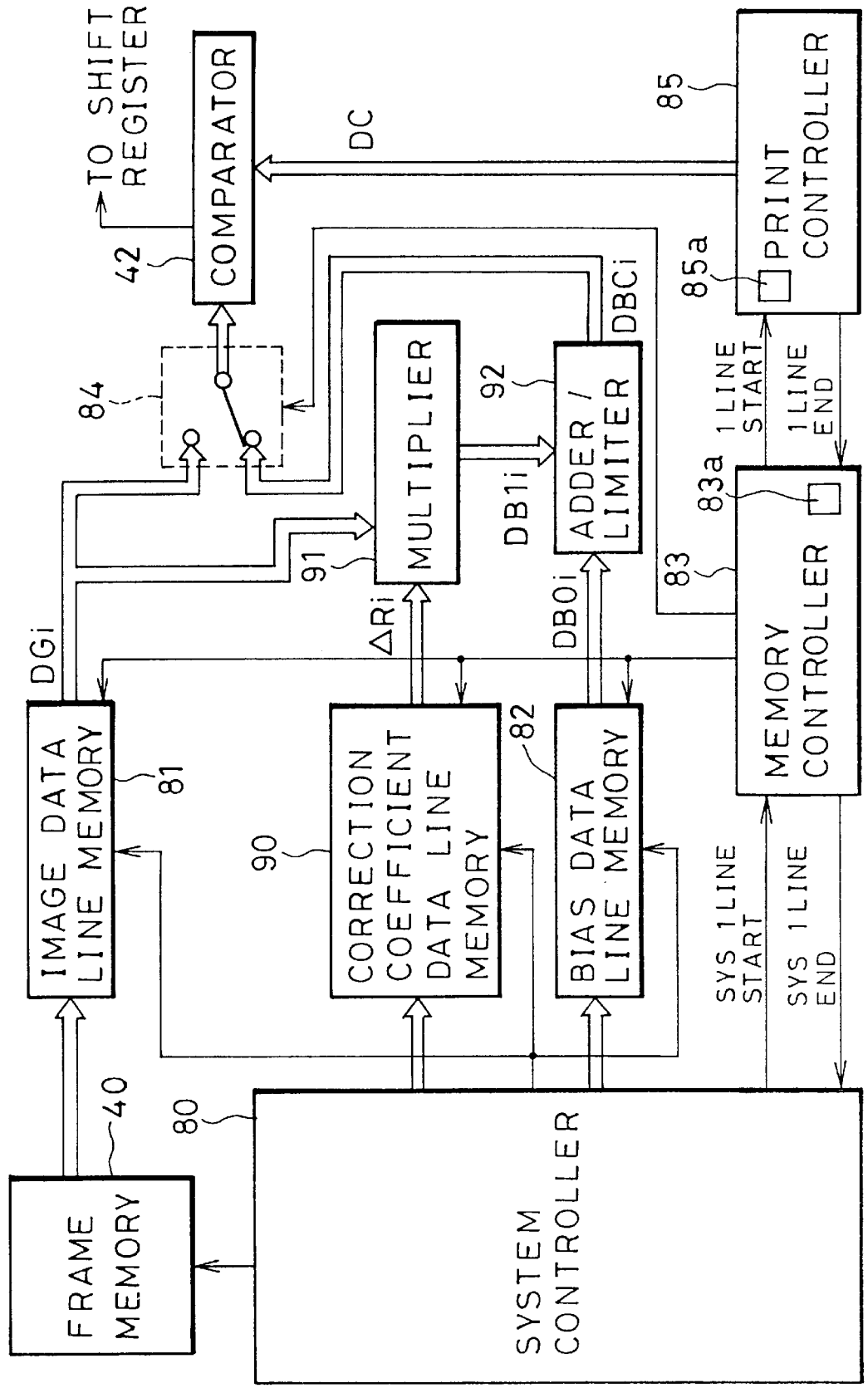
FIG. 19 is a block diagram explaining the main part of an embodiment in which an image heat energy error is corrected.

FIG. 19 shows an embodiment using the modified bias data. Like elements to those shown in FIG. 15 are represented by using identical reference numerals. In this embodiment, the number of tonal levels is "128". First, the correction of the bias heat energy error to be caused by the resistance value error is performed, as described earlier, by using bias data for generating a constant bias heat energy immediately before coloring stored in the bias data line memory 82. The image heat energy error depends upon not only the resistance value error but also the tonal level. Therefore, image correction coefficient data $\Delta R2i$ (i represents the i-th heating element) representing a correction heat energy per unit tonal level is used. This image correction coefficient data $\Delta R2i$ changes with the resistance value error and is written in a correction coefficient data line memory 90.

A multiplier 91 multiplies image data DGi read from the image data line memory 81 by the image correction coefficient data $\Delta R2i$ to obtain image correction data DB1i matching the tonal level of each heating element. The image correction data DB1i is added by an adder/limiter 92 to the bias data read from the bias data line memory 82. The obtained modified bias data DBCi is sent via a selector 84 to a comparator 42. The adder/limiter 92 limits the modified bias data so as not to exceed 8 bits, and if over 8 bits, the upper limit "FF" is outputted.

Figure 20A:
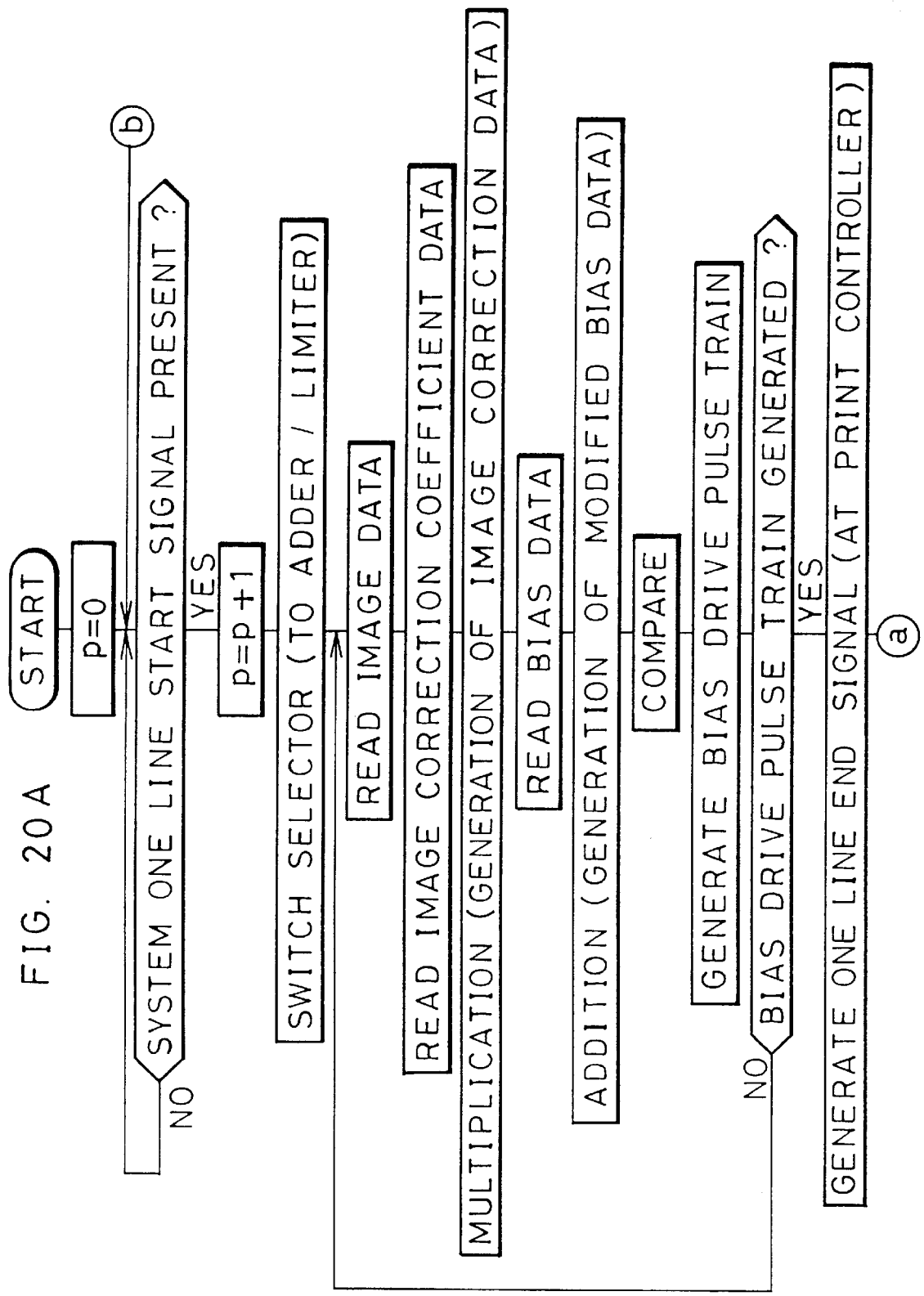

The bias heating is performed by using the modified bias data. In this case, the constant bias heat energy obtained by the bias data is added to the image heat energy error to be generated during the image heating. The added energy is applied to a color thermosensitive recording sheet. FIGS. 20A and 20B are flow charts explaining the operation of this embodiment.

Heating elements near at both ends of the heating element array have a larger amount of heat generation so that a heat generation variation occurs, gradually lowering the heat generation amount the farther the heating element is located from the center of the heating element array. As a result, the densities of pixels recorded by heating elements near at both ends lower. In the case of a line printer, a density variation extending in line in the subsidiary scan direction is generated at the right and left areas of a color thermosensitive recording sheet (this is called V shading). The record density is low at the start of recording because heating elements are cold. Thereafter, the temperature of each heating element rises because of heat accumulation. With this phenomenon, a density changes in the subsidiary scan direction (this is called H shading). These shadings depend on the position of heating elements and the line position. Therefore, bias data is determined by taking into consideration these positions, and the bias heat energy determined by the bias data is applied to a color thermosensitive recording sheet. The bias data changing with each line is written in a frame memory and is read therefrom for a line to be printed.

As described above, the modified bias data includes the bias data for generating a bias heat energy (hereinafter called base bias data) and the image correction data for correcting the image heat energy error. The base bias data is determined basing upon the bias heat energy error to be caused by the resistance error, and if necessary, considering the shading. In this embodiment, 8-bit data is used so that the maximum number of bias drive pulses is "256". Therefore, for example, "192" bias drive pulses at the maximum are allocated as the base bias data for generating a predetermined bias heat energy, and "64" bias drive pulses at the maximum are allocated as the image correction data. The allocation ratio of drive pulses for correcting the image and bias heat energy errors and for correcting shading is about 30% of the maximum number of bias drive pulses, although it changes with the size and kind of a heating element. The following equation (16) is an equation for calculating the modified bias data DBCi.

$$DBCi = DB0i + DB1i \tag{16}$$

$$= (B0 + \Delta R1i + BVSHADE + BHSHADE) + (\Delta R2i \cdot DGi)$$

Each symbol used by the equation (16) has the following meaning.

DB0i: base bias data obtained as
DB0i=B0+$\Delta R1i$+BVSHADE+BHSHADE
DB1i: image correction data obtained as
DB1i=$\Delta R2i \cdot$DGi
B0: fundamental data determined from a reference resistance value R0 (e.g., highest resistance value among heating elements
$\Delta R1i$: bias correction data for correcting the bias heat energy, which is a resistance value difference $\Delta Ri$ between the reference resistance value R0 and a resistance value of the i-th heating element multiplied by a coefficient k1 (k1 is a coefficient for converting the resistance value difference $\Delta Ri$ into the number of bias drive pulses)
BHSHADE: H shading correction data
BVSHADE: V shading correction data
$\Delta R2i$: image correction coefficient data, which is the resistance value difference $\Delta Ri$ multiplied by the coefficient k2 (k2 is a coefficient for converting the resistance value difference $\Delta Ri$ into the number of bias drive pulses)

The calculation elements B0, $\Delta R1i$, $\Delta R2i$, BHSHADE, and BVSHADE are determined in advance from experiments or the like and stored in a memory of the system controller 80.

Figure 21:
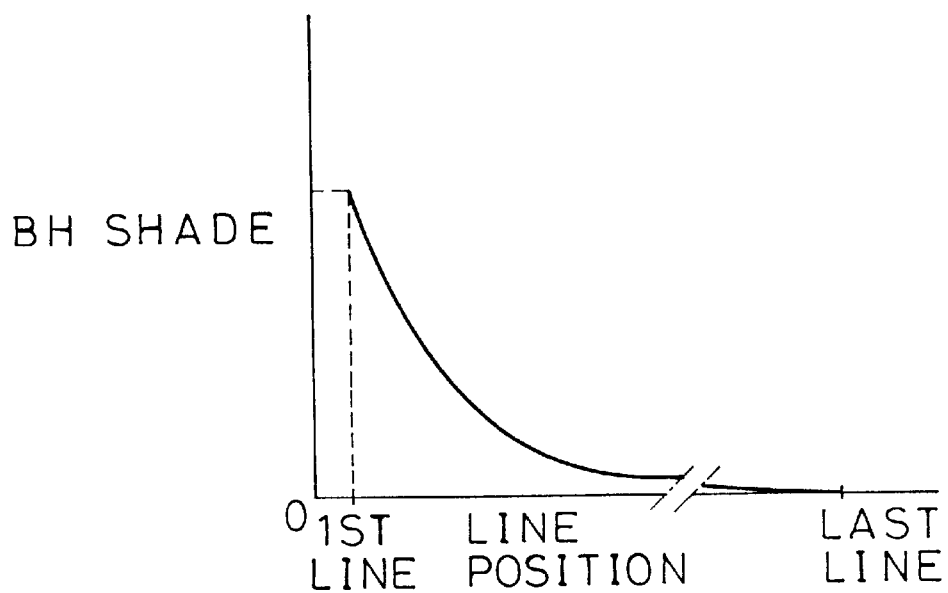
FIG. 21 is a graph showing an example of changing the number of shading correction pulses.
Figure 35:
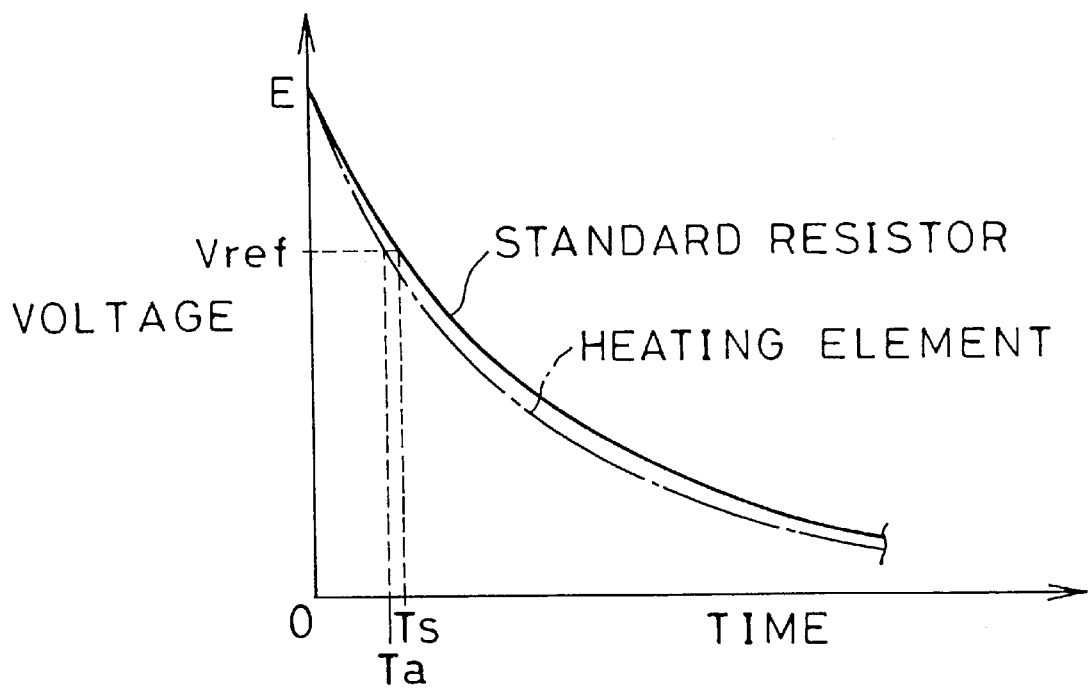
FIG. 35 is a graph explaining a discharge of the noise absorbing capacitor shown in FIG. 34.

FIG. 21 shows a change in the shading correction data BHSHADE in the base bias data DB0i while the line printer shown in FIG. 1 records an image one line after another by moving a color thermosensitive recording sheet in the subsidiary direction. Because of the heat accumulation of the thermal head, the coloring density gradually rises toward the last line. In order to compensate for this, the H shading correction data BHSHADE is reduced toward the last line. The fundamental bias data is represented by the number of bias drive pulses as described above, so that the H shading correction data can be represented also by the number of bias drive pulses.

FIG. 22 shows examples of driving heating elements of the embodiment shown in FIG. 19. In these examples, BHSHADE and BVSHADE are assumed to be "0". For example, the first heating element has the highest resistance value which is used as the reference resistance value R0 and assigned 256 bias drive pulses. The fundamental data B0 is assigned 176 bias drive pulses, and the bias correction data ΔR11 for correcting the bias heat energy error is assigned 32 bias drive pulses. The image correction data DB1i for correcting the image heat energy error is assigned 48 bias drive pulses. If the first heating element records a pixel having a tonal level of "128", then as shown in FIG. 22, DB1=256 because DB01=208 and DB11 is 48, and DG1=128.

The second heating element has a smaller resistance value than the first heating element. If the second heating element records a pixel having a tonal level of "128", then B0=176, ΔR12=2, DB02=178, DB12=20, and DG2=128.

The third heating element has the same resistance value as the second heating element. If the third heating element records a pixel having a tonal level of "64", then B0=176, ΔR13=2, DB03=178, DB13=10, and DG3=64.

The fourth heating element has a slightly smaller resistance value than the first heating element. If the fourth heating element records a pixel having a tonal level of "134", then B0=176, ΔR14=9, DB04=185, DB14=6, and DG4=13.

Figure 23:
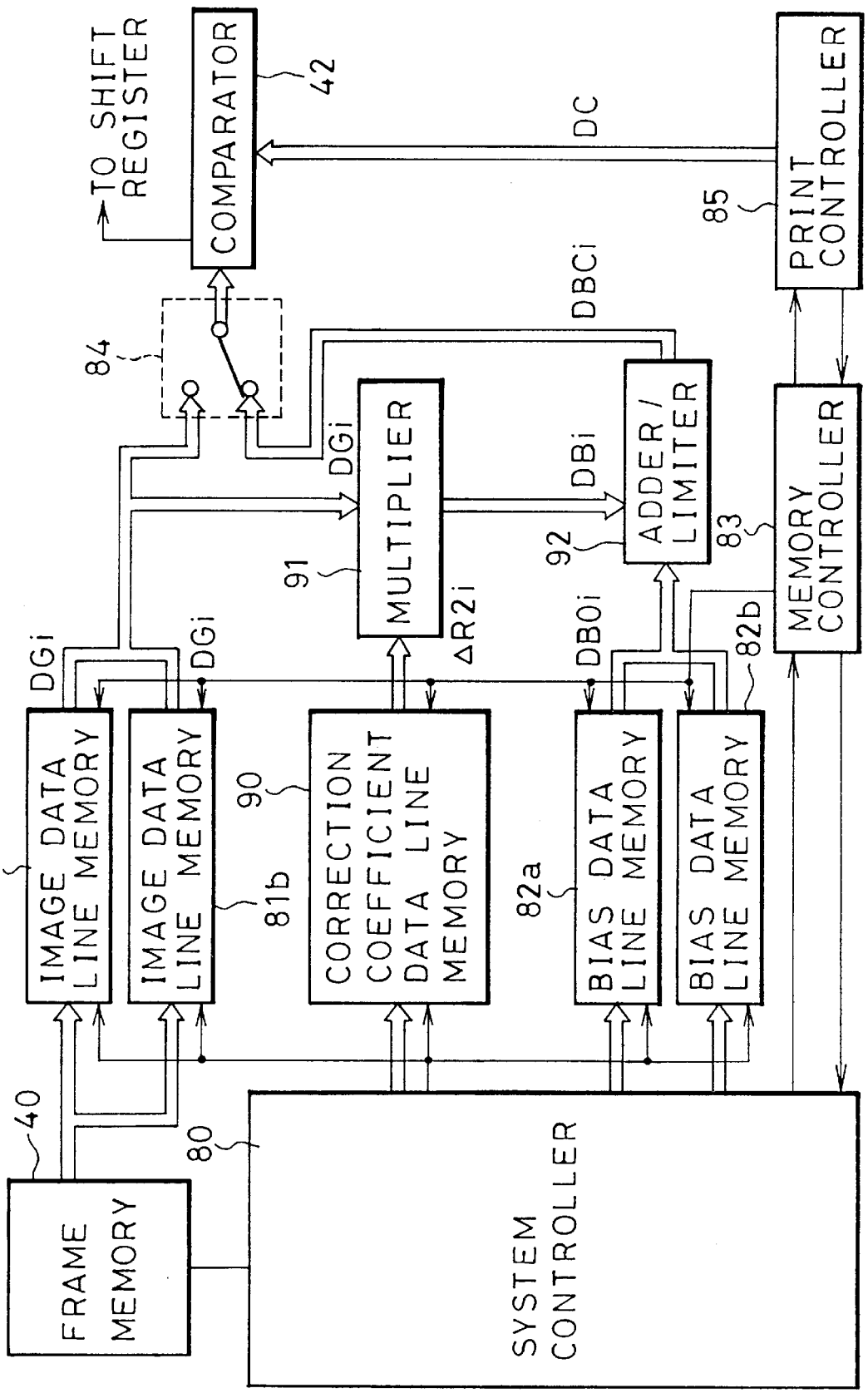
FIG. 23 is a block diagram of an embodiment in which two line memories for image data and bias data are used.

FIG. 23 shows an embodiment wherein two line memories for image data and two line memories for bias data are provided to perform data read/write efficiently. While one of the image data line memories 81a and 81b is read, the next one line image data is written in the other image data line memory. The modified bias data is prepared for each line to perform the H shading correction and V shading correction. Therefore, while one bias data line memory 82a is read, the next line modified bias data from the system controller 80 is written in the other bias data line memory 82b.

Figure 24:
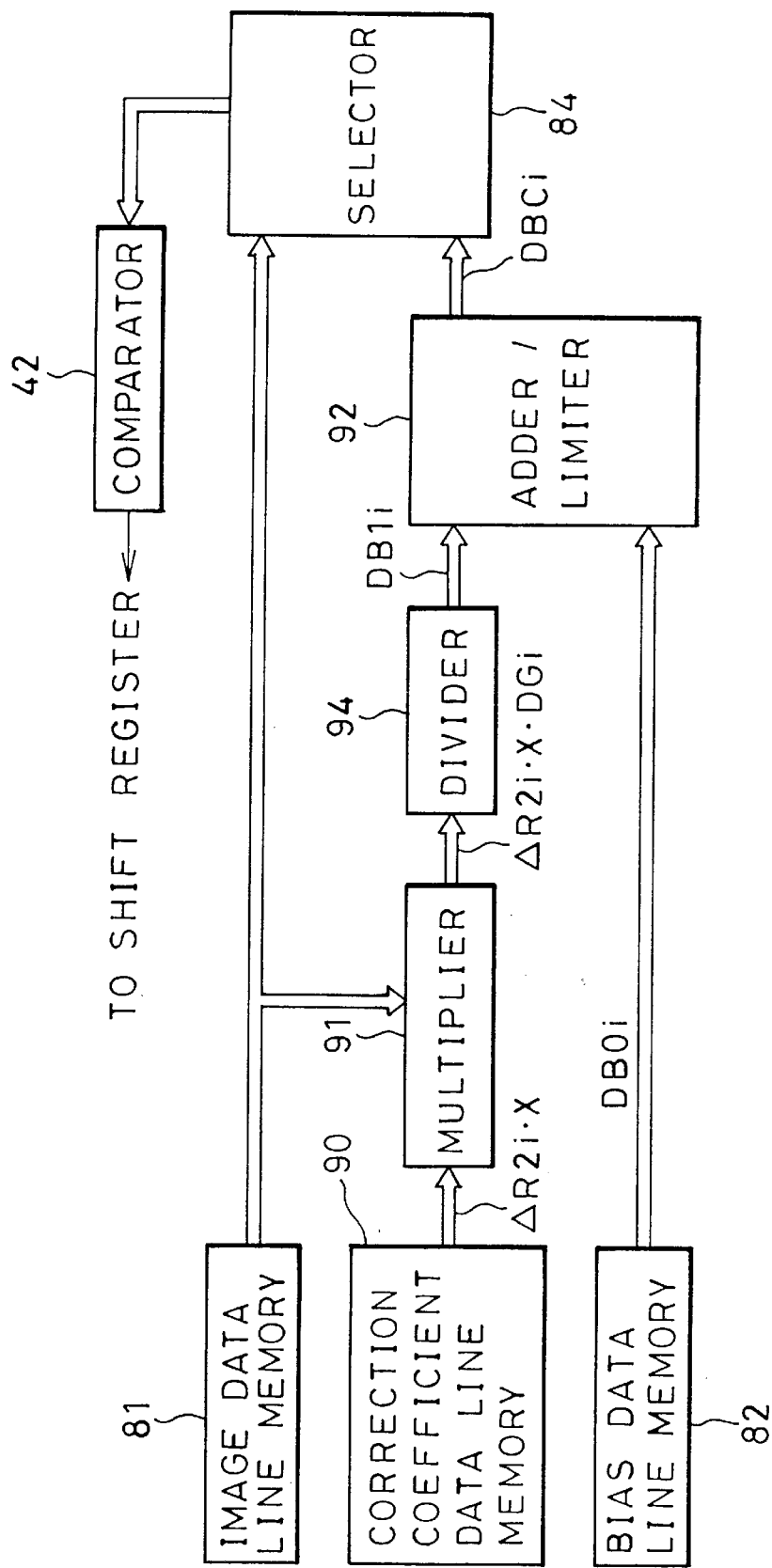
FIG. 24 is a block diagram of an embodiment in which a numerical value calculation error is reduced.

Multiplication by a multiplier 91 uses a fixed point scheme so that a large calculation error is generated by the cutoff of fractions lower than the decimal point. FIG. 24 shows an embodiment capable of reducing a calculation error even if the fixed point scheme is incorporated. The system controller writes the correction coefficient data ΔR2i for correcting the image heat energy error multiplied by X into the correction coefficient data line memory 90. The multiplier 91 multiplies ΔR2i·X by the image data DGi. A divider 94 divides an output of the multiplier 91 by X, and outputs the result to the adder/limiter 92. Since ΔR2i·X is multiplied by the image data so as to round the fractions lower than the decimal point, an error caused by a rounding operation can be reduced as compared to the case without multiplying by X. As a result, the calculation error will not become large even if the fixed point scheme is incorporated, and it is not necessary to use a floating point scheme requiring a complicated hardware structure, simplifying the circuit structure.

Figure 25:
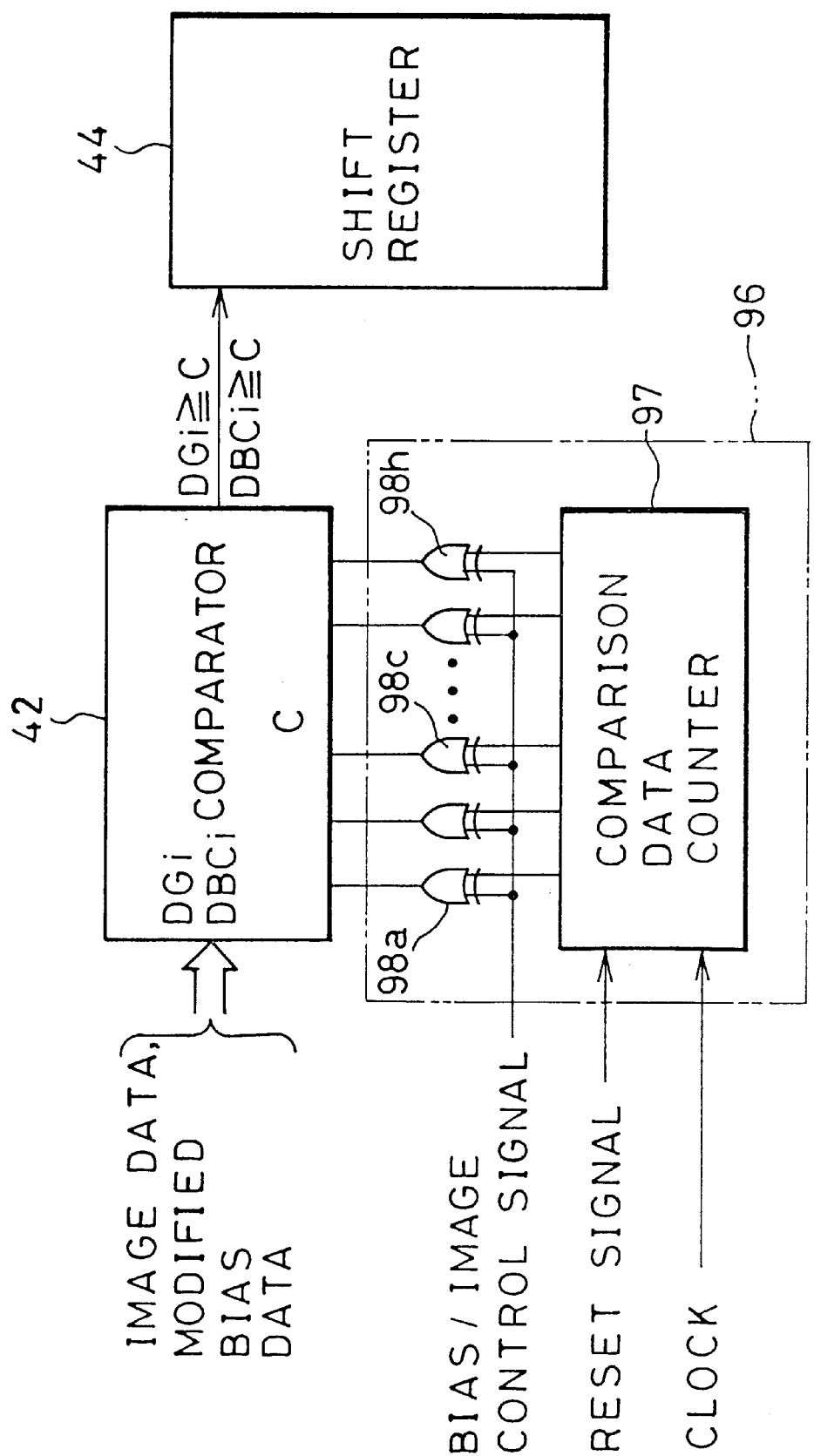
FIG. 25 is a block diagram of an embodiment in which a bias drive pulse train is moved near to an image drive pulse train.
Figure 26:
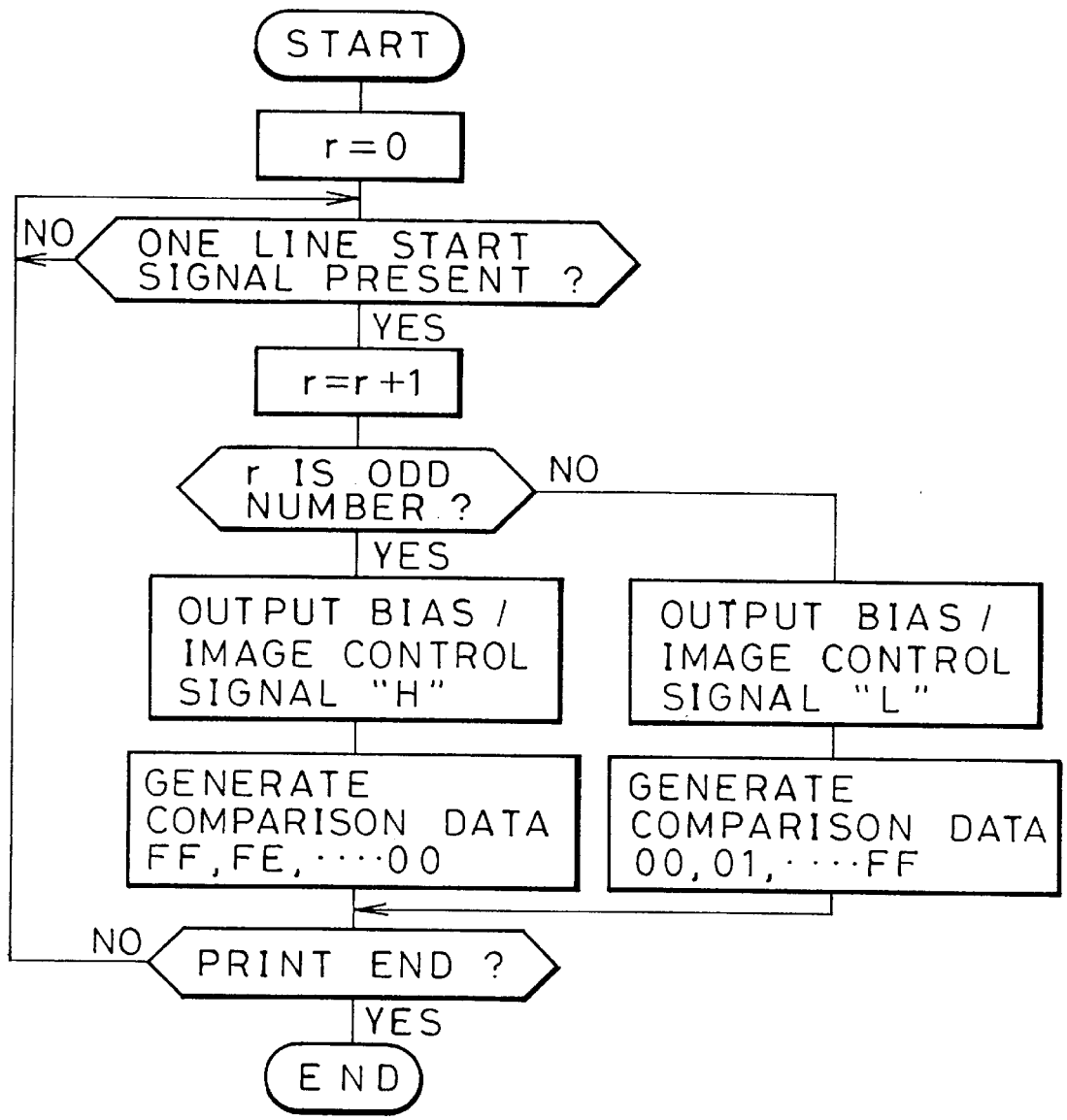
FIG. 26 is a flow chart explaining the procedure of generating comparison data of the embodiment shown in FIG. 25.

The maximum number of bias drive pulses are set to "256" in the above embodiments. Each heating element may be assigned a smaller number of bias drive pulses depending upon the correction of the resistance value error and shading. Even if the number of bias drive pulses is smaller than "256", the bias heating period is fixed to the period corresponding to 256 bias drive pulses, so that there is a pause period between the bias heating and image heating. If the pause period is long, the heat energy of bias heating is lost. FIGS. 25 to 27 show an embodiment capable of reducing a heat loss by setting the bias drive pulse train near to the image drive pulse train and by shortening the pause period between the bias heating and image heating. A comparison data generator 96 is connected to a comparator 42 to which either the image data DGi or the modified bias data DBCi is selectively inputted. The comparison data generator 96 has a comparison data counter 97 and eight exclusive OR gates 98a, 98b, . . . , 98h.

The comparison data counter 97 counts a clock signal and supplies an 8-bit count output to one input terminal of the exclusive OR gates 98a to 98h. A bias/image control signal takes an "H" level during the bias heating, and takes an "L" level during the image heating. The comparison data counter 97 is reset to "0" by a reset signal and counts up by "1" each time the clock signal is supplied.

During the bias heating, the bias/image control signal takes the "H" level so that the 8-bit count value from the comparison data counter 97 is inverted by the eight exclusive OR gates 98a to 98h. For example, if the count is "3" in decimal notation, it is converted to "252". Therefore, if the modified bias data is "252", the output of the comparator 42 becomes "H" in the count range of "3" to "255" of the comparison data counter 97, to allow each heating element to be driven. As a result, the bias drive pulse train comes near the image drive pulse train, resulting in a short pause period.

During the image heating, the bias/image control signal takes the "L" level so that the eight exclusive OR gates 98a to 98h do not invert the count of the comparison data counter 97 and the count of the comparison data counter 97 itself is sent to the comparator 42. The comparison data counter 97 is reset to "0" at the start of the count operation. The procedure to be executed by the comparison data generator 97 is explained in the flow chart of FIG. 26. "r" represents the count of a counter (not shown) for counting the line start signal.

Figure 28:
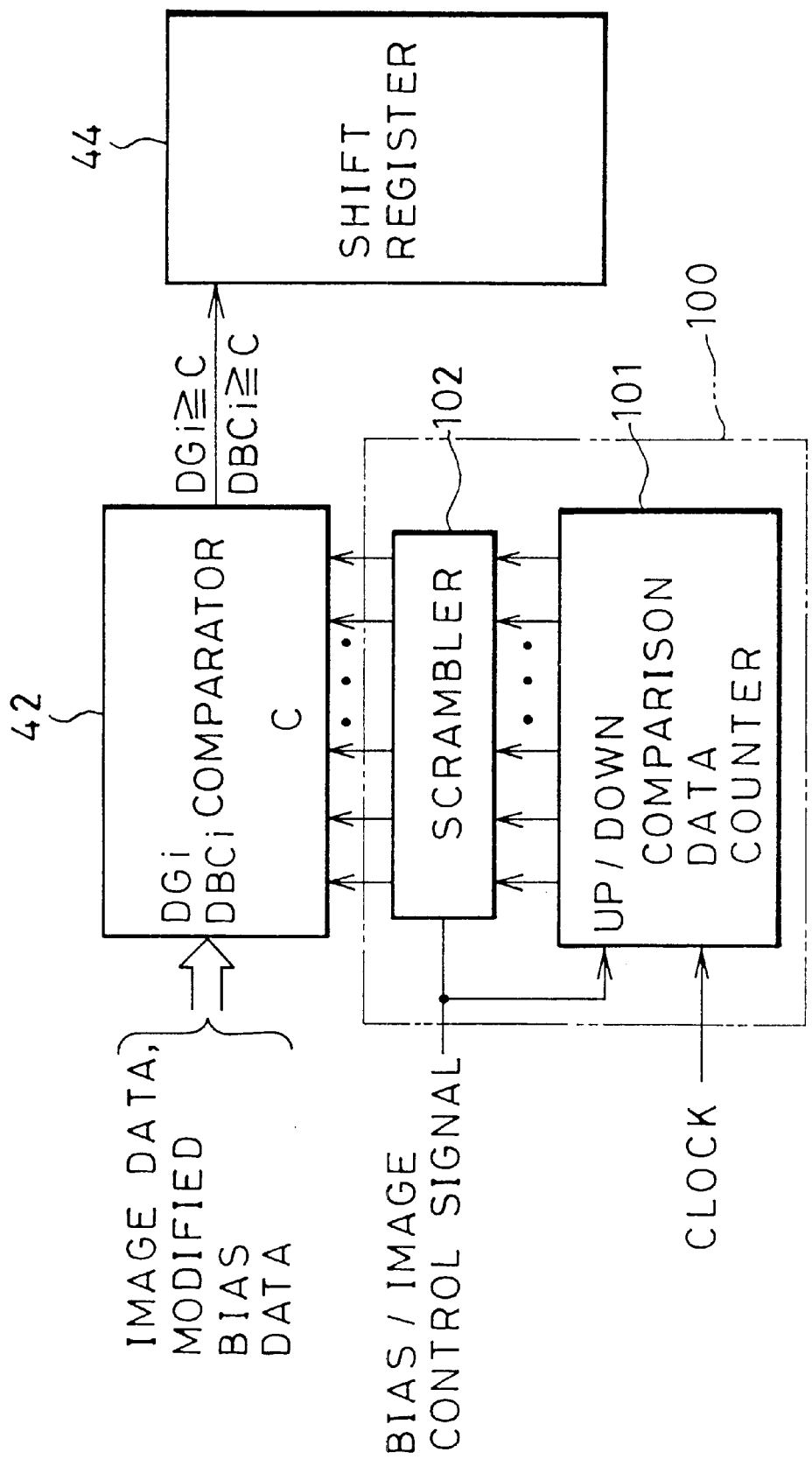
FIG. 28 is a block diagram of an embodiment in which bias drive pulses are thinned at a predetermined interval.
Figure 29:
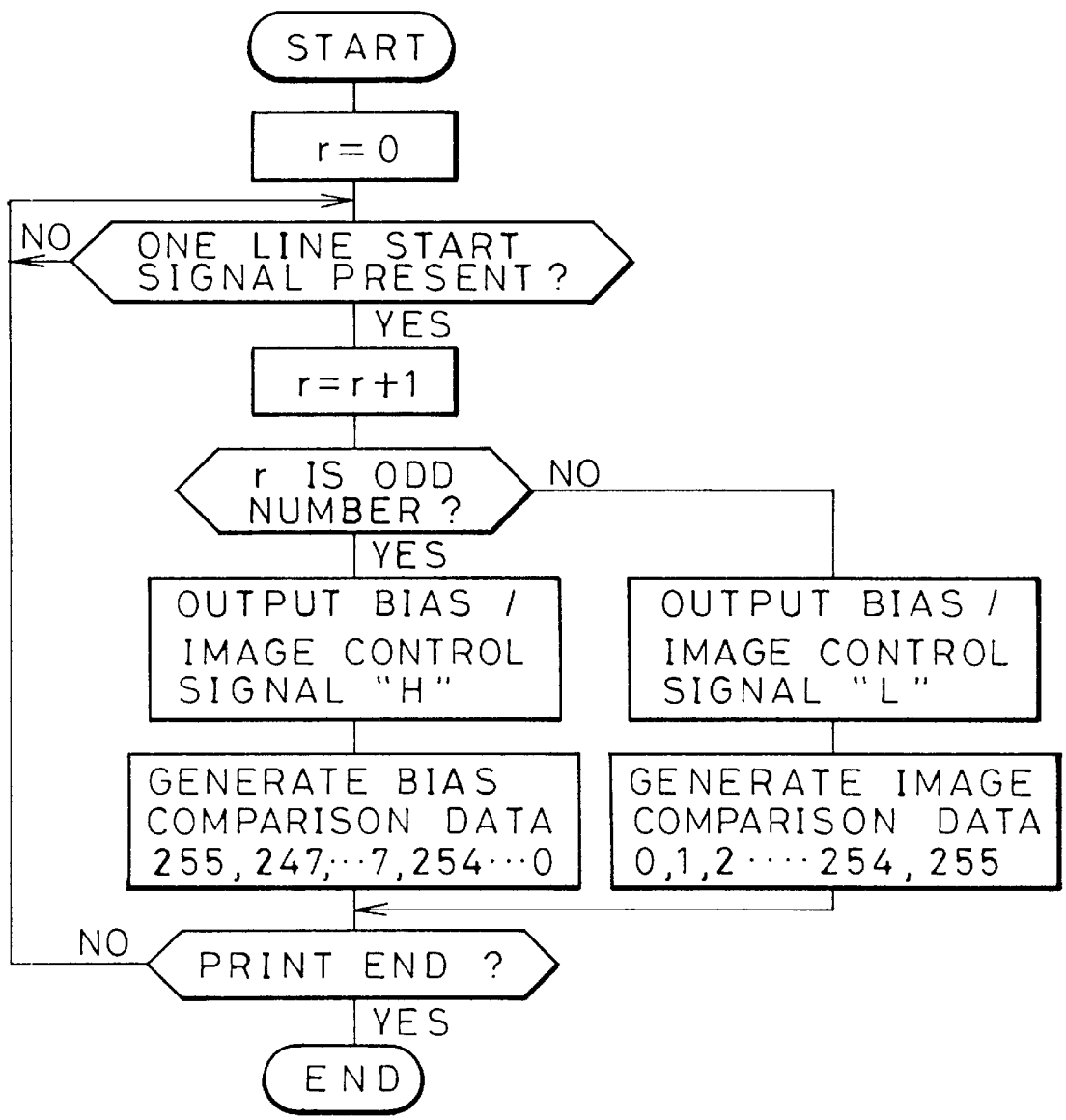
FIG. 29 is a flow chart explaining the procedure of generating comparison data of the embodiment shown in FIG. 28.

Instead of setting the bias drive pulse train near the image drive pulse train, bias drive pulses may be thinned at a predetermined pitch to prevent the generation of the pause period. FIGS. 28 and 29 show this embodiment. In generating the bias drive data train in accordance with the modified bias data, dispersed bias comparison data is sent to a comparator 42, and in generating image drive data, image comparison data sequentially increasing its value from the minimum value is sent to the comparator 42. The dispersed bias comparison data is generated by a comparison data generator 100 shown in FIG. 28. The comparison data generator 100 has a comparison data counter 101 made of an up-down counter and a scrambler 102 for scrambling the count of the comparison data counter 101 in accordance with a bias/image control signal.

The comparison data counter 101 takes a subtraction mode for decrementing a preset value "FF" when the bias/image control signal takes the "H" level. The preset value "FF" is decremented each time the clock signal is counted so as to sequentially supply an 8-bit down-count output "FF" to "0" to the scrambler 102. When the bias/image control signal takes the "L" level, the comparison data counter 101 enters an addition mode for incrementing its count value starting from "0". Each time the clock signal is counted, the count is incremented to sequentially output an 8-bit up-count output "0" to "FF" to the scrambler 102.

When the bias/image control signal takes the "H" level, the scrambler 102 outputs the scrambled bias comparison data to the comparator 42 as shown in FIG. 31. When the bias/image control signal takes the "L" level, the count of the comparison data counter 86 itself is outputted as the image comparison data.

As shown in FIG. 31, while the bias drive data is generated when the bias/image control signal takes the "H"

level, the scrambler 102 outputs the down-count outputs each sequentially subtracted by "8" starting from "255" in decimal notation, including "255", "247", "239", "231", . . ., "15", "7", "254", "246", . . ., "8", "0". While image drive data is generated when the bias/image control signal takes the "L" level, the image comparison data including "0" to "255" is sequentially sent to the comparator 100. The procedure to be executed by the comparison data generator 100 is explained in the flow chart of FIG. 29.

While the bias drive data is generated, the scrambled bias comparison data subtracted by "8" starting from "255" is generated so that as shown in FIG. 30, the last pulse of each bias drive pulse train is aligned in position. While the image drive data is generated, the image comparison data of "0" to "255" is sequentially generated so that the start pulse of each image drive pulse train is aligned in position. As a result, the pause period is not present between the bias drive pulse train and image drive pulse train, and the image heating starts immediately after the bias heating, reducing the heat loss during the bias heating. This embodiment shortening the pause period is obviously applicable to the case in which only the bias heat energy is corrected.

The image heat energy error caused by the resistance value error changes with image data. A proper coloring heat energy may be set at the middle density having a conspicuous density variation, e.g., within the optical density range of 0.6 to 0.8. With this setting, since the maximum resistance value is determined as the reference value in this instance, the density variation or the heat energy error is over-corrected in the lower density range than the middle density, and is under-corrected in the higher density range than the middle density. However, the density variation is originally less conspicuous in the lower and higher density ranges that the density change due to the over- and under-correction is not conspicuous.

Figure 32:
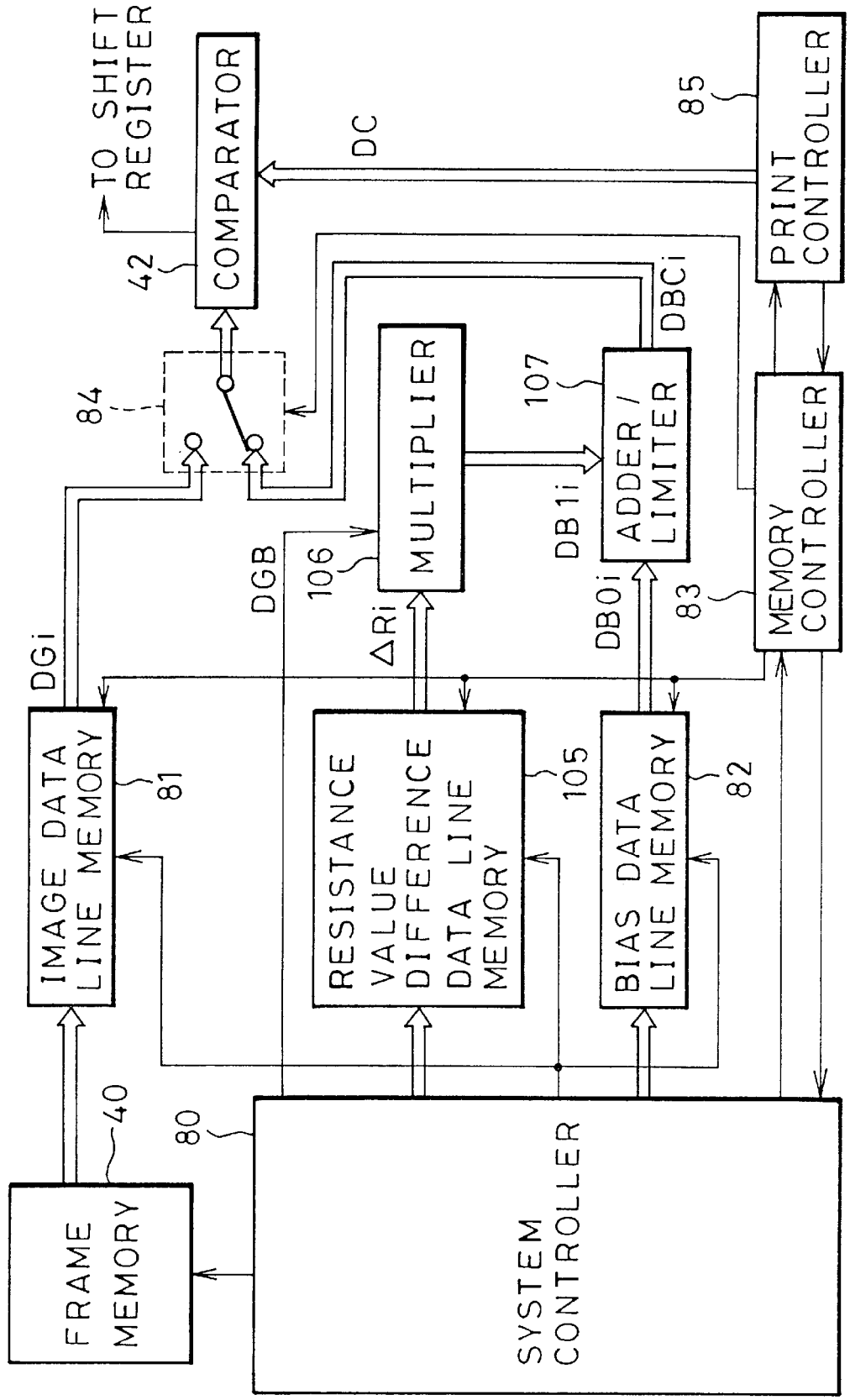
FIG. 32 is a block diagram of an embodiment in which an image heat energy error is determined on the basis of a middle density.

Referring to FIG. 32, resistance value difference data ΔRi is written in a resistance value difference data line memory 105. Image data DGB at a coloring density of "0.6" is supplied from the system controller 80 to a multiplier 106. For the bias heating, the multiplier 106 multiplies the resistance value difference data ΔRi sequentially read from the resistance value difference data line memory 105 by the image data DGB at the coloring density of "0.6". The multiplied result is multiplied by a correction coefficient K1 to calculate image correction data DBCi which is then sent to the adder/limiter 107. The adder/limiter 107 adds the image correction data DBCi to bias data DB0i sequentially read from the bias data line memory 82. The obtained modified bias data is sent via the selector 84 to the comparator 42.

Figure 33A:
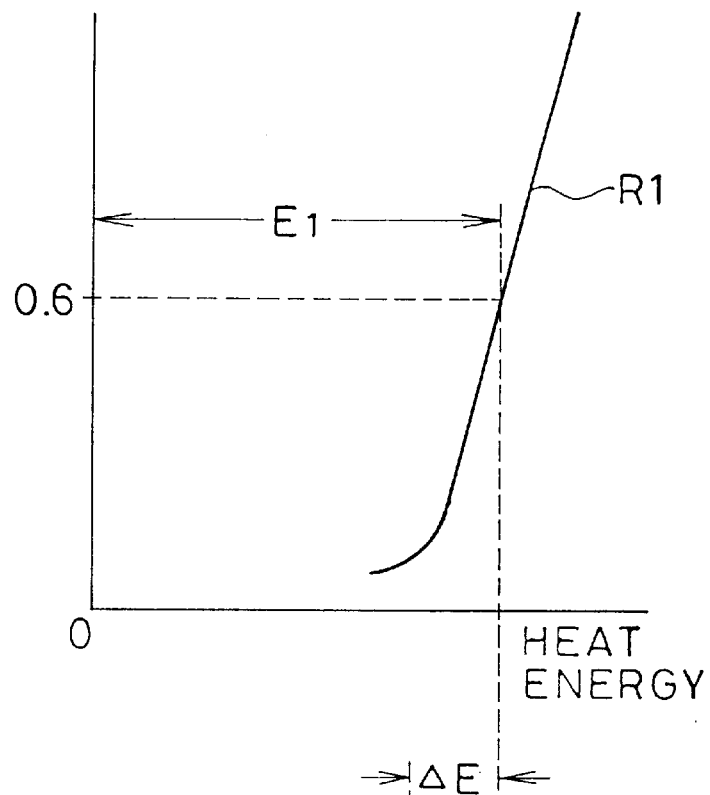
FIGS. 33A and 33B are graphs showing the relationship between heat energy of heating elements having different resistance values and coloring density.
Figure 33B:
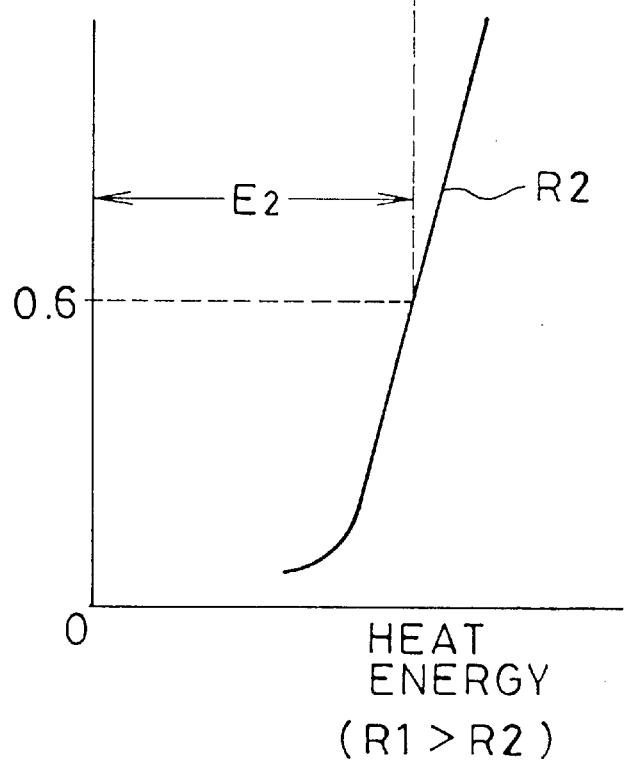
Figure 34:
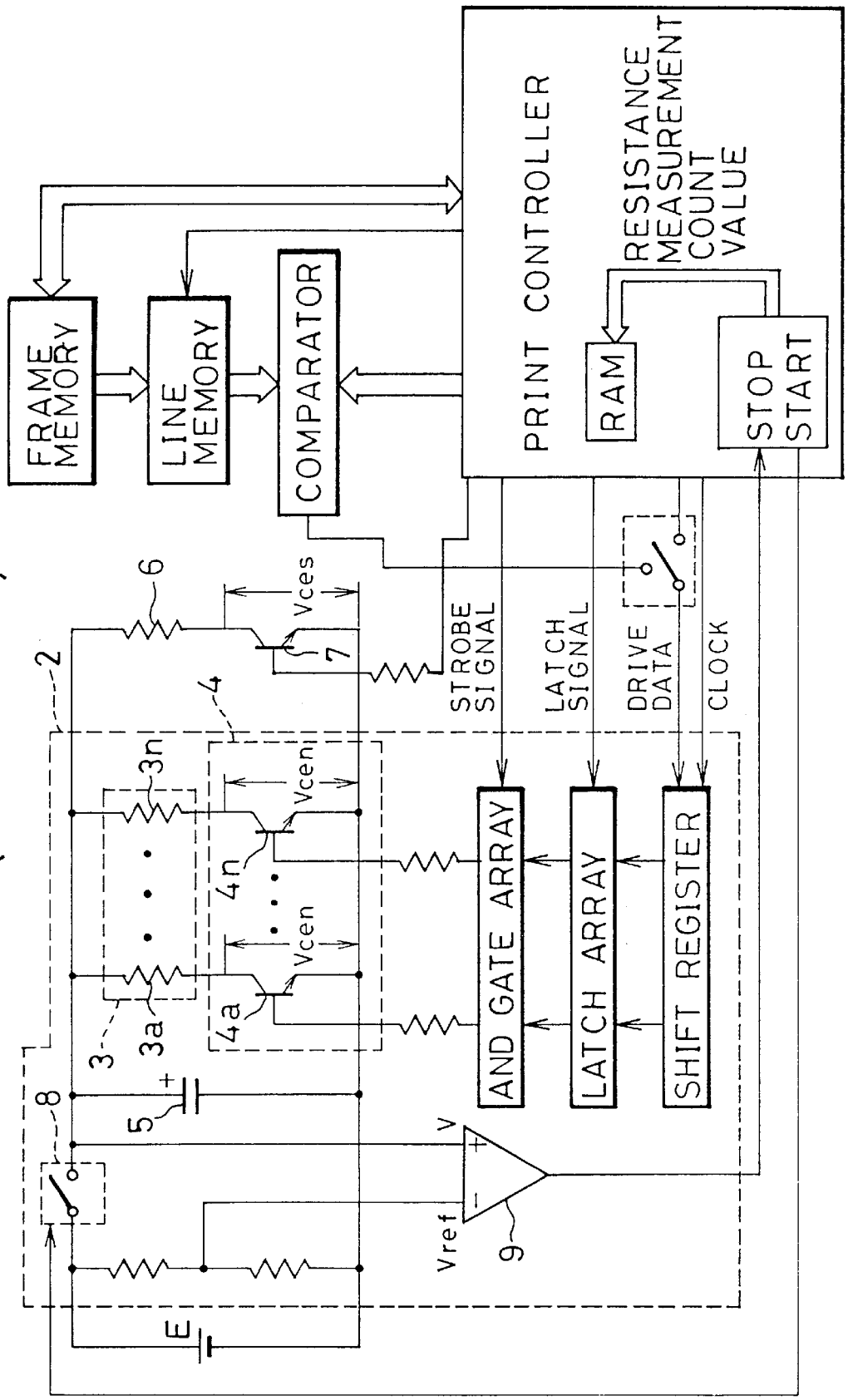
FIG. 34 is a circuit block diagram of a conventional color thermal printer having a resistance value measuring device.

As shown in FIG. 33A, If color is developed at the middle density of "0.6" by using each of two heating elements having resistance values R1 and R2 (R1>R2), the amount of heat generation of the heating element having the resistance value R2 becomes larger by the amount corresponding to the resistance value difference. Therefore, the target density of "0.6" is achieved by using a smaller number of bias drive pulses by the heating element having the resistance value R2. The heat energy difference ΔE is converted into the number of bias drive pulses, and the amount of heat generation of each heating element is controlled in accordance with the heat energy difference so that each heating element can be heated so as to have the target density of "0.6". In this manner, the conspicuous density variation at the middle density of "0.6" can be suppressed.

In the above embodiments, the number of drive pulses are increased or decreased in accordance with the resistance value error of each heating element. Instead, the width of each drive pulse may be changed by using the same number of drive pulses. The pulse width of the strobe signal has been changed to change the width of each drive pulse during the bias heating and image heating. Instead, the strobe signal having the same pulse width may be used during both the bias heating and image heating. In this case, the numbers of drive pulses are changed with heat energies during the bias heating and image heating.

The above embodiments use a line printer of the type that a color thermosensitive recording sheet and a thermal heat are moved one-dimensionally relative to each other. The present invention is also applicable to a serial printer of the type that both a color thermosensitive recording sheet and a thermal head are moved. Furthermore, a color thermosensitive recording sheet is rotated on a platen drum in the above embodiments. Instead, a color thermosensitive recording sheet may be linearly and reciprocally moved by a transport roller pair. The present invention is applicable not only to a thermal printer but also to a thermal transfer printer and the like. Obviously, the invention is also applicable to a monochromatic thermal printer.

Although the present invention has been described with reference to the preferred embodiments shown in the drawings, the invention should not be limited by the embodiments but, on the contrary, various modifications, changes, combinations and the like of the present invention can be effected without departing from the spirit and scope of the appended claims.

We claim:

1. A method of driving a thermal head, said thermal head having a plurality of heating elements and recording an ink dot on one line by moving relative to a recording sheet, each of said heating elements alternately performing bias heating and image heating for recording said ink dot, said bias heating generating a constant bias heat energy near an energy level for starting to record said ink dot, and said image heating generating an image heat energy corresponding to image data, said method comprising the steps of:

obtaining a resistance value error of each of said heating elements, said resistance value error being a difference between a reference resistance value and a resistance value of each said heating element and correcting a bias heat energy error to be caused by said resistance value error, in accordance with said resistance value error so as to obtain said constant bias heat energy.

2. The method according to claim 1, wherein said recording sheet has a thermosensitive coloring layer in which color is developed through heating, and said ink dot has a density corresponding to a total heat energy of said bias heat energy and said image heat energy.

3. The method according to claim 1, further comprising the step of correcting said bias heat energy so as to correct an image heat energy error caused by said resistance value error, said image heat energy error being determined by said resistance value error and said image data.

4. The method according to claim 1, further comprising the step of correcting said bias heat energy for each said line by considering a heat accumulation of each said heating element.

5. The method according to claim 1, wherein said bias heat energy is generated by supplying one bias drive pulse to each said heating element, the width of said bias drive pulse being modified according to said bias heat energy error.

6. The method according to claim 1, wherein said bias heat energy is generated by supplying a bias drive pulse train to each said heating element, and said image heat energy is generated by supplying an image drive pulse train to each said heating element.

7. The method according to claim 6, wherein there are a number of said bias drive pulse train which number changes with bias data.

8. The method according to claim 7, wherein said reference resistance value is a highest resistance value among said plurality of heating elements, a predetermined maximum number of bias drive pulses are associated to a reference heating element having said highest resistance value, and bias correction pulses in a number corresponding to said resistance value error are subtracted from said predetermined maximum number of bias drive pulses for each of the other heating element.

9. The method according to claim 8, wherein a period of said bias heating is a period while said train of said predetermined maximum number of bias drive pulses is supplied to said reference heating element, and each said bias drive pulse is generated at a predetermined period, whereby said image drive pulse train is supplied to said reference heating element immediately after said bias drive pulse train.

10. The method according to claim 9, wherein said bias drive pulse train supplied to each said heating element having said resistance value error is delayed relative to said bias drive pulse train of said maximum number of bias drive pulses to an extent of the number of bias correction pulses, whereby a pause period between said bias drive pulse train and said image drive pulse train is prevented from being generated.

11. The method according to claim 9, wherein for each of said heating element having said resistance value error, bias drive pulses in a number corresponding to a number of said bias correction pulses are reduced by a predetermined pitch from said bias drive pulse train of said maximum number of the bias drive pulse, whereby a pause period between said bias drive pulse train and said image drive pulse train is prevented from being generated.

12. The method according to claim 9, further comprising the steps of:
    obtaining an image heat energy error from said resistance value error and said image data so as to correct said image heat energy error caused by said resistance value error;
    obtaining the number of image correction pulses in accordance with said image heat energy error; and
    subtracting the number of image correction pulses from the number of bias drive pulses to correct both said bias heat energy error and said image heat energy error when said bias heating occurs.

13. A method of driving a thermal head, said thermal head having a plurality of heating elements disposed in line, each said heating element alternately performing bias heating and image heating to record an ink dot having a density corresponding to image data, said bias heating generating a constant bias heat energy near at the energy starting to record said ink dot, and said image heating generating an image heat energy corresponding to image data, said method comprising the steps of:
    determining bias data corresponding to said constant bias heat energy for each said heating element;
    generating a train of bias drive pulses in number corresponding to said bias data;
    supplying each said heating element with said corresponding number of bias drive pulses to generate said constant bias heat energy;
    generating a train of image drive pulses in number corresponding to said image data for each said heating element; and
    supplying each said heating element with said corresponding number of image drive pulses to generate said image heat energy.

14. The method according to claim 13, further comprising the steps of:
    obtaining a resistance value error of each said heating element, said resistance value error being a difference between a reference resistance value and a resistance value of each said heating element;
    assigning constant base bias data to said reference resistance value;
    obtaining bias correction data corresponding to said resistance value error; and
    obtaining said bias data by adding said bias correction data to, or subtracting said bias correction data from, said base bias data, to correct said resistance value error and obtain said constant bias heat energy.

15. The method according to claim 14, wherein said reference resistance value is a highest resistance value among said heating elements, and said bias correction data is subtracted from base bias data.

16. The method according to claim 15, further comprising the steps of:
    obtaining image correction data for each said heating element in accordance with said resistance value error and said image data; and
    subtracting said image correction data from said bias data to correct during the bias heating an image heat energy error to be caused by said resistance value error and said image data.

17. The method according to claim 15, further comprising the steps of:
    obtaining image correction data of each said heating element in accordance with predetermined image data and said resistance value error, said predetermined image data being used for recording an ink dot having a coloring density in the range from 0.6 to 0.8; and
    subtracting said image correction data from said bias data to correct during the bias heating an image heat energy error to be caused by said resistance value error and said predetermined image data.

18. A thermal head drive controlling apparatus for controlling a drive of a thermal head, said thermal head having a heating element array having a plurality of heating elements disposed in line, each of said heating elements alternately performing bias heating and image heating for recording an ink dot on one line of a recording sheet moving relative to said thermal head, a said bias heating generating a constant bias heat energy near at a starting energy to record said ink dot by a bias drive pulse train, and said image heating generating an image heat energy corresponding to input image data by an image drive pulse train, said thermal head controlling apparatus comprising:
    bias data line memory means for storing bias data of at least said one line, said bias data being obtained by means for correcting base bias data assigned to a reference resistance value in accordance with a resistance value error, said resistance value error is a difference between said reference resistance value and a resistance value of each said heating element;
    image data line memory means for storing said input image data of at least said one line;

a system controller for writing said bias data of at least one line into said bias data line memory means and writing said one-line input image data into said image data line memory means;

a memory controller for reading first said one-line bias data from said bias data line memory means and reading next said one-line input image data from said image data line memory means, respectively for storing said ink dot on said one line; and means for converting said bias data of at least said one-line and said image data of at least said one-line from said memory controller into said bias drive pulse train and said image drive pulse train.

19. A thermal head drive controlling apparatus according to claim 18, wherein said converting means comprises:

a print controller means for generating bias comparison data synchronously with reading said bias data and generating image comparison data synchronously with reading said image data;

a comparator for comparing said bias data with said bias comparison data and generating a difference therebetween to convert said bias data into bias drive data, and comparing said image data with said image comparison data and generating a difference therebetween to convert said image data into image drive data;

means for generating a bias strobe signal for said bias heating, and generating an image strobe signal for said image heating; and means for generating said bias drive pulse train from said bias strobe signal and said bias drive data, and generating sail image drive pulse train from said image strobe signal and said image drive data.

20. The thermal head drive controlling apparatus according to claim 17, wherein each time said bias data of said one line is compared, said bias comparison data is incremented starting from a minimum value of said bias data to a maximum value of said bias data, or decremented starting from the maximum value of said bias data to the minimum value of said bias data, and each time said image data of said one line is compared, said image comparison data is incremented starting from a minimum value of said image data to a maximum value of said image data.

21. The thermal head drive controlling apparatus according to claim 19, wherein said bias comparison data is dispersedly generated in a range from a minimum value of said bias data to a maximum value of said bias data, and said image comparison data is incremented starting from a minimum value of said image data to a maximum value of said image data each time said image data of said one line is compared.

22. The thermal head drive controlling apparatus according to claim 21, wherein said bias comparison data comprises means for performing a cyclic sequence in which numbers decrease from said maximum value of said bias data toward said minimum value of said bias data cyclically at a same difference.

23. The thermal head drive controlling apparatus according to claim 22, wherein:

in response to a reception of a system line end signal from said memory controller, said system controller generates a system one-line start signal;

in response to said system one-line start signal, said memory controller starts reading said bias data line memory and sends a one-line start signal to said print controller means, and in response to a reception of two line end signals from said print controller means, said memory controller generates a system line end signal; and each time said line start signal is inputted, said print controller means changes form of comparison data to be generated and generates said line end signal when all said comparison data of said one line is generated.

24. The thermal head drive controlling apparatus according to claim 23, wherein the minimum value of said bias data is the same as the minimum value of said image data, the maximum value of said bias data is the same as the maximum value of said image data, and said bias comparison data is the same as said image comparison data.

25. The thermal head drive controlling apparatus according to claim 19, wherein said image data line memory means includes at least first and second image line memories, and while said image data is read from said first image line memory, said image data of a next line to be printed is written into said second image line memory.

26. The thermal head drive controlling apparatus according to claim 19, further comprising:

an image correction coefficient line memory for storing an image correction coefficient for each said heating element;

a multiplier for calculating image correction data by multiplying each said image correction coefficient by related image data read from said image data in memory means; and an adder for adding bias data read from said bias data line memory means to a related image correction data, and sending modified bias data obtained by the adder at least to said comparator.

27. The thermal head drive controlling apparatus according to claim 19, wherein said bias data is determined for each said one line by using said resistance value error and a value of heat accumulation of said thermal head, and bias data of said one line to be printed is written in said bias data line memory.

28. The thermal head drive controlling apparatus according to claim 27, wherein said bias line memory means includes at least first and second bias line memories, and while said bias data is read from said first bias data line memory, said bias data of the next one line is written into said second bias line memory.

29. A method of driving a thermal head of a thermal printer, said thermal head having a plurality of heating elements disposed in line, each of said heating elements being supplied with at least a bias drive pulse to perform bias heating, and with image drive pulses in number corresponding to image data to perform image heating, for recording a pixel on a recording medium, said method comprising the steps of:

obtaining correction data of each of said heating elements in accordance with a resistance value error of each of said heating elements and predetermined image data, said predetermined image data being used for recording a pixel having a middle coloring density; and changing the number or the width of said bias drive pulse for each of said heating elements on the basis of said correction data.

30. The method according to claim 29, wherein said middle coloring density is a value from 0.6 to 0.8 in optical density.

31. A thermal head drive controlling apparatus for controlling the drive of a thermal head of a thermal printer, said thermal head having a plurality of heating elements disposed in line, each of said heating elements being supplied with bias drive pulses to perform bias heating, and with image drive pulses to perform imaging heat, for recording a pixel on a recording medium, said apparatus comprising:

a first line memory for storing image data of one line;

memory means for storing bias data in association with each of said heating elements, said bias data being representative of a number of said bias drive pulses and corrected by bias correction data for correcting a bias heat energy error caused in said bias heating by a resistance value error of each of said heating elements;

a second line memory for storing said bias data of one line;

memory means for storing image correction data in association with each of said heating elements, said image correction data being representative of a number of said bias drive pulses and determined to correct an image heat energy error caused in said image heating by said resistance value error of each of said heating elements when recording a pixel at a predetermined middle coloring density;

a third line memory for storing said image correction data of one line;

an adder for adding said image correction data to said bias data read from said second line memory to generate modified bias data; and a controller for alternately reading said modified bias data from said adder and said image data from said first line memory to drive each of said heating elements with a train of said bias drive pulses in number corresponding to said modified bias data and, thereafter, a train of said image drive pulses in number corresponding to said image data.

32. The thermal head drive controlling apparatus according to claim 31, wherein said predetermined middle coloring density is a value from 0.6 to 0.8 in optical density.

33. The thermal head drive controlling apparatus according to claims 31 or 32, herein said bias drive pulse train is disposed closer to said image drive pulse train when heating said heating elements.

34. The thermal head drive controlling apparatus according to claims 31 or 32, wherein the number of pulses of said drive pulse train is reduced by thinning.

35. A method of driving a thermal head of a thermal printer, said thermal head having a plurality of heating elements disposed in line, each of said heating elements being supplied with at least a bias drive pulse to perform bias heating, and with image drive pulses in number corresponding to image data to perform image heating, for recording a pixel on a recording medium, said method comprising the steps of:

obtaining a bias heat energy error of each of said heating elements caused in said bias heating by a resistance value error of each of said heating elements;

obtaining an image heat energy error of each said heating elements caused in said image heating by said resistance value error of each of said heating elements; and correcting said bias heat energy error and said image heat energy error by changing the number or the width of said bias drive pulse.

36. A thermal head drive controlling apparatus for controlling the drive of a thermal head of a thermal printer, said thermal head having a plurality of heating elements disposed in line, each of said heating elements being supplied with at least a bias drive pulse to perform bias heating, and with image drive pulses in number corresponding to image data to perform image heating, for recording a pixel on a recording medium, said apparatus comprising:

a first line memory for storing said image data of one line;

memory means for storing bias data in association with each of said heating elements, said bias data being corrected by bias correction data for correcting a bias heat energy error caused in said bias heating by a resistance value error of each of said heating elements;

a second line memory for storing said bias data of one line;

memory means for storing image correction coefficient data in association with each of said heating elements, said image correction coefficient data being determined to correct an image heat energy error caused in said image heating by said resistance value error of each of said heating elements;

a third line memory for storing said image correction coefficient data of one line;

a multiplier for multiplying said image data read from said first line memory by said image correction coefficient data to obtain image correction data;

an adder for adding said image correction data to said bias data read from said second line memory;

a selector for selecting to output data from said adder or said image data from said first line memory;

a print controller for outputting comparison data; and a comparator for comparing said data from said selector with said comparison data to generate drive data for driving said heating elements each individually.

37. The thermal head drive controlling apparatus according to claim 36, wherein said image correction coefficient data is multiplied by X before being written in said third line memory, and said image correction data from said multiplier is divided by X before being sent to said adder.

38. The thermal head drive controlling apparatus according to claims 36 or 37, wherein said bias data is further corrected by shading correction data.

39. A thermal head drive controlling apparatus for controlling the drive of a thermal head of a thermal printer, said thermal head having a plurality of heating elements disposed in line, each of said heating elements being supplied with a train of bias drive pulses and a train of image drive pulses of a number corresponding to image data, for recording a pixel in a recording medium, said apparatus comprising:

a first line memory for storing said image data of one line;

a second line memory for storing bias data of one line, said bias data being representative of a number of pulses of said bias drive pulse train and determined based on a resistance value error of each of said heating elements so as to generate a constant bias heat energy from each of said heating elements;

a selector for selecting to output data from said first or said second line memory;

a print controller for outputting comparison data; and a comparator for comparing said data from said selector with said comparison data to generate drive data for driving said heating elements each individually, wherein said comparison data gradually decrements starting from a maximum value when said bias data is inputted in said comparator, and said comparison data gradually increments starting from a minimum value when said image data is inputted in said comparator.

40. A thermal head drive controlling apparatus for controlling the drive of a thermal head of a thermal printer, said thermal head having a plurality of heating elements disposed in line, each of said heating elements being supplied with a train of bias drive pulses and a train of image drive pulses of a number corresponding to image data, for recording a pixel on a recording medium, said apparatus comprising:

a first line memory for storing said image data of one line;

memory means for storing bias data in association with each of said heating elements, said bias data being corrected by bias correction data for correcting a bias heat energy error caused in said bias heating by a resistance value error of each of said heating elements;

a second line memory for storing said bias data of one line;

memory means for storing image correction coefficient data in association with each of said heating elements, said image correction coefficient data being determined to correct an image heat energy error caused in said image heating by said resistance value error of each of said heating elements;

a third line memory for storing said image correction coefficient data of one line;

a multiplier for multiplying said image data read from said first line memory by said image correction coefficient data to obtain image correction data;

an adder for adding said image correction data to said bias data read from said second line memory;

a selector for selecting to output data from said adder or said image data from said first line memory;

a print controller for outputting comparison data; and a comparator for comparing said data from said selector with said comparison data to generate drive data for driving said heating elements each individually, wherein said comparison data gradually decrements starting from a maximum value when said data from said adder is inputted in said comparator, and said comparison data gradually increments starting from a minimum value when said image data from said first line memory is inputted in said comparator.

41. The thermal head drive controlling apparatus according to claim 40, wherein said print controller outputs bias comparison data to said comparator when said data from said adder is inputted in said comparator, and outputs image comparison data to said comparator when said image data from said first line memory is inputted in said comparator.

42. A thermal head drive controlling apparatus for controlling the drive of a thermal head of a thermal printer, said thermal head having a plurality of heating elements disposed in line, each of said heating elements being supplied with a train of bias drive pulses and a train of image drive pulses of a number corresponding to image data, for recording a pixel on a recording medium, said apparatus comprising:

a first line memory for storing said image data of one line;

a second line memory for storing bias data of one line, said bias data being representative of a number of pulses of said bias drive pulse train and determined based on a resistance value error of each of said heating elements so as to generate a constant bias heat energy from each of said heating elements;

a selector for selecting to output data from said first or said second line memory;

a print controller for outputting comparison data; and a comparator for comparing said data from said selector with said comparison data to generate drive data for driving said heating elements each individually, wherein said comparison data is dispersedly generated when said bias data is inputted in said comparator, and said comparison data gradually increments starting from a minimum value when said image data is inputted in said comparator.

43. A thermal head drive controlling apparatus for controlling the drive of a thermal head of a thermal printer, said thermal head having a plurality of heating elements disposed in line, each of said heating elements being supplied with a train of bias drive pulses to perform bias heating, and with a train of image drive pulses in number corresponding to image data to perform image heating, for recording a pixel on a recording medium, said apparatus comprising:

a first line memory for storing said image data of one line;

memory means for storing bias data in association with each of said heating elements, said bias data being corrected by bias correction data for correcting a bias heat energy error caused in said bias heating by a resistance value error of each of said heating elements;

a second line memory for storing said bias data of one line;

memory means for storing image correction coefficient data in association with each of said heating elements, said image correction coefficient data being determined to correct an image heat energy error caused in said image heating by said resistance value error of each of said heating elements;

a third line memory for storing said image correction coefficient data of one line;

a multiplier for multiplying said image data read from said first line memory by said image correction coefficient data to obtain image correction data;

an adder for adding said image correction data to said bias data read from said second line memory;

a selector for selecting to output data from said adder or said image data from said first line memory;

a print controller for outputting comparison data; and a comparator for comparing said data from said selector with said comparison data to generate drive data for driving said heating elements each individually, wherein said comparison data is dispersedly generated when said data from said adder is inputted in said comparator, and said comparison data increments step by step starting from said minimum value when said image data from said first line memory is inputted in said comparator.

44. The thermal head drive controlling apparatus according to claim 43, wherein said dispersed comparison data comprises values cyclically selected from a maximum value to a minimum value at an interval of a plural number.

45. A thermal head drive controlling apparatus for controlling the drive of a thermal head of a thermal printer, said thermal head having a plurality of heating elements disposed in line, each of said heating elements being supplied with a train of bias drive pulses and a train of image drive pulses of a number corresponding to image data, for recording a pixel on a recording medium, said apparatus comprising:

a first line memory for storing said image data of one line;

a second line memory for storing bias data of one line, said bias data being representative of a number of pulses of said bias drive pulse train and determined based on a resistance value error of each of said heating elements so as to generate a constant bias heat energy from each of said heating elements;

a selector for selecting to output data from said first or said second line memory;

a print controller for outputting comparison data;

a comparator for comparing said data from said selector with said comparison data to generate drive data for driving said heating elements each individually;

a memory controller for changing over said selector and for generating a one-line start signal and a system one-line end signal; and a system controller for generating a system one-line start signal, wherein said print controller outputs said comparison data to said comparator in response to said one-line start signal from said memory controller, and outputs said one-line end signal to said memory controller after outputting said comparison data;

said memory controller changes over said selector to select said second line memory and simultaneously outputs said one-line start signal to said print controller in response to said system one-line start signal from said system controller, and said memory controller changes over said selector to select said first line memory and simultaneously outputs said one-line start signal to said print controller in response to every odd-numbered one-line end signal from said print controller, and said memory controller outputs said system one-line end signal to said system controller in response to every even-numbered one-line end signal from said print controller; and said system controller outputs said system one-line start signal to said memory controller in response to a print start signal, and moves said thermal head relative to said recording medium by one line amount in response to said system one-line end signal, and when said thermal head has been moved by one line amount relative to said recording medium, said system controller outputs said system one-line start signal to said memory controller.

46. A thermal head drive controlling apparatus for controlling the drive of a thermal head of a thermal printer, said thermal head having a plurality of heating elements disposed in line, each of said heating elements being supplied with a train of bias drive pulses and a train of image drive pulses of a number corresponding to image data, for recording a pixel on a recording medium, said apparatus comprising:

a first line memory for storing said image data of one line;

memory means for storing bias data in association with each of said heating elements, said bias data being corrected by bias correction data for correcting a bias heat energy error caused in said bias heating by a resistance value error of each of said heating elements;

a second line memory for storing said bias data of one line;

memory means for storing image correction coefficient data in association with each of said heating elements, said image correction coefficient data being determined to correct an image heat energy error caused in said image heating by said resistance value error of each of said heating elements;

a third line memory for storing said image correction coefficient data of one line;

a modified bias data calculator for calculating modified bias data based on said image data read from said first line memory and said image correction coefficient data from said third line memory;

a selector for selecting to output data from said modified bias data calculator or said image data from said first line memory;

a print controller for outputting comparison data and a one-line end signal;

a comparator for comparing said data from said selector with said comparison data to generate drive data for driving said heating elements each individually;

a memory controller for changing over said selector and for generating a one-line start signal and a system one-line end signal; and a system controller for generating a system one-line start signal, wherein said print controller output said comparison data to said comparator in response to said one-line start signal from said memory controller, and outputs said one-line end signal to said memory controller after outputting said comparison data;

said memory controller changes over said selector to select said modified bias data calculator and simultaneously outputs said one-line start signal to said print controller in response to said system one-line start signal from said system controller, and said memory controller changes over said selector to select said first line memory and simultaneously outputs said one-line start signal to said print controller in response to every odd-numbered one-line end signal from said print controller, and said memory controller outputs said system one-line end signal to said system controller in response to every even-numbered one-line end signal from said print controller; and said system controller outputs said system one-line start signal to said memory controller in response to a print start signal, and moves said thermal head relative to said recording medium by one line amount in response to said system one-line end signal, and when said thermal head has been moved by one line amount relative to said recording medium, said system controller outputs said system one-line start signal to said memory controller.

47. The thermal head drive controlling apparatus according to claims 45 or 46, wherein said print controller outputs bias comparison data for said bias heating to said comparator in response to every odd-numbered one-line start signal from said memory controller, and outputs image comparison data for said image heating to said comparator in response to every even-numbered one-line start signal from said memory controller.

* * * * *